US012696657B2

(12) United States Patent
Guo et al.

(10) Patent No.: US 12,696,657 B2
(45) Date of Patent: Jul. 28, 2026

(54) DISPLAY PANEL AND PRODUCTION METHOD THEREOF

(71) Applicant: YUNGU (GU'AN) TECHNOLOGY CO., LTD., Langfang (CN)

(72) Inventors: Zhilin Guo, Hebei (CN); Zhenyu Zhang, Hebei (CN); Min Zhang, Hebei (CN); Qiang Liu, Hebei (CN)

(73) Assignee: YUNGU (GU'AN) TECHNOLOGY CO., LTD., Langfang (CN)

( * ) Notice: Subject to any disclaimer, the term of this patent is extended or adjusted under 35 U.S.C. 154(b) by 377 days.

(21) Appl. No.: 18/465,278

(22) Filed: Sep. 12, 2023

(65) Prior Publication Data

US 2024/0008343 A1 Jan. 4, 2024

Related U.S. Application Data

(63) Continuation of application No. PCT/CN2022/143668, filed on Dec. 29, 2022.

(30) Foreign Application Priority Data

Dec. 31, 2021 (CN) .......................... 202111679288.6

(51) Int. Cl.
| | |
|---|---|
| *H10K 59/80* | (2023.01) |
| *H10K 59/12* | (2023.01) |
| *H10K 59/122* | (2023.01) |

(52) U.S. Cl.
CPC ... *H10K 59/80522* (2023.02); *H10K 59/1201* (2023.02); *H10K 59/122* (2023.02)

(58) Field of Classification Search
CPC ........................ H10K 59/80522; H10K 50/824
See application file for complete search history.

(56) References Cited

U.S. PATENT DOCUMENTS

| | | | |
|---|---|---|---|
| 12,238,953 B2 * | 2/2025 | Shin | ..................... H10K 59/124 |
| 2014/0332763 A1 | 11/2014 | Kim | |

(Continued)

FOREIGN PATENT DOCUMENTS

| | | |
|---|---|---|
| CN | 110071225 A | 7/2019 |
| CN | 111261799 A | 6/2020 |

(Continued)

OTHER PUBLICATIONS

International Search Report issued on Mar. 7, 2023, in corresponding International Patent Application No. PCT/CN2022/143668, 15 pages.

(Continued)

*Primary Examiner* — Alia Sabur
(74) *Attorney, Agent, or Firm* — Maier & Maier, PLLC

(57) ABSTRACT

A display panel and a production method thereof. A display panel includes an array substrate, a first electrode layer, an organic functional layer, and a second electrode layer, which are stacked. The first electrode layer includes at least one electrode block, and the second electrode layer is connected with at least one auxiliary electrode. The auxiliary electrode is located on the array substrate or located in the array substrate. The auxiliary electrode includes a first material layer, and the first material layer includes a bottom surface facing the array substrate, and a side surface intersecting the bottom surface of the first material layer, an angle between the bottom surface of the first material layer and the side surface of the first material layer is greater than or equal to 60° and less than or equal to 160°.

20 Claims, 34 Drawing Sheets

(56) References Cited

U.S. PATENT DOCUMENTS

| | | | | |
|---|---|---|---|---|
| 2016/0013438 | A1* | 1/2016 | Im | H10K 59/80522 |
| | | | | 257/762 |
| 2022/0077251 | A1 | 3/2022 | Choung et al. | |
| 2022/0093894 | A1* | 3/2022 | Song | H10K 59/1201 |
| 2023/0078043 | A1* | 3/2023 | Kim | H10K 59/131 |
| | | | | 257/40 |
| 2023/0133603 | A1* | 5/2023 | Park | H10K 71/00 |
| | | | | 257/91 |
| 2023/0135268 | A1* | 5/2023 | Kim | H10K 50/824 |
| | | | | 257/91 |
| 2023/0363241 | A1* | 11/2023 | Su | H10K 59/126 |
| 2024/0057388 | A1* | 2/2024 | Wang | H10K 59/1201 |

FOREIGN PATENT DOCUMENTS

| | | | |
|---|---|---|---|
| CN | 112103326 | A | 12/2020 |
| CN | 112289946 | A | 1/2021 |
| CN | 113130587 | A | 7/2021 |
| CN | 113130821 | A | 7/2021 |
| CN | 113725266 | A | 11/2021 |
| CN | 114284458 | A | 4/2022 |
| CN | 114361226 | A | 4/2022 |
| CN | 114883461 | A | 8/2022 |
| CN | 115295581 | A | 11/2022 |
| JP | 2008135325 | A | 6/2008 |
| KR | 1020150075188 | A | 7/2015 |
| KR | 1020160026363 | A | 3/2016 |

OTHER PUBLICATIONS

Office Action issued on Feb. 23, 2025, in corresponding Chinese Application No. 202211711619.4, 20 pages.

* cited by examiner

20(260)    6(60)    A    80

B-B

4031(310) 80   60  410  420 610  20    115 116 117   90    C 113 112 110 111 104 103 102 101 114 105 106 107 108 109

10

20            60  20    A                80

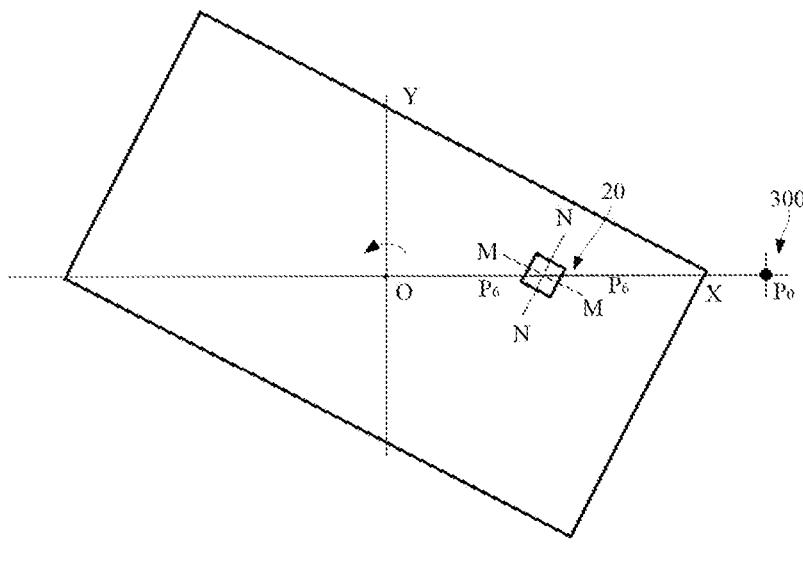
FIG. 13
M-M
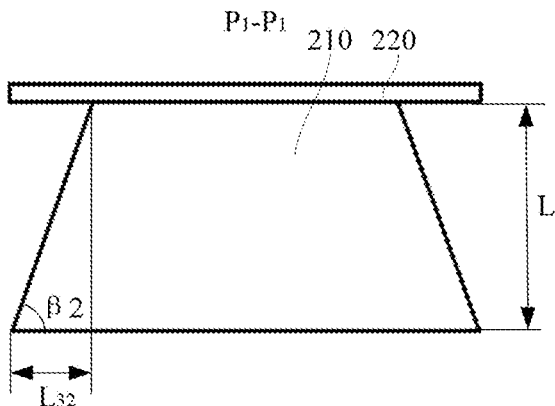
FIG. 14
$P_1$-$P_1$
FIG. 15

210    220

210    220

C 60 50 420    40    410

211 230 210    220  114 115 116 117 310

20

C

20

211 230 210   220  60 50 420   40   410

240   114 115 116 117 310

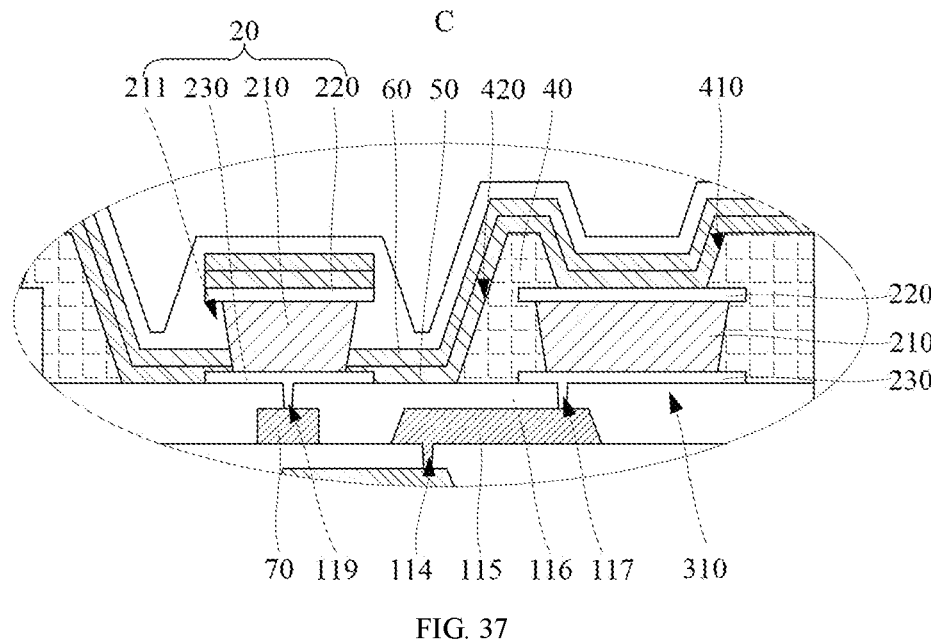

FIG. 37

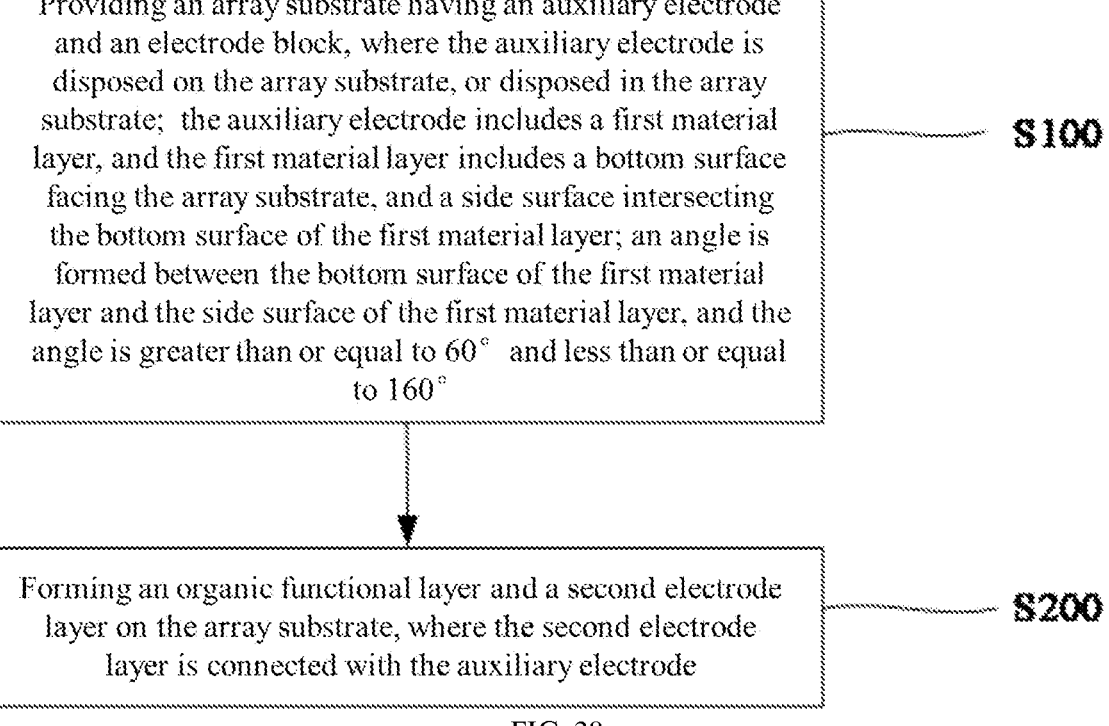

Providing an array substrate having an auxiliary electrode and an electrode block, where the auxiliary electrode is disposed on the array substrate, or disposed in the array substrate; the auxiliary electrode includes a first material layer, and the first material layer includes a bottom surface facing the array substrate, and a side surface intersecting the bottom surface of the first material layer; an angle is formed between the bottom surface of the first material layer and the side surface of the first material layer, and the angle is greater than or equal to 60° and less than or equal to 160°

S100

Forming an organic functional layer and a second electrode layer on the array substrate, where the second electrode layer is connected with the auxiliary electrode

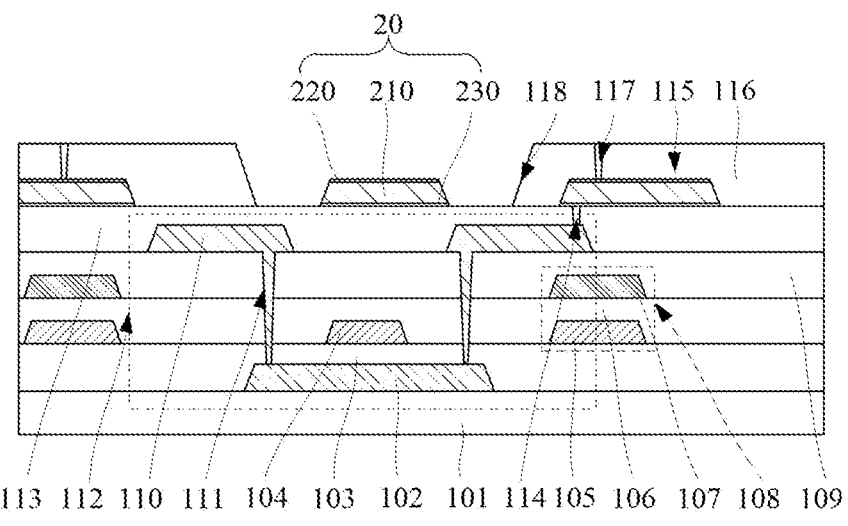
FIG. 64
FIG. 65
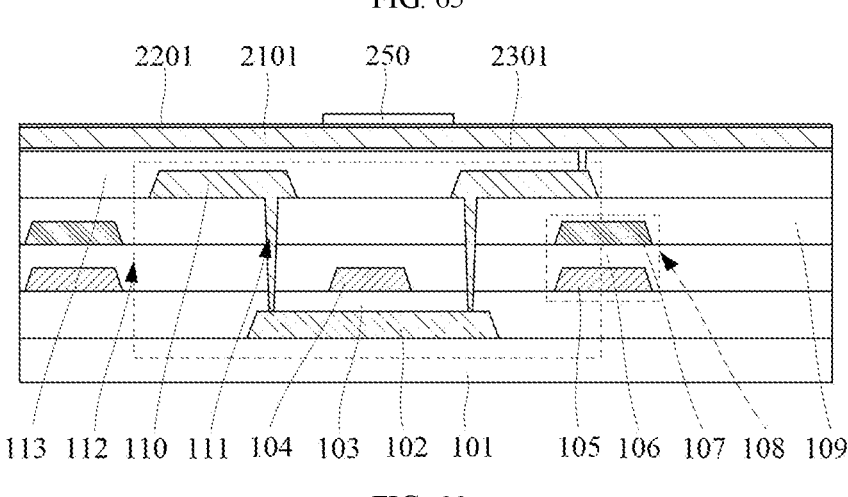
FIG. 66

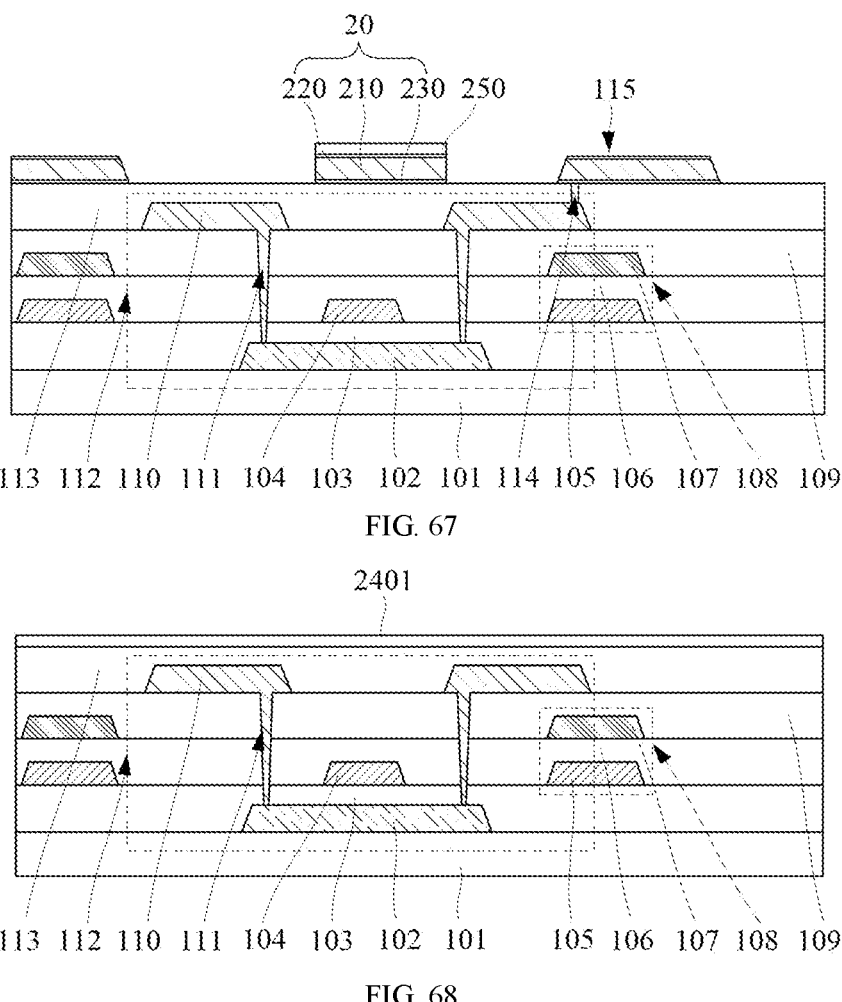
FIG. 67
FIG. 68
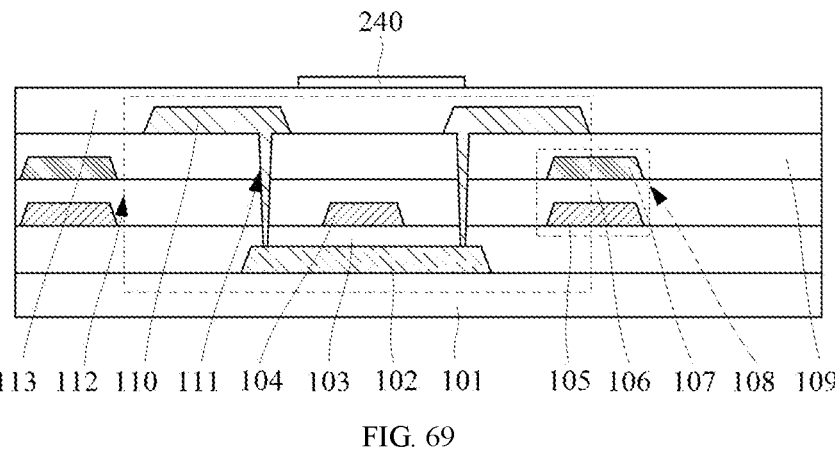
FIG. 69

DISPLAY PANEL AND PRODUCTION METHOD THEREOF

CROSS-REFERENCE TO RELATED APPLICATIONS

This application is a continuation of International Application No. PCT/CN2022/143668, filed on Dec. 29, 2022, which claims priority to Chinese patent application No. 202111679288.6, filed on Dec. 31, 2021 to China National Intellectual Property Administration and entitled "Display panel and production method thereof", both of which are hereby incorporated by reference in their entireties.

TECHNICAL FIELD

Embodiments of this application relate to the field of display technologies and, in particular, to a display panel and a production method thereof.

BACKGROUND

Display panels of Organic Light-Emitting Diode (OLED) have attracted widespread attention because of the advantages of thinness, short reaction time, and low driving voltage thereof. With the increase of people's demand for large display screen, sizes of display panels gradually increase. However, large-sized display panels are prone to cause a problem of uneven luminous brightness.

SUMMARY

In view of the above problem, embodiments of this application provide a display panel and a production method thereof to solve the technical problem of uneven luminous brightness of a large-sized display panel and ensure the display effect of the display panel.

In order to achieve the above objective, embodiments of this application provide the following technical solutions.

A first aspect of an embodiment of this application provides a display panel, including an array substrate, a first electrode layer, an organic functional layer, and a second electrode layer, which are stacked, the organic functional layer is located between the first electrode layer and the second electrode layer. The first electrode layer includes at least one electrode block, and the second electrode layer is connected with at least one auxiliary electrode. The auxiliary electrode is disposed on the array substrate, or disposed in the array substrate. The auxiliary electrode includes a first material layer, and the first material layer includes a bottom surface facing the array substrate, and a side surface intersecting the bottom surface of the first material layer. An angle between the bottom surface of the first material layer and the side surface of the first material layer is greater than or equal to 60° and less than or equal to 160°.

A second aspect of an embodiment of this application provides a method for producing a display panel for forming the display panel as described in any one of the above, including:

providing an array substrate having an auxiliary electrode and an electrode block, where the auxiliary electrode is disposed on the array substrate, or disposed in the array substrate; the auxiliary electrode includes a first material layer, and the first material layer includes a bottom surface facing the array substrate, and a side surface intersecting the bottom surface of the first material layer, an angle is formed between the bottom surface of the first material layer and the side surface of the first material layer; the angle is greater than or equal to 60° and less than or equal to 160°;

forming an organic functional layer and a second electrode layer on the array substrate, and the second electrode layer is connected with the auxiliary electrode.

The method for producing a display panel in the embodiment of this application is used for forming the display panel as described in any one of the above. Advantages of the display panel will not be repeated in embodiments of this application.

BRIEF DESCRIPTION OF DRAWINGS

FIG. 13 is a schematic diagram of an auxiliary electrode on a positive X-axis when a substrate is rotated.

FIG. 14 is a cross-sectional view of M-M in FIG. 6.

FIG. 15 is a cross-sectional view of $P_1$-$P_1$ in FIG. 1.

FIG. 37 is a partial enlarged view for the position of C according to some other embodiments of this application.

FIG. 38 is a flowchart of a method for producing a display panel according to an embodiment of this application.

FIG. 64 is a schematic diagram of forming a second insulating layer on a first conductive layer.

FIG. 65 is a schematic diagram of forming a second etching auxiliary layer on a first conductive layer.

FIG. 66 is a schematic diagram of forming a second etching auxiliary block by patterning a second etching auxiliary layer.

FIG. 67 is a schematic diagram of etching an exposed first conductive layer.

FIG. 68 is a schematic diagram of forming a first etching auxiliary layer on a first insulating layer.

FIG. 69 is a schematic diagram of forming a first etching auxiliary block by patterning a first etching auxiliary layer.

DETAILED DESCRIPTION OF EMBODIMENTS

Figure 1:
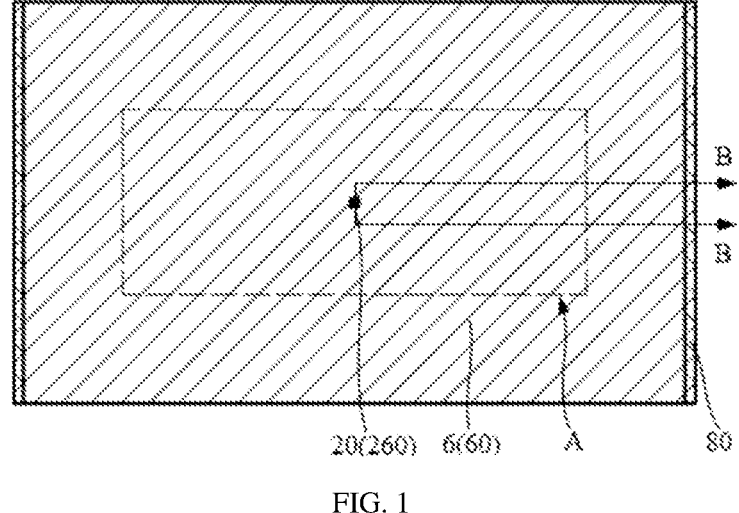
FIG. 1 is a schematic top view of a structure of a display panel according to some embodiments of this application.

As described in the background, large-sized display panels are prone to cause a technical problem of uneven luminous brightness. It has been found by inventor's research that the reason for this technical problem is that a display panel usually includes an array substrate, a first electrode layer, an organic functional layer, and a second electrode layer, which are stacked, and the second electrode layer is usually provided as a whole layer, and a voltage is provided to the second electrode layer from both sides of the second electrode layer, so that the organic functional layer emits light. However, since the second electrode layer of the display panel has a large area, the resistance of the second electrode layer is high, there is thus a large voltage drop generated during a process of transmitting the voltage from both sides of the second electrode layer to a middle portion of the second electrode layer, so that voltages at different positions of the second electrode layer are inconsistent, resulting in uneven luminous brightness of the display panel.

In response to the above technical problem, an embodiment of this application provide a display panel, an auxiliary electrode is provided on an array substrate or in the array substrate, and the auxiliary electrode is connected to a second electrode layer, so that the voltage can be input to the second electrode layer through the auxiliary electrode, resulting in reduced voltage drop of the second electrode layer, therefore, the problem of uneven luminous brightness of the display panel can be mitigated or eliminated.

To make the above objectives, technical solutions, and advantages of embodiments of this invention clearer, the following clearly and comprehensively describes the technical solutions in embodiments of this invention with reference to the accompanying drawings in embodiments of this invention. Apparently, the described embodiments are merely a part rather than all embodiments of this present invention. All other embodiments obtained by persons of ordinary skill in the art based on embodiments of this invention without creative effort shall fall within the protection scope of the present invention.

It should be noted that sizes and shapes of figures in the drawings do not reflect true scales, and aim to illustrate contents of embodiments of this application. In addition, same or similar numbers throughout here indicate same or similar elements or elements with same or similar functions.

A display panel according to an embodiment of this application includes an array substrate, a first electrode layer, an organic functional layer, and a second electrode layer, which are stacked. The first electrode layer and the second electrode layer are configured to provide carriers with different polarities for the organic functional layer, i.e., holes and electrons, and the holes and electrons are combined in the organic functional layer to emit light. The first electrode layer may be an anode layer that provides holes, and the second electrode layer may be a cathode layer that provides electrons. Conversely, the first electrode layer may also be a cathode layer that provides electrons, and the second electrode layer may be an anode layer that provides holes. The following takes the first electrode layer as an anode layer and the second electrode layer as a cathode layer for example to illustrate solutions of embodiments of this application.

Figure 2:
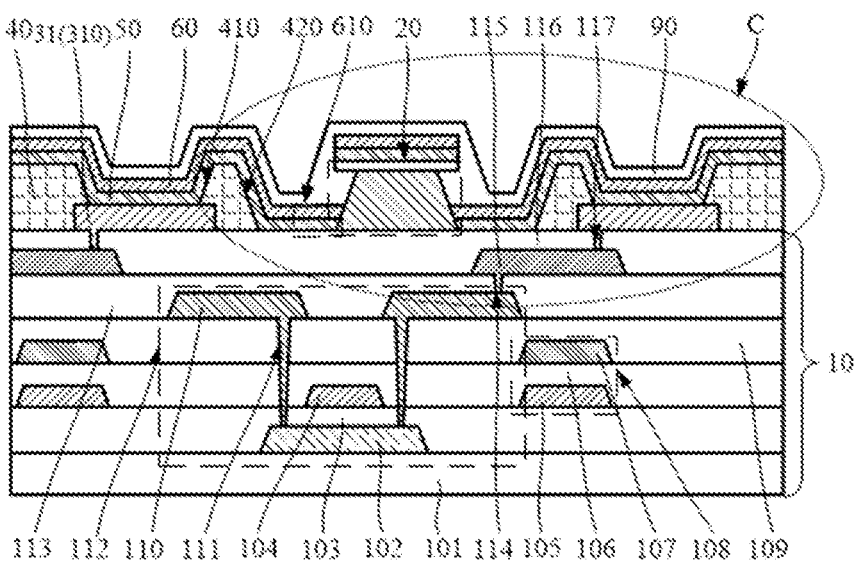
FIG. 2 is a schematic diagram of a cross-sectional structure along the B-B direction in FIG. 1 according to some embodiments of this application.

Referring to FIGS. 1 and 2, an array substrate 10 is configured to support a display panel film layer or a device disposed on the array substrate 10, and to control electric current flowing into an organic functional layer. Exemplarily, the array substrate 10 may include a base 101, and a first insulating layer 101, a first conductive layer, and a second insulating layer 116, which are stacked on the base 101. The array substrate 10 may further include an active layer 102, a third insulating layer 103, a second conductive layer, a fourth insulating layer 106, a third conductive layer, a fifth insulating layer 109, and a fourth conductive layer, which are stacked between the base 101 and the first insulating layer 113.

The material of the base 101 may be one of a glass base, a quartz base, a resin base and the like. The material of the base 101 may also be a flexible base, such as polyimide and the like. When the base 101 is a flexible base, the base 101 may be a multilayer structure with an organic layer and an inorganic layer alternately stacked. Exemplarily, the multilayer structure may include an inorganic layer, an organic layer, and an inorganic layer, which are sequentially stacked, such as silicon oxide, polyimide, and silicon oxide, which are sequentially stacked. The multilayer structure may also include an organic layer, an inorganic layer, an organic layer, and an inorganic layer, which are sequentially stacked, such as polyimide, silicon oxide, polyimide, and silicon oxide, which are sequentially stacked. The multilayer structure with the organic layer and the inorganic layer alternately stacked can take into account flexibility and strength of the base 101 simultaneously, so that the display panel has a bendable function, and can resist breaking and deformation.

The active layer 102, the third insulating layer 103, the second conductive layer, the fourth insulating layer 106, the third conductive layer, the fifth insulating layer 109, the fourth conductive layer, the first insulating layer 113, and the first conductive layer are stacked on the base 101. The active layer 102, the second conductive layer, the third conductive layer, the fourth conductive layer, and the first conductive layer may be patterned to form a pixel drive circuit having a thin-film transistor 112 and a capacitor 108. Exemplarily, the number of the thin-film transistor 112 and capacitor 108 may be multiple, and the pixel drive circuit formed by the thin-film transistor 112 and capacitor 108 may be arranged in an array on the base 101.

Referring to FIG. 2, the active layer 102 is disposed on the base 101, and is patterned to form an active region of the thin-film transistor 112. Exemplarily, the material of the active layer 102 may be polysilicon, also may be an oxide semiconductor such as indium gallium zinc oxide (IGZO) or indium tin zinc oxide (IZTO), and also may be a compound semiconductor such as a group II-VI compound semiconductor or a group III-V compound semiconductor.

The third insulating layer 103 covers the active layer 102, as well as a surface of the base 101 which is not covered by the active layer 102 to insulate the active layer 102. Exemplarily, the material of the third insulating layer 103 may be an inorganic insulating material, for example, may include at least one of silicon oxide ($SiO_x$), silicon nitride ($SiN_x$), alumina ($Al_2O_3$) and silicon oxynitride ($SiN_xO_Y$).

The second conductive layer are disposed on the third insulating layer, and the second conductive layer is typically patterned to form structures, such as a gate 104 of the thin-film transistor 112, and a capacitor lower plate 105 of the capacitor 108 and the like. Exemplarily, the gate 104 may be provided opposite to the active layer 102. The capacitor lower plate 105 is spaced from the gate 104. Exemplarily, the material of the second conductive layer may include at least one of molybdenum (Mo), titanium (Ti), aluminum (Al) and copper (Au). It is understood that the material of the second conductive layer may also include other conductive materials, which will not be repeated in embodiments of this application.

The fourth insulating layer 106 is disposed on the second conductive layer, and the fourth insulating layer 106 covers the second conductive layer, and covers a surface of the third insulating layer 103 which is not covered by the second conductive layer, so as to insulate the second conductive layer. Exemplarily, the material of the fourth insulating layer 106 may include at least one of silicon oxide ($SiO_x$), silicon nitride ($SiN_x$), alumina ($Al_2O_3$) and silicon oxynitride ($SiN_xO_Y$).

The third conductive layer is disposed on the fourth insulating layer 106, and the third conductive layer is usually patterned to form a capacitor upper plate 107 and the like. The capacitor upper plate 107 is disposed opposite to the capacitor lower plate 105, and the fourth insulating layer 106 is located between the capacitor upper plate 107 and the capacitor lower plate 105 to form the capacitor 108. Exemplarily, the material of the third conductive layer may include at least one of molybdenum (Mo), titanium (Ti), aluminum (Al), and copper (Au).

The fifth insulating layer 109 is disposed on the third conductive layer, the fifth insulating layer 109 covers the third conductive layer, and covers a surface of the fourth insulating layer 106 which is not covered by the third conductive layer, to insulate the third conductive layer. Exemplarily, the fifth insulating layer 109 may be an inorganic insulating layer, for example, may include at least one of silicon oxide ($SiO_x$), silicon nitride ($SiN_x$), alumina ($Al_2O_3$), and silicon oxynitride ($SiN_xO_y$).

The fourth conductive layer is disposed on the fifth insulating layer 109, and the fourth conductive layer is usually patterned to form a source drain 110 of the thin-film transistor 112 and the like. The source drain 110 may be disposed opposite to the active layer 102. Exemplarily, a first via hole 111 may also be provided in the array substrate 10, the first via hole 111 sequentially penetrates into the fifth insulating layer 109, the fourth insulating layer 106, and the third insulating layer 103. The source drain 110 is connected to the active layer 102 by the first via hole 111. Exemplarily, the material of the fourth conductive layer may include at least one of molybdenum (Mo), titanium (Ti), aluminum (Al), copper (Au), silver (Ag), indium tin oxide (ITO), and indium zinc oxide (IZO).

The first insulating layer 113 is disposed on the fourth conductive layer, the first insulating layer 113 covers the fourth conductive layer, and covers a surface of the fifth insulating layer 109 which is not covered by the fourth conductive layer, to insulate the fourth conductive layer. Exemplarily, the material of the first insulating layer 113 may be an organic insulating layer, for example, may include a photosensitive resin. The material of the first insulating layer 113 may also be an inorganic insulating layer, for example, may include at least one of silicon oxide ($SiO_x$), silicon nitride ($SiN_x$), alumina ($Al_2O_3$), and silicon oxynitride ($SiN_xO_y$). A second via hole 114 may be provided in the first insulating layer 113.

The first conductive layer is disposed on the first insulating layer 113, and the first conductive layer is usually patterned to form a connecting wire 115 and the like. Exemplarily, the connecting wire 115 is connected to the source drain 110 through the second via hole 114. Exemplarily, the material of the first conductive layer may include at least one of molybdenum (Mo), titanium (Ti), aluminum (Al), copper (Au), silver (Ag), indium tin oxide (ITO) and indium zinc oxide (IZO).

The array substrate 10 further includes a second insulating layer 116, and the second insulating layer 116 covers the first conductive layer, and covers a surface of the first insulating layer 113 which is not covered by the first conductive layer, to insulate the first conductive layer, and further to improve flatness of the array substrate 10. Exemplarily, the material of the second insulating layer 116 may include a resin material. It is understood that the array substrate 10 is formed by the base 101 and an array circuit layer on the base 101, and a pixel drive circuit is located in the array circuit layer. A light-emitting device layer includes an anode layer, an organic functional layer 50, and a cathode layer 60, and the light-emitting device layer is located on the array substrate 10.

The array substrate 10 may be provided with an anode layer for providing holes for the organic functional layer 50. Exemplarily, the anode layer may be disposed on the second insulating layer 116. Exemplarily, the anode layer includes at least one anode 310. The at least one anode 310 may be a plurality of anodes 310, and the plurality of anodes 310 may be arranged in an array. The anode 310 may be provided corresponding to the thin-film transistor 112 in the array substrate 10, that is, each anode 310 may be connected to its corresponding thin-film transistor 112 via the connecting wire 115. Exemplarily, a third via hole 117 may be provided in the second insulating layer 116, and each anode 310 may be electrically connected by the third via hole 117 with its corresponding connecting wire 115 and thin-film transistor 112, so that whether the anode 310 is powered on can be controlled by a switch of the thin-film transistor 112, thereby controlling whether the organic functional layer 50 emits light. Exemplarily, the material of the anode layer can be indium tin oxide/silver/indium tin oxide (ITO/Ag/ITO). It can be understood that the anode layer can also be other materials.

The array substrate 10 is further provided with a pixel definition layer 40. Referring to FIG. 2, the pixel definition layer 40 covers the anode 310 and a surface of the array substrate 10 which is not covered by the anode 310. The pixel definition layer 40 is provided with a plurality of pixel openings 410, each pixel opening 410 corresponds to one anode 310, and the pixel opening 410 correspondingly exposes a top surface of the anode 310.

The organic functional layer 50 covers the pixel definition layer 40, and covers the exposed top surface of the anode 310 in the pixel opening 410, so as to be connected with the anode 310, so that the anode 310 can provide holes for the organic functional layer 50. It should be noted that the organic functional layer 50 is a multilayer organic film layer with multiple layers stacked. Exemplarily, the multilayer organic film layer may include a hole injection layer, a hole transport layer, an electron transport layer, and an electron injection layer stacked sequentially along a normal direction of a plane in which the array substrate 10 lies. The cathode layer 60 covers the organic functional layer 50, for example, the cathode layer 60 may cover the electron injection layer for providing electrons to the organic functional layer 50. The hole injection layer is in contact with the anode 310, and the electron injection layer is in contact with the cathode layer 60. The multilayer organic film layer may further include a light-emitting material layer, the light-emitting material layer is located between the hole transport layer and the electron transport layer, and is located within the pixel opening 410. The anode 310 provides holes, and the holes enter the light-emitting material layer through the hole injection layer and hole transport layer. The cathode layer 60 provides electrons, and the electrons enter the light-emitting material layer through the electron injection layer and the electron transport layer. The holes are combined with electrons in the light-emitting material layer to emit light.

It is understood that the organic functional layer 50 may further include other organic film layers, which will not be repeated in embodiments of this application.

Referring to FIG. 1, the cathode layer 60 may include a preset region A, and the preset region A may be an area where a voltage value in the cathode layer 60 is lower than a preset voltage value when the cathode layer 60 is powered on. In the preset region A, because the voltage value in the cathode layer 60 is lower than the preset voltage value, the luminous brightness of the light-emitting material layer in the corresponding organic functional layer 50 is lower than the luminous brightness of other areas, so that the uniformity of the luminous brightness of the display panel cannot meet requirements.

Exemplarily, a range of the preset region A can be determined by methods such as simulation or testing. Referring to FIG. 1, the array substrate 10 may be provided with two second power wires 80, the two second power wires 80 may be located on both sides of the cathode layer 60, respectively, each second power wire 80 is electrically connected with the cathode layer 60 to power on the cathode layer 60 through both sides of the cathode layer 60. In a process of powering on the cathode layer 60 through the second power wire 80, there is a voltage value everywhere in the cathode layer 60. If the voltage value is lower than the preset voltage value, the difference between the voltage value and the voltage input to the second power wire 80 is too large, which cause too large voltage drop of the cathode layer 60, therefore the uniformity of the luminous brightness of the display panel cannot meet the requirements, and then a region of the cathode layer 60 to which the voltage value corresponds is the preset region A.

It is understood that when determining the preset region A, the second power wire 80 may be located elsewhere on the array substrate 10, as long as it can make the cathode layer 60 powered on.

Referring to FIG. 2, the display panel may further include a packaging layer 90, the packaging layer 90 covers the cathode layer 60 to seal the display panel in order to prevent impurities such as water and oxygen from entering the display panel to affect the display effect of the display panel.

Referring to FIGS. 1 and 2, the display panel of the embodiment of this application further includes at least one auxiliary electrode 20, and the auxiliary electrode 20 is connected to the cathode layer 60. Exemplarily, the auxiliary electrode 20 may be connected to the preset region A of the cathode layer 60. When a voltage signal is input to the cathode layer 60, the cathode layer 60 may be powered on through the auxiliary electrode 20 to reduce the voltage drop of the cathode layer 60, and to mitigate or eliminate the problem of uneven luminous brightness of the display panel.

Figures 3, 4:
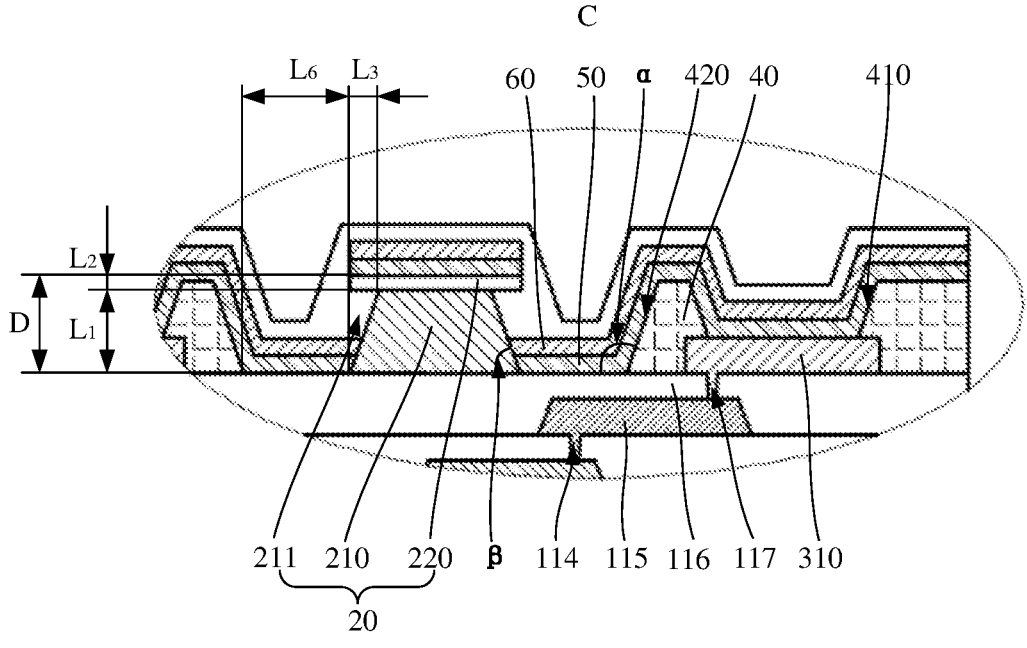
FIG. 3 is a partial enlarged view for the position of C in FIG. 2.
FIG. 4 is a partial enlarged view for the position of C according to some other embodiments of this application.

The auxiliary electrode 20 may be disposed on the array substrate 10, or may be disposed in the array substrate 10. Referring to FIGS. 2 and 3, a recessed part 211 may be provided at a side surface of the auxiliary electrode 20, the organic functional layer 50 covers a top surface of the auxiliary electrode 20, and the organic functional layer 50 and the cathode layer 60 may form a lap-jointing part 610 by lap-jointing with the auxiliary electrode 20 in the recessed part 211. Since the recessed part 211 is provided at the side surface of the auxiliary electrode 20, an edge of the top surface of the auxiliary electrode 20 is protruded from the side surface of the auxiliary electrode 20. When the organic functional layer 50 and the cathode layer 60 cover the auxiliary electrode 20, the organic functional layer 50 and the cathode layer 60 are broken at the edge of the top surface of the auxiliary electrode 20, so that the organic functional layer 50 and the cathode layer 60 may form the lap-jointing part 610 by lap-jointing with the auxiliary electrode 20 in the recessed part 211, therefore the cathode layer 60 can be connected with the auxiliary electrode 20.

In some possible implementations in the embodiments of this application, referring to FIG. 2, the auxiliary electrode 20 may be disposed on the array substrate 10, and the auxiliary electrode 20 is electrically insulated from the anode 310.

Exemplarily, the material of the auxiliary electrode 20 and the material of the anode 310 may be different.

The auxiliary electrode 20 may include a conductive metal layer, and the recessed part 211 may be formed at a side surface of the conductive metal layer by lateral etching.

Optionally, referring to FIG. 3, the auxiliary electrode 20 may further include a first material layer 210. The first material layer 210 may be disposed on the array substrate

10, for example, the first material layer 210 may be disposed on the second insulating layer 116. The auxiliary electrode 20 may further include a second material layer 220, and the second material layer 220 covers a top surface of the first material layer 210. Exemplarily, the second material layer 220 includes a bottom surface facing the array substrate 10, and the bottom surface of the second material layer 220 and the side surface of the first material layer 210 enclose to form the recessed part 211. The cathode layer 60 may be lap-jointed with the auxiliary electrode 20 within the recessed part 211.

Exemplarily, an etching rate of the material of the first material layer 210 is greater than an etching rate of the material of the second material layer 220. During the production process of the display panel, the first material layer 210 and the second material layer 220 may be simultaneously etched by wet etching. Since the etching rate of the material of the first material layer 210 is greater than the etching rate of the material of the second material layer 220, the etching amount for the side surface of the first material layer 210 is greater than the etching amount for the side surface of the second material layer 220 in the etching process, so that the recessed part 211 is formed by enclosing of the bottom surface of the second material layer 220 and the side surface of the first material layer 210.

Exemplarily, the first material layer 210 may be a first metal layer, and the second material layer 220 may be a second metal layer. Exemplarily, the material of the first metal layer can be aluminum (Al), and the material of the second metal layer can be titanium (Ti) or molybdenum (Mo).

Exemplarily, along the normal direction, i.e., a vertical upward direction as shown in FIG. 3, of the plane in which the array substrate 10 lies, the thickness L2 of the second material layer 220 may be less than the thickness L1 of the first material layer 210, so that the organic functional layer 50 and the cathode layer 60 may be broken at the edge of the top surface of the second material layer 220.

Exemplarily, referring to FIG. 3, the distance L3 between the edge of the top surface of the first material layer 210 and the side surface of the second material layer 220 may be less than or equal to 2 μm, for example, the distance L3 may be 2 μm, 1.5 μm, or 1 μm. The organic functional layer 50 and the cathode layer 60 may be formed by evaporation. When evaporating the organic functional layer 50 and the cathode layer 60, the distance L3 of less than or equal to 2 μm may prevent the second material layer 220 from shielding the materials of the organic functional layer 50 and the cathode layer 60 during the evaporation process, so that the organic functional layer 50 and the cathode layer 60 can enter the recessed part and are lap-jointed with the auxiliary electrode 20.

Alternatively, referring to FIG. 4, the auxiliary electrode 20 may further include a third material layer 230, a first material layer 210, and a second material layer 220, which are sequentially stacked, and the third material layer 230 is disposed on the array substrate 10, the first material layer 210 is disposed on the third material layer 230. The etching rate of the material of the first material layer 210 is greater than the etching rate of the material of the second material layer 220. A recessed part 211 is formed by enclosing of the bottom surface of the second material layer 220 and the side surface of the first material layer 210.

In the process of producing the display panel, exemplarily, the first material layer 210 and the second material layer 220 may be etched simultaneously by wet etching. Since the etching rate of the material of the first material layer 210 is greater than that of the material of the second material layer 220, the etching amount for the side surface of the first material layer 210 is greater than the etching amount for the side surface of the second material layer 220 in the etching process, so that the recessed part can be formed by enclosing of the bottom surface of the second material layer 220 and the side surface of the first material layer 210. Furthermore, the third material layer 230 may also improve the adhesion between the first material layer 210 and the array substrate 10, to prevent the first material layer 210 from separating from the array substrate 10 to affect the reliability of the display panel.

Exemplarily, referring to FIG. 4, the first material layer 210 includes a bottom surface attached to the third material layer 230, and a side surface of the third material layer 230 is flush with an edge of the bottom surface of the first material layer 210, or, the side surface of the third material layer 230 exceeds the edge of the bottom surface of the first material layer 210. Exemplarily, the distance L4 between the edge of the bottom surface of the first material layer 210 and the side surface of the third material layer 230 may be greater than or equal to zero. If the side surface of the third material layer 230 is located below the bottom surface of the first material layer 210, the organic functional layer 50 and the cathode layer 60 will enter a space between the side surface of the third material layer 230 and the bottom surface of the first material layer 210, resulting in that the cathode layer 60 cannot be lap-jointed with the side surface of the first material layer 210. By providing the distance L4 greater than or equal to zero, the above problem can be avoided to ensure that the organic functional layer 50 and the cathode layer 60 can enter the recessed part 211 to lap-joint with the first material layer 210.

Exemplarily, the first material layer 210 may be a first metal layer, the second material layer 220 may be a second metal layer, the third material layer 230 may be a third metal layer or an inorganic layer.

When the first material layer 210 is a first metal layer, the second material layer 220 is a second metal layer, and the third material layer 230 is a third metal layer, the etching rate of the material of the third metal layer and the etching rate of the material of the second metal layer may be less than the etching rate of the material of the first metal layer. In a process of forming the auxiliary electrode, the etched amount of the second metal layer and the etched amount of the third metal layer can be reduced, so that the recessed part 211 can be formed by enclosing of the bottom surface of the second metal layer and the side surface of the first metal layer. Meanwhile, the side surface of the third metal layer being located below the bottom surface of the first metal layer, which affects the lap-jointing of the organic functional layer 50 and the cathode layer 60 with the first metal layer, can also be avoided. Exemplarily, the material of the first metal layer can be aluminum (Al), etc., and the material of the second metal layer and the material of the third metal layer can be titanium (Ti) or molybdenum (Mo), etc.

When the first material layer 210 is a first metal layer, the second material layer 220 is a second metal layer, and the third material layer 230 is an inorganic layer, since the etching rate of the material of the inorganic layer is less than the etching rate of the metals, and the etching rate of the material of the second metal layer is less than the etching rate of the material of the first metal layer, the etched amounts of the inorganic layer and the second metal layer may be reduced, thereby forming the recessed part 211 at the side surface of the first metal layer. Meanwhile, the edge of the inorganic layer being located below the first metal layer, which affects the lap jointing of the organic functional layer 50 and the cathode layer 60 with the first metal layer, can also be avoided. Exemplarily, the material of the inorganic layer may include at least one of silicon oxide, silicon nitride, silicon oxynitride, and indium tin oxide.

Exemplarily, referring to FIG. 3 or FIG. 4, along the normal direction of the plane in which the array substrate 10 lies, the thickness D of the auxiliary electrode 20 may be 2500 Å to 10000 Å to avoid the problem that the organic functional layer 50 and the cathode layer 60 cannot be broken at the edge of the second material layer 60 due to the small thickness D of the auxiliary electrode 20, thereby ensuring that the organic functional layer 50 and the cathode layer 60 can be lap jointed with the first material layer 210 in the recessed part 211, and further ensuring that the cathode layer 60 can be electrically connected to the auxiliary electrode 20. The orthographic projection of the auxiliary electrode 20 onto the array substrate 10 may be triangular or rectangular. Exemplarily, referring to FIG. 6, when the auxiliary electrode 20 includes at least a first material layer 210 and a second material layer 220 stacked sequentially along the normal direction of the plane in which the array substrate lies, the orthographic projections of the first material layer 210 and the second material layer 220 onto the array substrate 10 may be square. The first material layer 210 includes a top surface attached to the second material layer 220, and the orthographic projection of the second material layer 220 onto the array substrate 10 covers the orthographic projection of the first material layer 210 onto the array substrate 10, and the area of the orthographic projection of the second material layer 220 onto the array substrate 10 is greater than the area of the top surface of the first material layer 210.

Figure 7:
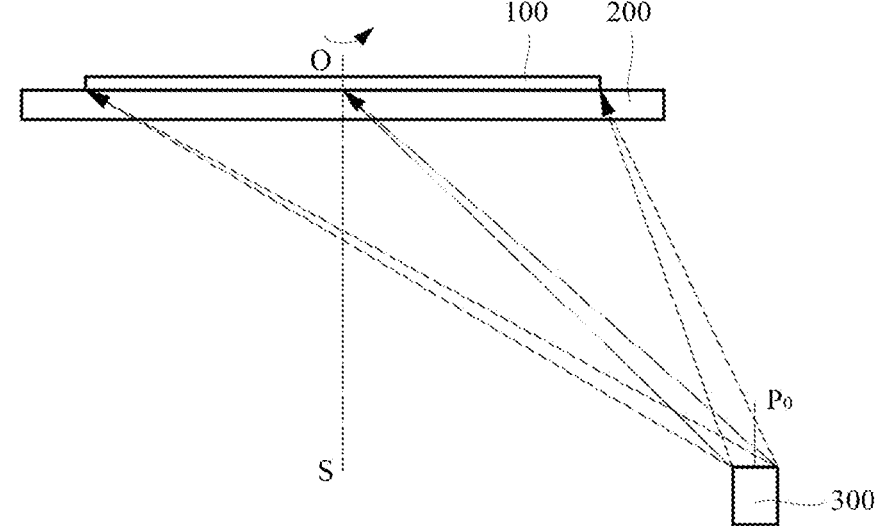
FIG. 7 is a schematic diagram of an evaporation chamber when an organic functional layer and a second electrode layer are evaporated to a substrate.

The organic functional layer 50 and the cathode layer 60 may be formed on the array substrate 10 having the auxiliary electrode 20 by evaporating. Exemplarily, a schematic diagram of a structure of an evaporation chamber is shown in FIG. 7. A base 100, including the array substrate 10 and the auxiliary electrode 20 located on the array substrate 10, is mounted to the top of the evaporation chamber in an upside-down manner. That is, the auxiliary electrode 20 on the array substrate 10 faces the bottom of the evaporation chamber. A mask plate 200 is provided on a side, facing the bottom of the evaporation chamber, of the base 100. A normal P0 of an evaporation source 300 and a vertical centerline S of the base 100 may be provided in parallel. Alternatively, there may be an angle between the normal P0 of the evaporation source 300 and the vertical centerline S of the base 100. In the process of evaporation, the evaporation source 300 emits evaporation beams, and the evaporation beams are evaporated to the base 100 through the mask plate 200 along a direction indicated by dotted arrows in FIG. 7. Meanwhile, the base 100 and the mask plate 200 rotate with the vertical centerline S as an axis to form the organic functional layer 50 or the cathode layer 60 on the surface of the base 100, and the organic functional layer 50 or cathode layer 60 covers the top surface of the auxiliary electrode 20, and forms a lap-jointing part by lap-jointing with the auxiliary electrode 20. It should be noted that the above description of the structure of the evaporation chamber is only an example, in order to facilitate the description of technical solutions of embodiments of this application, and should not be understood as a limitation to technical solutions of embodiments of this application.

FIG. 8, FIG. 9, FIG. 10, FIG. 11, FIG. 12 and FIG. 13 all are schematic top views of the structure of the evaporation chamber, where the coordinate system XOY is a rectangular coordinate system in the top views of the evaporation chamber, and a center point of the base 100 coincides with a center point O of the rectangular coordinate system XOY. The dash dot line MM is a center line of the auxiliary electrode 20 in a first direction, The dash dot line NN is a center line of the auxiliary electrode 20 in a second direction, and the second direction is perpendicular to the first direction. Exemplarily, referring to FIG. 8 to FIG. 13, in the process of evaporation, the base 100 may rotate counterclockwise around the center point O, and the auxiliary electrode 20 sequentially runs across a first quadrant, a second quadrant, a negative X-axis, a third quadrant, a fourth quadrant, and a positive X-axis.

The evaporation path of the evaporation source mentioned below refers to an emitting path of an evaporated material, and for evaporation paths of all evaporation beams emitted by the evaporation source, the evaporation path of an evaporation beam emitted from the center point of the evaporation source is taken as example to facilitate the description of technical solutions of embodiments of this application.

Figure 6:
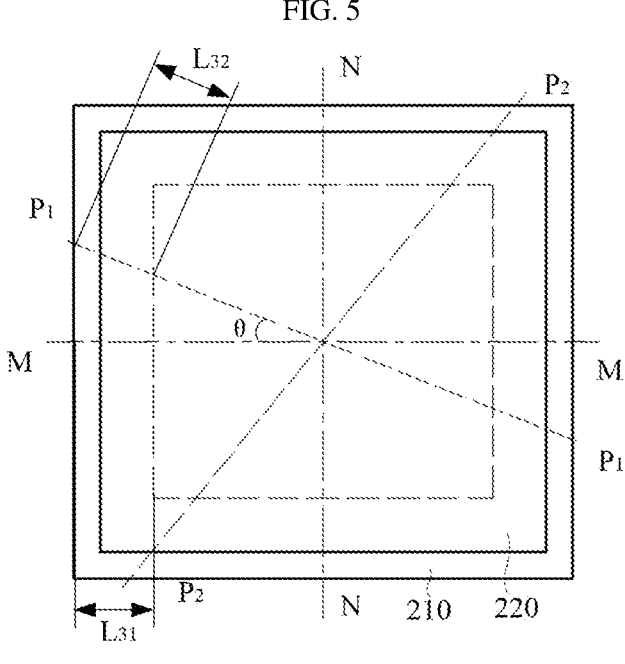
FIG. 6 is a top view of an auxiliary electrode according to some other embodiments of this application.
Figure 8:
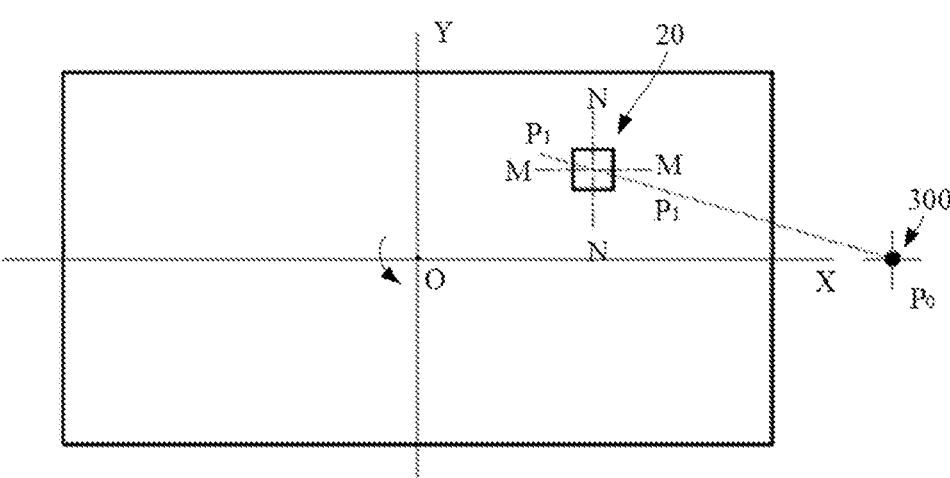
FIG. 8 is a schematic diagram of an auxiliary electrode in a first quadrant when a substrate is rotated.
Figures 9, 10:
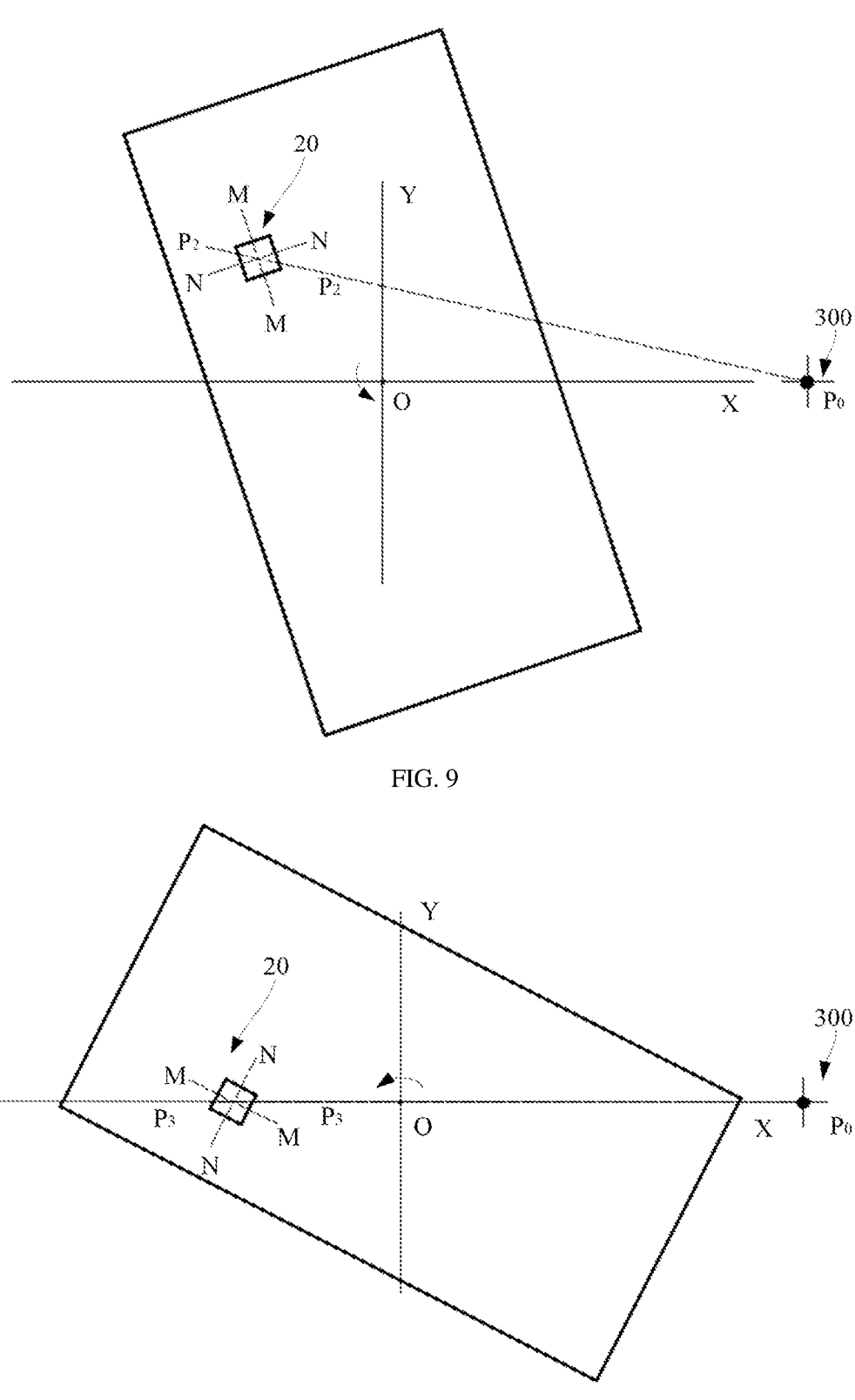
FIG. 9 is a schematic diagram of an auxiliary electrode in a second quadrant when a substrate is rotated.
FIG. 10 is a schematic diagram of an auxiliary electrode on a negative X-axis when a substrate is rotated.
Figure 11:
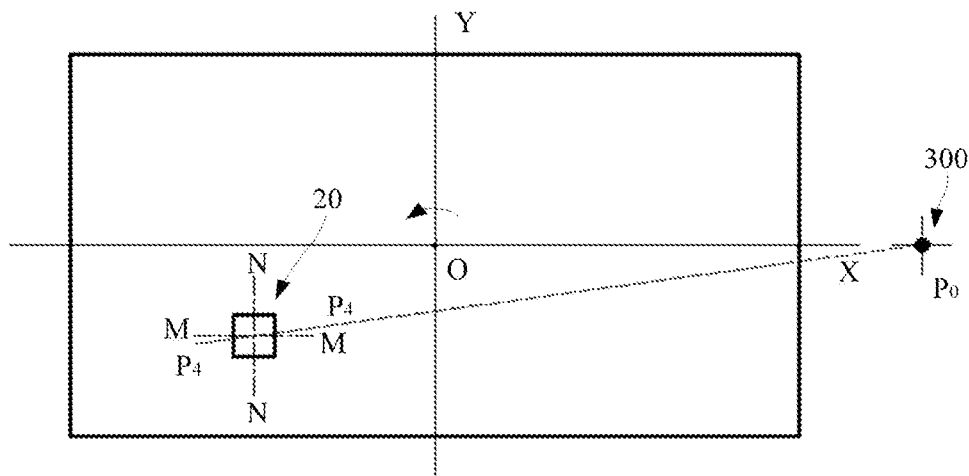
FIG. 11 is a schematic diagram of an auxiliary electrode in a third quadrant when a substrate is rotated.
Figure 12:
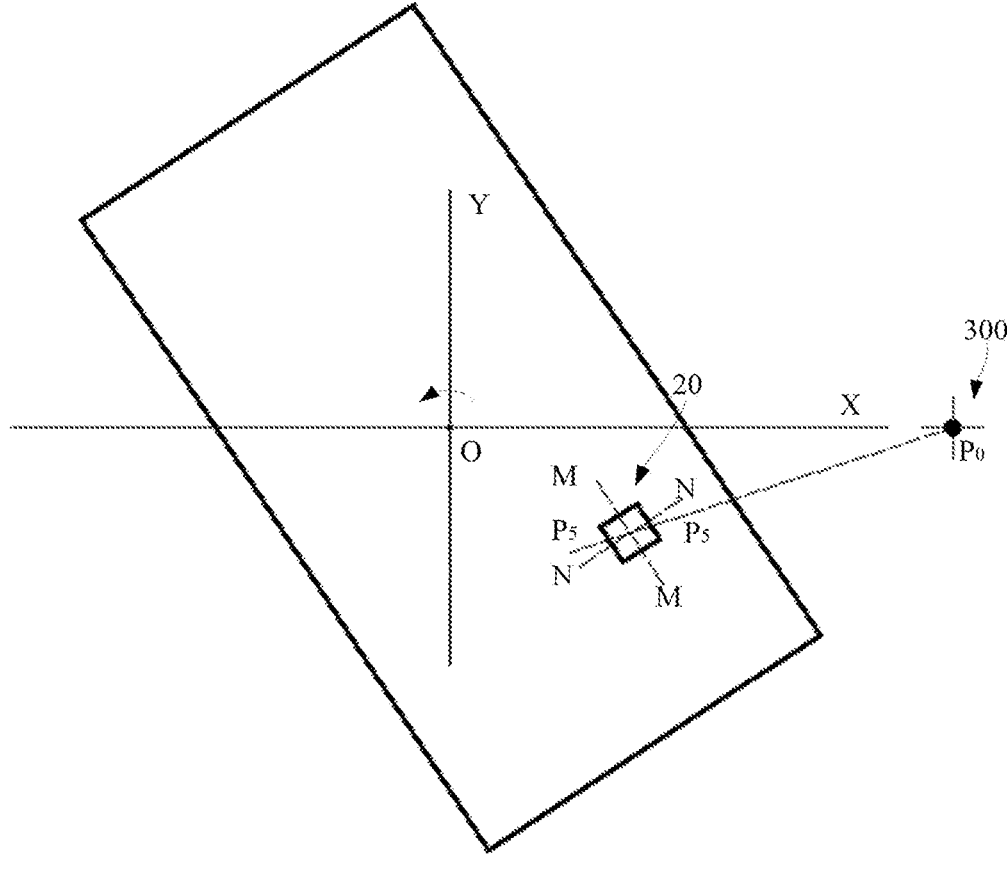
FIG. 12 is a schematic diagram of an auxiliary electrode in a fourth quadrant when a substrate is rotated.
Figure 16:
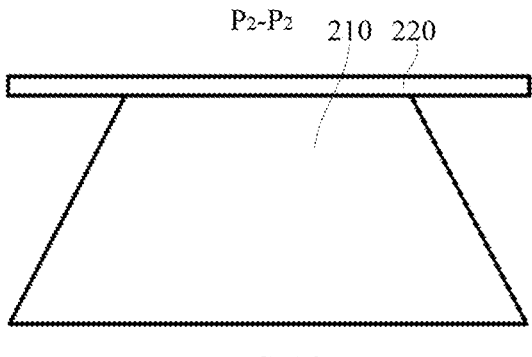
FIG. 16 is a cross-sectional view of $P_2$-$P_2$ in FIG. 2.

A case in which the auxiliary electrode 20 is located in the first quadrant and the second quadrant respectively in FIGS. 8 and 9 is taken as an example, the area evaporated by the evaporation source 300 gradually changes during the rotation process of the base 100. Referring to FIG. 6, $P_1P_1$ is an evaporation path of the evaporation source 300 when the auxiliary electrode 20 is located in the first quadrant, and $P_2P_2$ is an evaporation path of the evaporation source 300 when the auxiliary electrode 20 is located in the second quadrant. Referring to FIG. 14, it is a cross-sectional view of the auxiliary electrode 20 of FIG. 6 along a plane M-M, the cross-sectional view may be used for characterizing the contact area of the auxiliary electrode 20 where the evaporation beam of the evaporation source 300 is contacted with the auxiliary electrode 20 in the plane M-M. Similarly, FIG. 15 and FIG. 16 are cross-sectional views of the auxiliary electrode 20 in a plane $P_1$-$P_1$ and a plane $P_2$-$P_2$, respectively. Combined with FIG. 14, FIG. 15, and FIG. 16, the cross-sectional views in the plane M-M, plane $P_1$-$P_1$ and plane $P_2$-$P_2$ are all different. That is, when the base 100 rotates, the contact area between the evaporation beam of the evaporation source 300 and the auxiliary electrode 20 is continuously changing, reducing the uniformity of the connection between the organic functional layer 50 as well as the cathode layer 60, which are formed by evaporation, and the auxiliary electrode 20.

Referring to FIG. 14, the first material layer 210 has a thickness of $L_1$, the angle between the side surface of the first material layer 210 and the bottom surface of the first material layer 210 is $\beta_1$, the distance between the edge of the top surface of the first material layer 210 and the edge of the bottom surface of the first material layer 210 is $L_{31}$, obtaining:

$$\tan\beta_1 = \frac{L_1}{L_{31}}. \tag{1}$$

Referring to FIG. 15, the angle between the side surface the first material layer 210 and the bottom surface of the first material layer 210 is $\beta_2$, and the distance between the edge of the top surface of the first material layer 210 and the edge of the bottom surface of the first material layer 210 is $L_{32}$, obtaining:

$$\tan\beta_2 = \frac{L_1}{L_{32}}. \tag{2}$$

Referring to FIG. 6, the angle between the evaporation path $P_1P_1$ and the dash dot line MM is $\theta$, obtaining:

$$L_{32} = \frac{L_{31}}{\cos\theta}. \tag{3}$$

From the Equations (1), (2) and (3), it is obtained:

$$\tan\beta_2 = \tan\beta_1 \cos\theta \tag{4}.$$

It can be seen from Equation (4) that when the base 100 rotates, the angle $\beta$ between the side surface of the first material layer 210 in the auxiliary electrode 20 and the bottom surface of the first material layer 210 is continuously changing, that is, the shape of the cross-section of the auxiliary electrode 20 in the evaporation path is continuously changing, and the contact area between the evaporation beam of the evaporation source 300 and the auxiliary electrode 20 is continuously changing, reducing the uniformity of the connection between the organic functional layer 50 as well as the cathode layer 60, which are formed by evaporation, and the auxiliary electrode 20.

Figure 17:
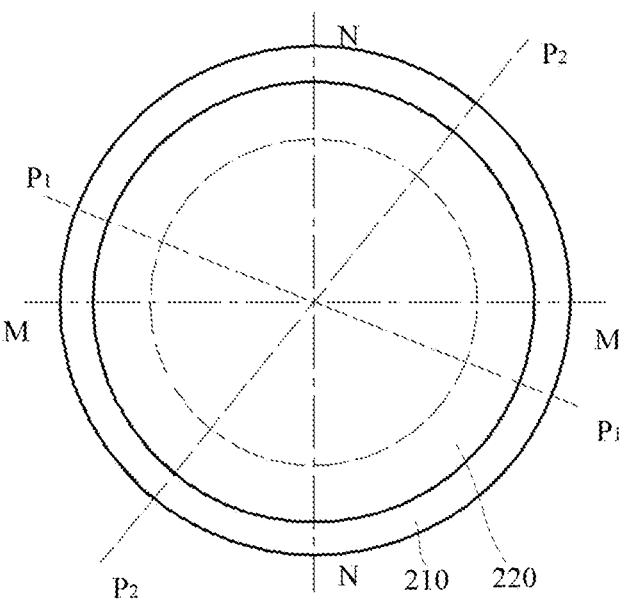
FIG. 17 is a top view of an auxiliary electrode according to some other embodiments of this application.

Optionally, according to figures, the orthographic projection of the auxiliary electrode 20 onto the array substrate 10 may also be a circle or a regular polygon with the number of sides greater than four. Exemplarily, referring to FIG. 17, both of the orthographic projections of the first material layer 210 and the second material layer 220 onto the array substrate 10 may be a circle, or a regular polygon with the number of sides greater than four. The orthographic projection of the second material layer 220 onto the first material layer 210 covers the top surface of the first material layer 210, and the orthographic projection of the second material layer 220 onto the first material layer 210 has an area greater than that of the top surface of the first material layer 210.

Figure 18:
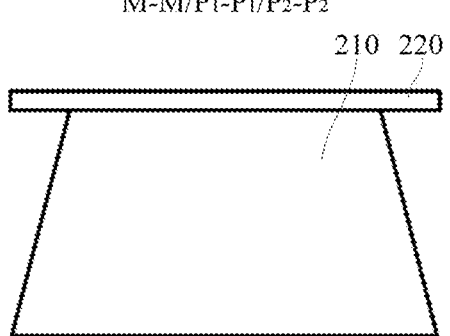
FIG. 18 is a cross-sectional view taken along M-M, $P_1$-$P_1$ and $P_1$-$P_2$ in FIG. 17.
Figure 19:
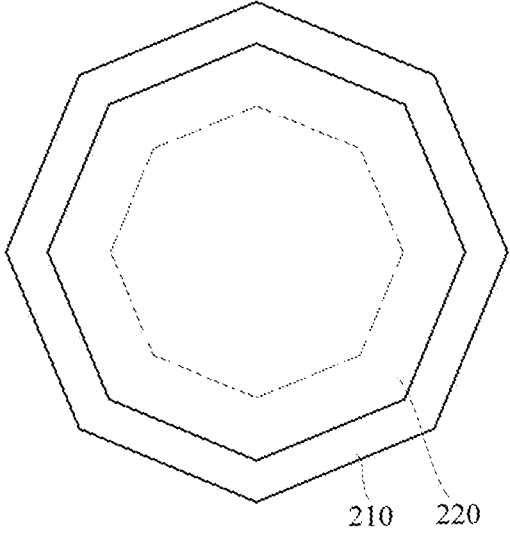
FIG. 19 is a top view of an auxiliary electrode according to some other embodiments of this application.
Figure 20:
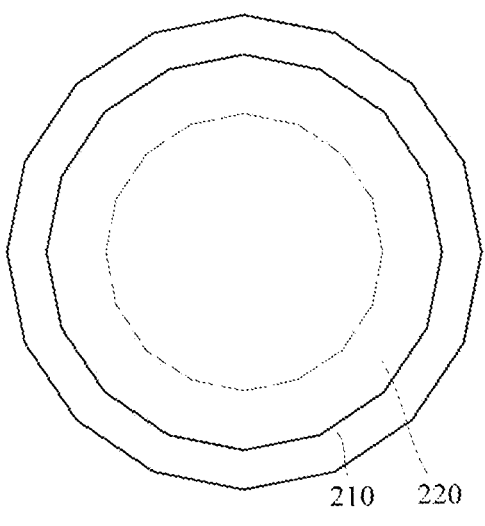
FIG. 20 is a top view of an auxiliary electrode according to some other embodiments of this application.

Referring to FIG. 18, it shows the cross-sections of the auxiliary electrode 20 in the plane M-M, plane $P_1$-$P_1$ and plane $P_2$-$P_2$, therefore, the shapes of the cross-sections in the plane M-M, plane $P_1$-$P_1$ and plane $P_2$-$P_2$ are all the same. That is, when the base 100 rotates, the contact area between the evaporation beam of the evaporation source 300 and the auxiliary electrode 20 does not change, improving the uniformity of the connection of the formed organic functional layer 50 as well as the cathode layer 60 with the auxiliary electrode 20. Exemplarily, referring to FIG. 19, the orthographic projections of the first material layer 210 and the second material layer 220 onto the array substrate 10 may be regular octagons. Referring to FIG. 20, the orthographic projections of the first material layer 210 and the second material layer 220 onto the array substrate 10 may be regular hexadecagons. It is understood that the orthographic projections of the first material layer 210 and the second material layer 220 onto the array substrate 10 may also be other regular polygons similar to circle. The greater the number of sides of the regular polygon, the better the uniformity of the lap-jointing between the auxiliary electrode 20 and the organic functional layer 50 as well as the cathode layer 60, which will not be repeated in embodiments of this application.

The auxiliary electrode 20 may include an auxiliary electrode block 260, that is, the auxiliary electrode 20 has a block structure, and the auxiliary electrode block 260 is electrically insulated from the anode 310. Exemplarily, referring to FIG. 1, the number of the auxiliary electrode block 260 may be one, the orthographic projection of one auxiliary electrode block 260 onto the array substrate 10 may be located in a center of the orthographic projection of the preset region A onto the array substrate 10, such that one auxiliary electrode block 260 can be connected with the center of the preset region A of the cathode layer 60. The center of the preset region A is usually a point where the voltage value is lowest, the auxiliary electrode block 260 is correspondingly disposed in the center of the preset region A of the cathode layer 60, and the cathode layer 60 can be powered on through the center of the preset region A, effectively increasing the voltage value of the preset region A, thereby reducing the voltage drop of the cathode layer 60, and mitigating or eliminating the problem of uneven luminous brightness of the display panel.

Figure 5:
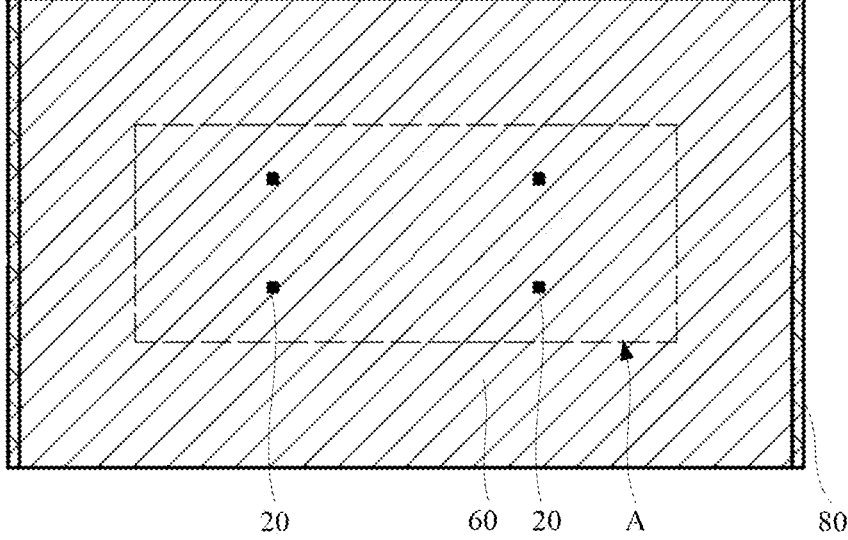
FIG. 5 is a schematic top view of a structure of a display panel according to some other embodiments of this application.

Referring to FIG. 5, the number of the auxiliary electrode block 260 may also be multiple, the orthographic projections of a plurality of auxiliary electrodes 20 onto the array substrate 10 can be uniformly arranged on the orthographic projection of the preset area A onto the array substrate 10 to improve the uniformity of the arrangement of the plurality of auxiliary electrode blocks 260, thereby further improving the uniformity of the voltage value in the cathode layer 60, reducing the voltage drop of the cathode layer 60, and mitigating or eliminating the problem of uneven luminous brightness of the display panel.

Figure 21:
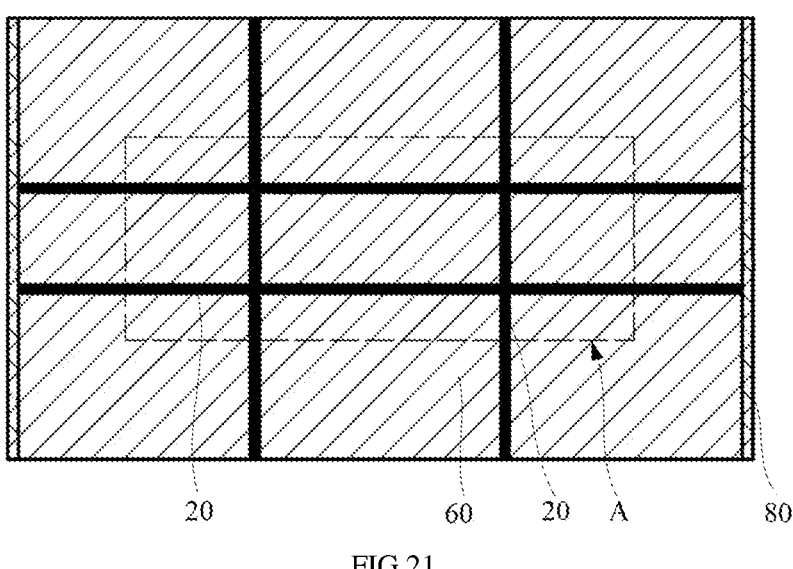
FIG. 21 is a schematic top view of a structure of a display panel according to some other embodiments of this application.

Exemplarily, the auxiliary electrode 20 may further include at least one auxiliary electrode wire, that is, the auxiliary electrode 20 has a strip structure, at least one auxiliary electrode wire is located between a plurality of anodes 310, and is electrically insulated from the plurality of anodes 310. The auxiliary electrode wire can increase contact area with the cathode layer 60, avoiding no conduction caused by poor contact with the cathode layer 60. Exemplarily, referring to FIG. 21, at least one auxiliary electrode wire can be a plurality of auxiliary electrode wires, and the plurality of auxiliary electrode wires form a cross grid-like structure to further improve the uniformity of the arrangement of the auxiliary electrode wires, thereby improving the consistency of the voltage within the cathode layer 60, mitigating or eliminating the problem of uneven luminous brightness of the display panel and ensuring the display effect of the display panel.

It is understood that the auxiliary electrode wires may be correspondingly disposed in the preset region A of the cathode layer 60, or extended beyond the preset region A. Exemplarily, referring to FIG. 21, portions of the auxiliary electrode wires are located in the preset region A, and other portions of the auxiliary electrode wires extends beyond the preset region A, and the cathode layer 60 can be powered on through the auxiliary electrode wires to improve the consistency of the voltage in the cathode layer 60, thereby reducing the voltage drop of the cathode layer 60, and mitigating or eliminating the problem of uneven luminous brightness of the display panel.

Exemplarily, referring to FIG. 3, the first material layer 210 includes the bottom surface facing the array substrate 10, and the side surface intersecting the bottom surface of the first material layer 210. The angle $\beta$ between the bottom surface of the first material layer 210 and the side surface of the first material layer 210 may be greater than or equal to 60°, and less than or equal to 160°, for example may be 60°, 70°, 80°, 90°, 100°, 110°, 120°, 130°, 140°, 150° or 160°. The angle $\beta$ within this angle range may lead to a sufficient lap-jointing length between the cathode layer 60 and the side surface of the first material layer 210, avoiding the problem of unconnection between the cathode layer 60 and the first material layer 210, thereby ensuring the function of powering on the preset region A of the cathode layer 20 through the auxiliary electrode 60.

Figure 22:
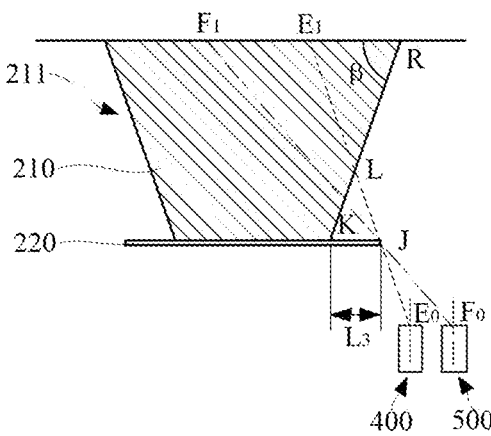
FIG. 22 is a cross-section of an auxiliary electrode according to some other embodiments of this application.

Specifically, referring to FIG. 22, when the organic functional layer 50 or the cathode layer 60 is formed by evaporation, the base 100 is typically mounted to the top of the evaporation chamber in an upside-down manner, and the auxiliary electrode 20 faces the bottom of the evaporation chamber. An organic evaporation source 400 is configured to evaporate the material of the organic functional layer 50 onto the base 100 to form the organic functional layer 50. A cathode evaporation source 500 is configured to evaporate the material of the cathode layer 60 onto the base 100 to form the cathode layer 60. Both the organic evaporation source 400 and the cathode evaporation source 500 are located below the auxiliary electrode 20, a normal $E_0$ of the organic evaporation source 400 and a normal $F_0$ of the cathode evaporation source 500 are parallel to a center line of the auxiliary electrode 20. That is, the organic evaporation source 400 and the cathode evaporation source 500 are located diagonally below the auxiliary electrode 20. The distance between the normal $E_0$ of the organic evaporation source 400 and the auxiliary electrode 20 is greater than distance between the normal $F_0$ of the cathode evaporation source 500 and the auxiliary electrode 20.

In the evaporation process of the organic functional layer 50 and the cathode layer the second material layer 220 of the auxiliary electrode 20 will block the evaporated material of the organic evaporation source 400 and the cathode evaporation source 500. An evaporation path $E_0E_1$ of the organic evaporation source 400 will intersect with an evaporation path $F_0F_1$ of the cathodic evaporation source 500 at the edge of the second material layer 220. As shown in FIG. 22, the evaporation path $E_0E_1$ of the organic evaporation source 400 will intersect with the evaporation path $F_0F_1$ of the cathode evaporation source 500 at a point J. The evaporation path $E_0E_1$ of the organic evaporation source 400, after passing through the point J, intersects with the side surface of the first material layer 210 at a point L, and the point L is the highest point of the evaporated material of the organic evaporation source 400 on the side surface of the first material layer 210. That is, the organic functional layer 50 formed after evaporation covers an area between the side surface of the first material layer 210 under the point L and the bottom surface of the auxiliary electrode 20. The length for the lap-jointing of the organic functional layer 50 and the first material layer 210 is LR. A point R is the edge of the bottom surface of the first material layer 210. The evaporation path $F_0F_1$ of the cathode evaporation source 500, after passing the point J, intersects with the side surface of the first material layer 210 at a point K, and the point K is the highest point of the evaporated material of the cathode evaporation source 500 on the side surface of the first material layer 210. That is, the cathode layer 60 formed after evaporation covers an area of the side surface of the first material layer 210 from the K point to L point. Therefore, the length for the lap jointing of cathode layer 60 and the first material layer 210 is KL.

Figure 23:
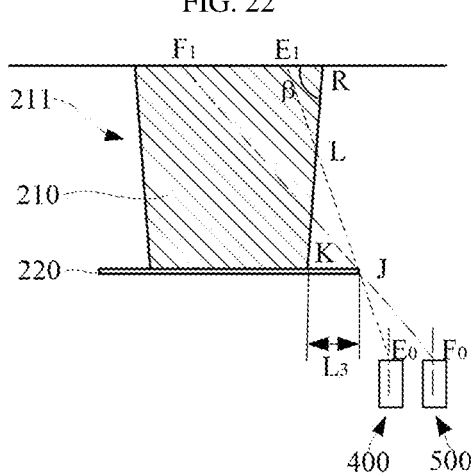
FIG. 23 is a cross-section of an auxiliary electrode according to some other embodiments of this application.
Figure 24:
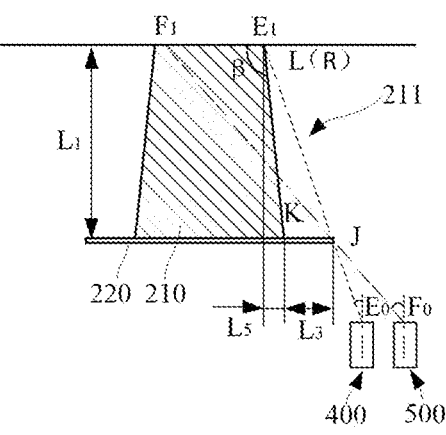
FIG. 24 is a cross-section of an auxiliary electrode according to some other embodiments of this application.
Figure 25:
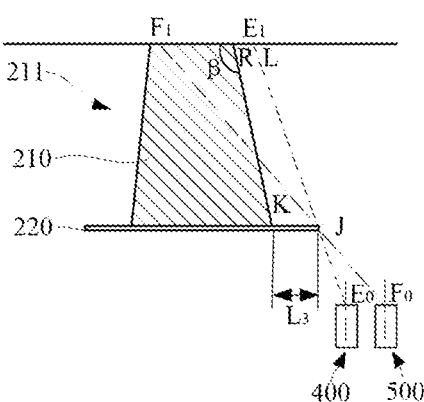
FIG. 25 is a cross-section of an auxiliary electrode according to some other embodiments of this application.

Referring to FIGS. 22 and 23, when the minimum distance $L_3$ between the edge of the second material layer 220 and the side surface of the first material layer 210 is unchanged, along with the increase of the angle $\beta$, the length KL for the lap-jointing of the cathode layer 60 and the first material layer 210 is longer. Referring to FIGS. 24 and 25, when the angle $\beta$ further increases, the length KL for the lap-jointing of the cathode layer 60 and the first material layer 210 will gradually decrease. Accordingly, the range of the angle β may be set between 60° and 160°, and the angle β within this range can lead to a sufficient length for the lap-jointing of the cathode layer 60 and the side surface of the first material layer 210, avoiding the problem of unconnection between the cathode layer 60 and the first material layer 210, thereby ensuring the function of powering on the preset region A of the cathode layer 60 through the auxiliary electrode 60.

Referring to FIG. 24, when the evaporation path $E_0E_1$ of the organic evaporation source 400 intersects with the edge of the bottom surface of the first material layer 210, that is, when the point L and the point R coincide, the length KL for the lap-jointing of the cathode layer 60 and the first material layer 210 is maximum. At this point, the angle β satisfies the following equation:

$$\beta = \pi - \arcsin L_1 / [(L_1 \tan E_0 - L_3)^2 + L_1^2]^{1/2} \qquad (5).$$

Equation (5) is explained in detail below. Since the second material layer 220 has a small thickness, the thickness of the second material layer 220 is ignored herein. Referring to FIG. 24, $L_1$ is the thickness of the first material layer 210, $L_3$ is the distance between the edge of the top surface of the first material layer 210 and the side surface of the second material layer 220, $L_5$ is the distance between the edge of the top surface of the first material layer 210 and the edge of the bottom surface thereof, the angle $E_0$ is an evaporation angle of the organic evaporation source 400, obtaining:

$$\frac{\sin E_0}{L_3 + L_5} = \frac{\sin\left(\frac{\pi}{2} - E_0\right)}{L_1}. \qquad (6)$$

From Equation (6), it is obtained:

$$L_5 = \frac{L_1 \sin E_0}{\sin\left(\frac{\pi}{2} - E_0\right)} - L_3 = \frac{L_1 \sin E_0}{\cos E_0} - L_3 = L_1 \tan E_0 - L_3. \qquad (7)$$

Referring to FIG. 24 continuously, it is obtained:

$$\frac{\sin(\pi - \beta)}{L_1} = \frac{\sin\frac{\pi}{2}}{\left(L_5^2 + L_1^2\right)^{1/2}}. \qquad (8)$$

From Equation (8), it is obtained:

$$\sin(\pi - \beta) = \frac{L_1}{\left(L_5^2 + L_1^2\right)^{1/2}}. \qquad (9)$$

From Equation (7) and Equation (9), Formula (5) is obtained.

Figure 26:
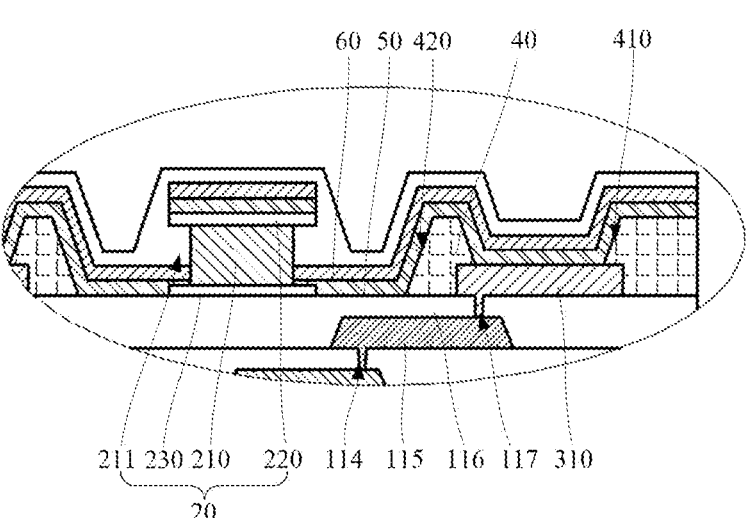
FIG. 26 is a partial enlarged view for the position of C according to some other embodiments of this application.

Exemplarily, referring to FIG. 26, the angle β between the bottom surface of the first material layer and the side surface of the first material layer may be equal to 90°. That is, the first material layer 210 may have a rectangular cross-section.

Figures 27, 28:
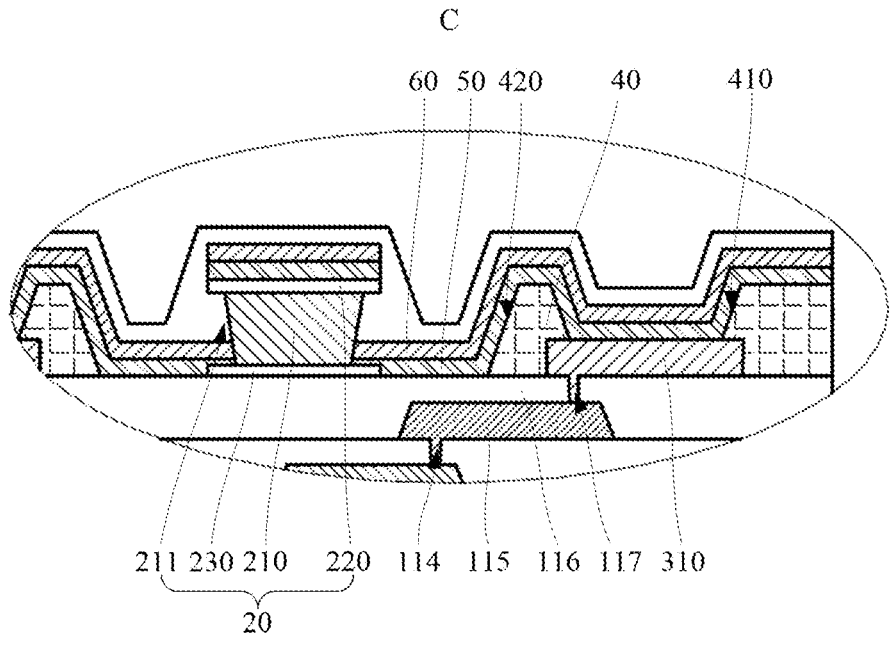
FIG. 27 is a partial enlarged view for the position of C according to some other embodiments of this application.
FIG. 28 is a partial enlarged view for the position of C according to some other embodiments of this application.

Exemplarily, referring to FIG. 27, the angle β between the bottom surface of the first material layer and the side surface of the first material layer may be greater than 90°. That is, the first material layer 210 may have an inverted trapezoidal cross-section.

Referring to FIG. 28, the display panel may further include at least one first etching auxiliary block 240, the first etching auxiliary block 240 is located between the auxiliary electrode 20 and the array substrate 10. The orthographic projection of the first etching auxiliary block 240 onto the array substrate 10 covers the orthographic projection of the auxiliary electrode 20 onto the array substrate 10. Exemplarily, when the auxiliary electrode 20 is formed during the production process of the display panel, a dry etching method is generally used, that is, a method of etching the auxiliary electrode layer using plasma is used. After the plasma etches the auxiliary electrode layer to form the auxiliary electrode 20, the first etching auxiliary block 240 can reflect the plasma so that the plasma is in contact with a portion of the auxiliary electrode 20 close to the first etching auxiliary block 240 to etch the portion of the auxiliary electrode 20 close to the first etching auxiliary block 240 again, therefore the angle β in the auxiliary electrode 20 in subsequent process steps is between 60° and 160°. In the process of forming the auxiliary electrode 20 by dry etching, different angles β can be obtained by controlling etching parameters such as an amount of the plasma and etching time, which will not be repeated in embodiments of this application.

Exemplarily, the material of the first etching auxiliary block 240 may be an inorganic material, and the inorganic material has strong etching resistance during dry etching, which can avoid being etched by plasma. The inorganic material can include at least one of silicon oxide, silicon nitride, silicon oxynitride, and indium tin oxide.

Figure 29:
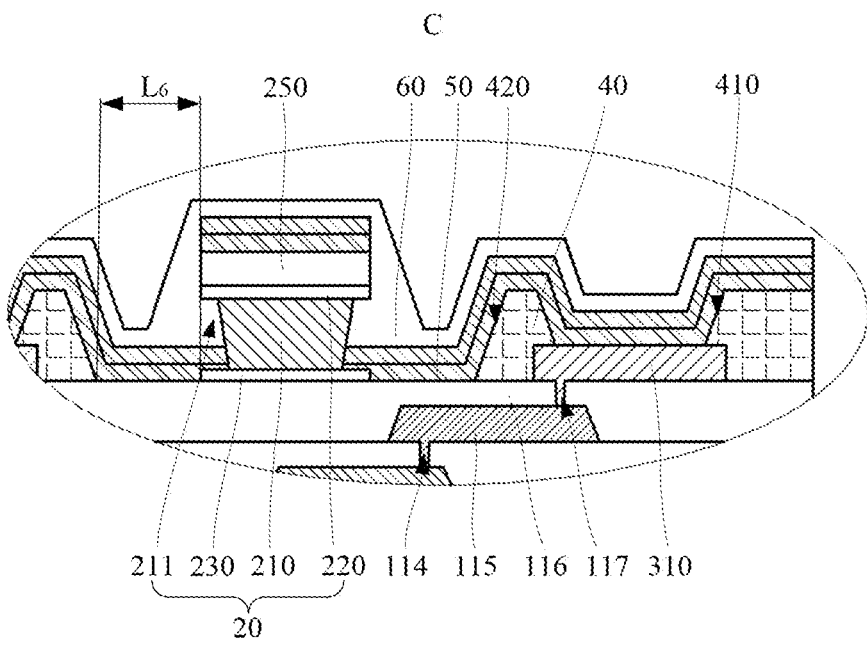
FIG. 29 is a partial enlarged view for the position of C according to some other embodiments of this application.

Referring to FIG. 29, the display panel may further include at least one second etching auxiliary block 250, the second etching auxiliary block 250 is located between the auxiliary electrode 20 and the organic functional layer 50. The orthographic projection of the second etching auxiliary block 250 onto the array substrate 10 covers the orthographic projection of the auxiliary electrode 20 onto the array substrate 10. When the auxiliary electrode 20 is formed by dry etching, the second etching auxiliary block 250 has strong etching resistance to the plasma, which can reduce the etching amount of a portion of the auxiliary electrode 20 close to the organic functional layer 50, so that the angle β of the auxiliary electrode 20 in subsequent process steps can be between 60° and 160°. Specifically, different angles β can be obtained by controlling etching parameters such as the amount of plasma and etching time in the dry etching, which will not be repeated in embodiments of this application. Exemplarily, the material of the second etching auxiliary block 250 may include at least one of silicon oxide, silicon nitride, silicon oxynitride, and indium tin oxide.

Figure 30:
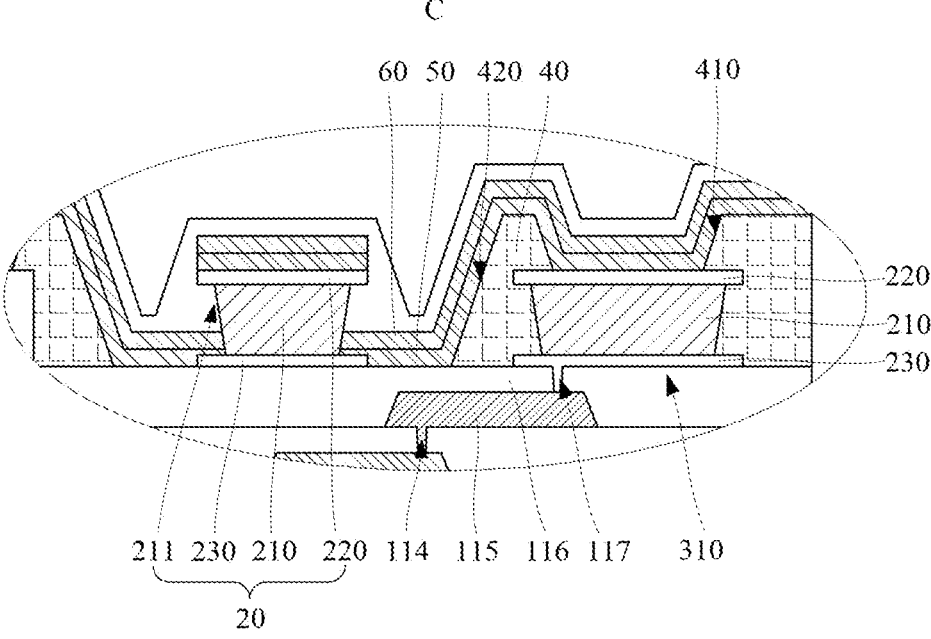
FIG. 30 is a partial enlarged view for the position of C according to some other embodiments of this application.

Exemplarily, the auxiliary electrode 20 and the anode 310 may also be provided in a same layer, that is, the material of the auxiliary electrode 20 may also be the same as the material of the anode 310. Referring to FIG. 30, the material of the auxiliary electrode 20 may include a third material layer 230, a first material layer 210, and a second material layer 220 stacked sequentially along the normal direction of the plane in which the array substrate lies. The material of the first material layer 210 may include at least one of silver (Ag), aluminum (Al) and neodymium (Nd), the material of the second material layer 220 may include at least one of indium tin oxide (ITO) and indium zinc oxide (IZO), and the material of the third material layer 230 may include at least one of silver (Ag), aluminum (Al), neodymium (Nd), indium tin oxide (ITO), and indium zinc oxide (IZO). Since the material of the auxiliary electrode 20 is the same as the material of the anode 310, the auxiliary electrode 20 and the anode 310 can be formed simultaneously in one patterning processing step, thereby reducing the number of processing steps and improving the production efficiency of the display panel.

Referring to FIG. 3, FIG. 4, FIG. 28, FIG. 29 or FIG. 30, the display panel further includes a pixel definition layer 40. The pixel definition layer 40 is also provided with a first lap-jointing opening 420, the top surface of the auxiliary electrode 20 and the top surface of the array substrate 10 are exposed from the first lap-jointing opening 420, that is, the orthographic projection of the auxiliary electrode 20 onto the array substrate 10 does not overlap with the orthographic projection of the pixel definition layer 40 onto the array substrate 10. The organic functional layer 50 covers the pixel definition layer 40, and covers the top surface of the anode 310 within the pixel opening 410. The organic functional layer 50 further covers the top surface of the array substrate 10 and the top surface of the auxiliary electrode 20 within the first lap-jointing opening 420. Exemplarily, the organic functional layer 50 and the cathode layer 60 located above the organic functional layer 50 may be lap-jointed with the side surface of the auxiliary electrode 20 in the recessed part 211.

Exemplarily, referring to FIG. 3, the first lap jointing opening 420 includes a side surface facing the auxiliary electrode 20, and a bottom surface intersecting the side surface of the first lap-jointing opening 420. The angle α between the side surface of the first lap-jointing opening 420 and the bottom surface of the first lap-jointing opening 420 may be an obtuse angle, which can increase the opening size of the first lap-jointing opening 420. Therefore, in the process of covering the pixel definition layer 40 and the auxiliary electrode 20 by the organic functional layer 50, the organic functional layer 50 and the cathode layer 60 are able to enter a space between the auxiliary electrode 20 and the pixel definition layer 40 through the first lap-jointing opening 420, and are deposited on the array substrate 10, and are lap-jointed with the recessed part 211. Exemplarily, the angle α between the side surface of the first lap-jointing opening 420 and the bottom surface of the first lap-jointing opening 420 may be greater than 140°. For example, the angle may be 145° or 150° and the like.

Exemplarily, referring to FIG. 3, the distance $L_6$ between the edge of the bottom surface of the first lap-jointing opening 420 and the edge of the bottom surface of the auxiliary electrode 20 may be greater than or equal to 3 μm, for example, 3 μm, 4 μm, or 5 μm. When the organic functional layer 50 and the cathode layer 60 are formed, the distance $L_6$ within this range can avoid the pixel definition layer 40 from blocking the organic functional layer 50 and the cathode layer 60, so it is easy for the organic functional layer 50 and the cathode layer 60 to enter the space between the auxiliary electrode 20 and the pixel definition layer 40 through the first lap jointing opening 420, and are deposited on the array substrate 10, and are lap-jointed with the recessed part 211.

Figure 31:
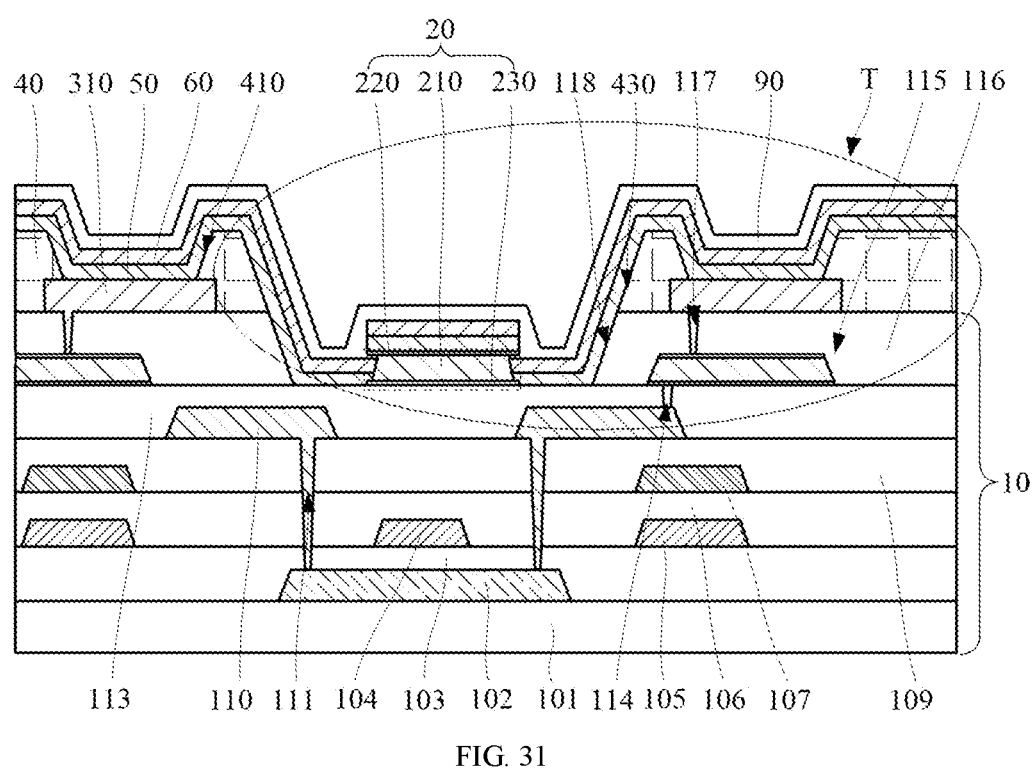
FIG. 31 is a schematic diagram of a cross-sectional structure along the B-B direction according to some other embodiments of this application.

In other possible implementations of embodiments in this application, the auxiliary electrode 20 may be disposed in the array substrate 10, and the auxiliary electrode 20 is electrically insulated from the anode 310. Exemplarily, referring to FIG. 31 and FIG. 32, both of the auxiliary electrode 20 and the first conductive layer may be disposed on the first insulating layer 113. A second lap-jointing opening 118 is disposed on the second insulating layer 116, the auxiliary electrode 20 and the first insulating layer 113 are exposed from the second lap jointing opening 118. The anode 310 is disposed on the second insulating layer 116.

The auxiliary electrode 20 and the first conductive layer may be provided on the same layer or on different layers. That is, the material of the auxiliary electrode 20 may be same as or may be different from the material of the first conductive layer. When the material of the auxiliary electrode 20 is the same as the material of the first conductive layer, in the process of producing the display panel, the structures such as the auxiliary electrode 20 and the connecting wire 115 in the first conductive layer can be formed through a same patterning processing step, which reduces the number of processing steps and improves the production efficiency of the display panel.

Figure 32:
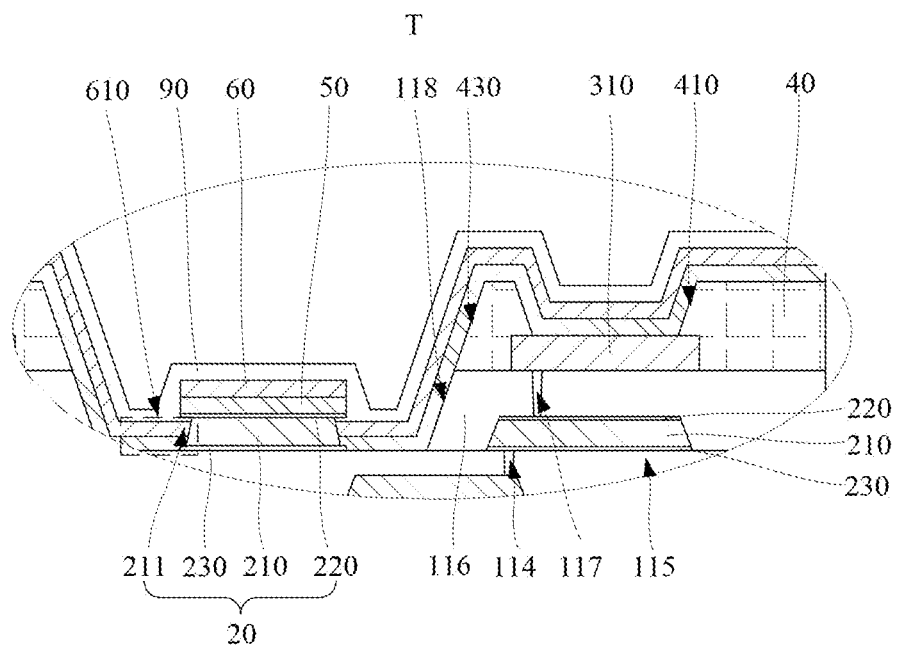
FIG. 32 is a partial enlarged view for the position of T in FIG. 31.

Exemplarily, the auxiliary electrode 20 and the first conductive layer may further include at least a first material layer 210 and a second material layer 220 stacked along the normal direction of the plane in which the array substrate 10 lies. The etching rate of the material of the first material layer 210 is greater than the etching rate of the material of the second material layer 220, and the bottom surface of the second material layer 220 is surrounded with the side surface of the first material layer 210 to form the recessed part 211. For example, each of the auxiliary electrode 20 and the first conductive layer may include a first material layer 210 and a second material layer 220 stacked sequentially along the normal direction of the plane in which the array substrate 10 lies. Alternatively, as shown in FIG. 32, each of the auxiliary electrode 20 and the first conductive layer may include a third material layer 230, a first material layer 210, and a second material layer 220 stacked sequentially along the normal direction of the plane in which the array substrate 10 lies. The first material layer 210, the second material layer 220, and the third material layer 230 may include at least one of molybdenum, titanium, aluminum, copper, silver, indium tin oxide, and silver zinc oxide.

Exemplarily, the first insulating layer 113 may also be an inorganic insulating layer. Exemplarily, the material of the inorganic insulating layer may include at least one of silicon oxide, silicon nitride, and silicon oxynitride. When the auxiliary electrode 20 is formed by dry etching, the inorganic insulating layer can reflect plasma so that the plasma is in contact with the portion of the auxiliary electrode 20 close to the inorganic insulating layer. Therefore, the portion of the auxiliary electrode 20 close to the inorganic insulating layer is etched, so that the angle β of the auxiliary electrode 20 in subsequent processing steps can be between 60° and 160°.

Figure 33:
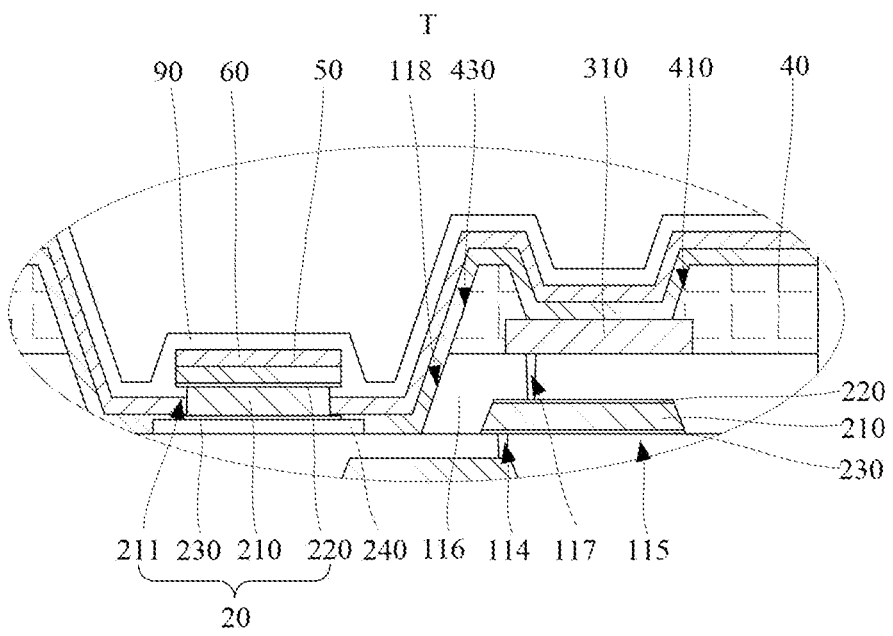
FIG. 33 is a partial enlarged view for the position of T according to some other embodiments of this application.

Exemplarily, referring to FIG. 33, the display panel may further include at least one first etching auxiliary block 240, and the first etching auxiliary block 240 is located between the auxiliary electrode 20 and the first insulating layer 113. The orthographic projection of the first etching auxiliary block 240 onto the base 101 covers the orthographic projection of the auxiliary electrode 20 onto the base. When the auxiliary electrode 20 is formed by dry etching, the first etching auxiliary block 240 can reflect plasma so that the plasma is in contact with the portion of the auxiliary electrode 20 close to the first etching auxiliary block 240. Therefore, the portion of the auxiliary electrode 20 close to the first etching auxiliary block 240 is etched, so that the angle β of the auxiliary electrode 20 in subsequent processing steps is between 60° and 160°. Exemplarily, the material of the first etching auxiliary block 240 may be an inorganic material. The inorganic material can include at least one of silicon oxide, silicon nitride, silicon oxynitride, and indium tin oxide.

Figure 34:
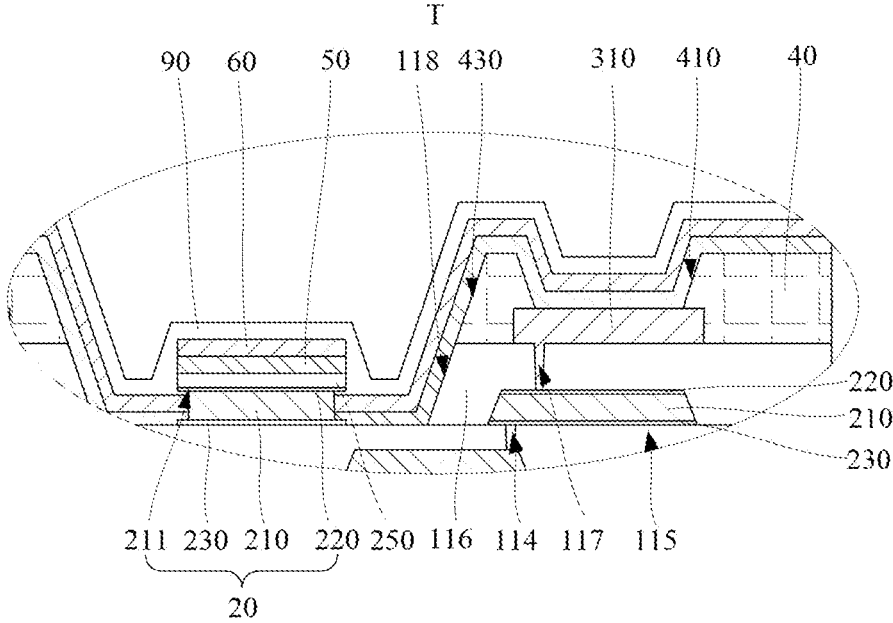
FIG. 34 is a partial enlarged view for the position of T according to some other embodiments of this application.

Exemplarily, referring to FIG. 34, the display panel further includes at least one second etching auxiliary block 250, and the second etching auxiliary block 250 is located between the auxiliary electrode 20 and the organic functional layer 50. The orthographic projection of the second etching auxiliary block 250 onto the array substrate 10 covers the orthographic projection of the auxiliary electrode 20 onto the array substrate 10. When the auxiliary electrode 20 is formed by dry etching, the second etching auxiliary block 250 has a strong etching resistance to plasma, which can reduce the etching amount of the portion of the auxiliary electrode 20 close to the organic functional layer 50, so that the angle β of the auxiliary electrode 20 in subsequent processing steps is between 60° and 160°. Exemplarily, the material of the second etching auxiliary block 250 may include at least one of silicon oxide, silicon nitride, silicon oxynitride, and indium tin oxide.

Referring to FIGS. 31 to 34, the display panel may further include a pixel definition layer 40, the pixel definition layer 40 is disposed on the second insulating layer 116, and the pixel definition layer 40 covers the anode 310 and the surface of the second insulating layer 116 which is not covered by the anode 310. The pixel definition layer 40 is further provided with a third lap-jointing opening 430, and the third lap-jointing opening 430 is interconnected to the second lap-jointing opening 118 to expose the auxiliary electrode 20 and the first insulating layer 113. The organic functional layer 50 covers the pixel definition layer 40, and covers the top surface of the anode 310 within the pixel opening 410. The organic functional layer 50 further covers the top surface of the first insulating layer 113 and the top surface of the auxiliary electrode 20 within the second lap-jointing opening 118. The organic functional layer 50 and the cathode layer 60 may be lap-jointed with the side surface of the auxiliary electrode 20.

The display panel may further include a first power cord, the first power cord is connected to the auxiliary electrode 20, and the first power cord is configured to provide a power signal to the auxiliary electrode 20. Exemplarily, a voltage signal may be input to the auxiliary electrode 20 through the first power cord, thereby reducing the voltage drop of the cathode layer 60. Referring to FIG. 37, the first power cord 70 may also be disposed in the array substrate 10. For example, a first conductive layer may be included in the array substrate 10, and the first power cord 70 and the first conductive layer may be provided on the same layer. The material of the first power cord 70 may be the same as the material of the first conductive layer. The first conductive layer may further include other connecting wires, for example, a connecting wire 115 may be included in the first conductive layer, and the connecting wire 115 is configured to connect a thin-film transistor and the anode 310. The first power cord 70 and the first conductive layer may be provided in the same layer, which can increase the space of the anode layer, so that the arrangement of the anode 310 is more compact, thereby increasing the number of pixels in the display panel and improving resolution of the display panel.

Figure 35:
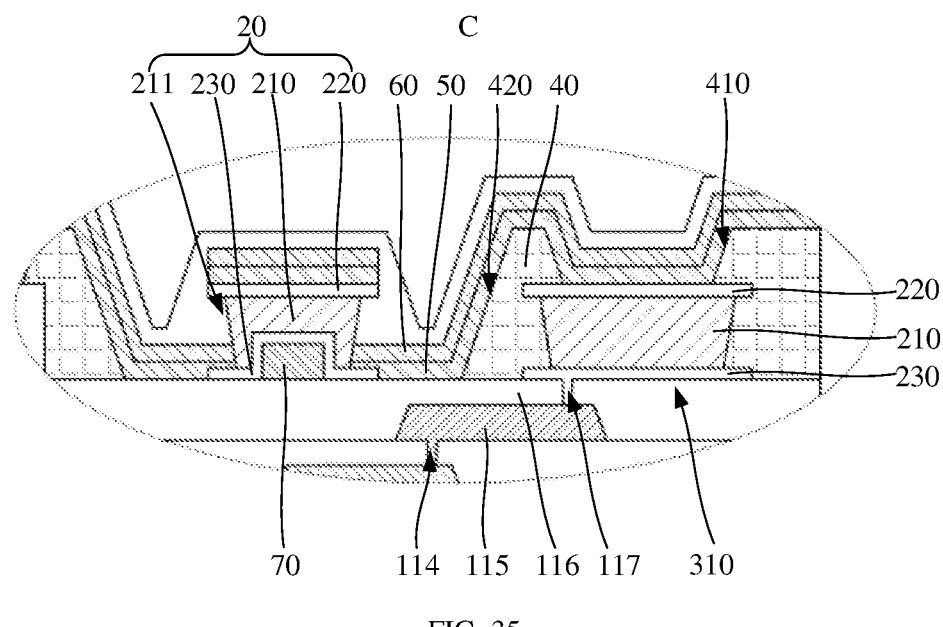
FIG. 35 is a partial enlarged view for the position of C according to some other embodiments of this application.

Exemplarily, in some other implementations of embodiments of this application, both of the first power cord 70 and the auxiliary electrode 20 may also be disposed on the array substrate 10. For example, both of the first power cord 70 and the auxiliary electrode 20 may be disposed on the second insulating layer 116. Referring to FIG. 35, the first power cord 70 and the anode 310 may be provided in different layers, that is, the material of the first power cord 70 may also be different from the material of the anode 310.

Figure 36:
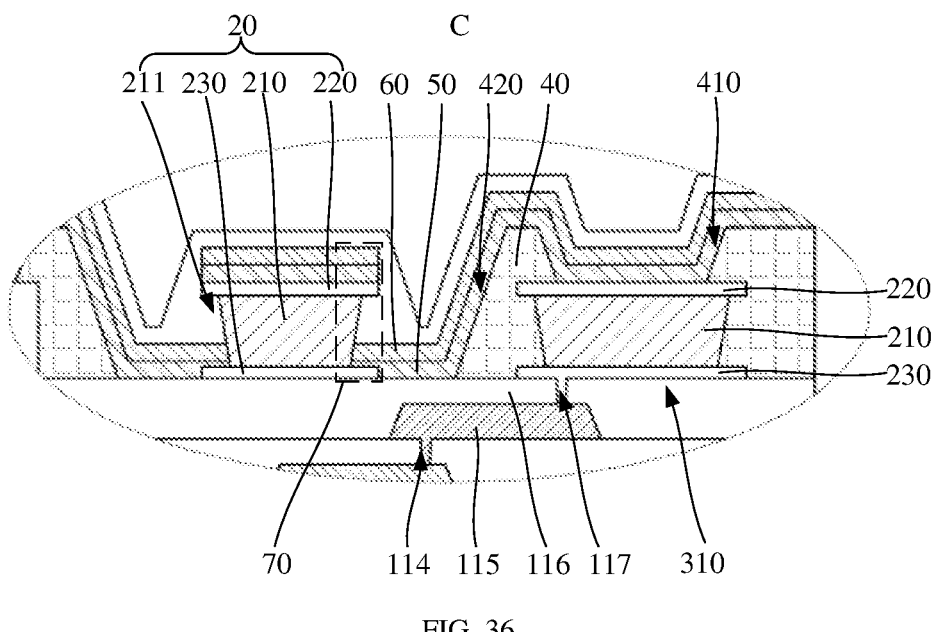
FIG. 36 is a partial enlarged view for the position of C according to some other embodiments of this application.

Referring to FIG. 36, the first power cord 70 and the anode 310 may be provided on the same layer, that is, the material of the first power cord 70 may be the same as the material of the anode 310. After the anode layer is formed, the first power cord 70 and the anode 310 can be formed simultaneously by the patterning process, and the material of the first power cord 70 may be the same as that of the anode 310 to reduce processing steps of the display panel and improve the production efficiency of the display panel.

Exemplarily, referring to FIG. 37, the first power cord 70 may also be disposed in the array substrate 10. The second insulating layer 116 of the array substrate 10 is disposed on the first conductive layer, the second insulating layer 116 is provided with a fourth via hole 119, the fourth via hole 119 is connected to the first power cord 70, and the auxiliary electrode is electrically connected to the first power cord 70 via the fourth via hole 119. When the auxiliary electrode 20 is formed, for example, when the third material layer 230 is formed, the third material layer 230 is filled in the fourth via hole 119 and is connected with the first power cord 70, thereby achieving an electrical connection between the first power cord 70 and the auxiliary electrode 20.

It is understood that the first power cord 70 may be electrically connected to the second power cord 80 to be indirectly connected with a voltage signal. The first power cord may also be not connected to the second power cord 80 to be directly connected with the voltage signal.

An embodiment of this application also provides a method for producing a display panel for forming the above display panel. Referring to FIG. 38, the method includes:

S100: providing an array substrate having an auxiliary electrode and an electrode block, where the auxiliary electrode is disposed on the array substrate or disposed in the array substrate; the auxiliary electrode includes a first material layer, and the first material layer includes a bottom surface facing the array substrate, and a side surface intersecting the bottom surface of the first material layer, an angle is formed between the bottom surface of the first material layer and the side surface of the first material layer; the angle is greater than or equal to 60° and less than or equal to 160°.

Taking the electrode block as an anode 310 as an example to illustrate the method in embodiments of this application. In some possible implementations of the embodiments of this application, both of the auxiliary electrode 20 and the electrode block may be disposed on the array substrate 10.

First, the array substrate can be provided.

Figure 39:
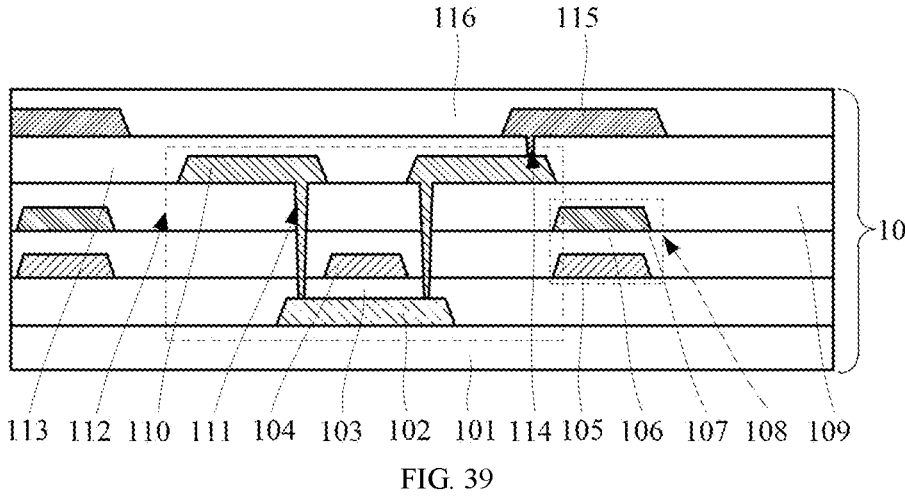
FIG. 39 is a schematic diagram of providing an array substrate.

Exemplarily, referring to FIG. 39, a base 101 may be provided firstly. The material of the base 101 may be a glass base, a quartz base, a resin base and the like. The raw material of the base 101 may also be a flexible base, such as polyimide and the like. The base 101 may also be a multi-layer structure in which an organic layer and an inorganic layer stacked alternately, such as silicon oxide, polyimide, and silicon oxide stacked sequentially, or polyimide, silicon oxide, polyimide, and silicon oxide stacked sequentially.

An active layer 102, a third insulating layer 103, a second conductive layer, a fourth insulating layer 106, a third conductive layer, a fifth insulating layer 109, a fourth conductive layer, a first insulating layer 113, a first conductive layer, and a second insulating layer 116 may be sequentially formed on the base 101. The active layer 102, the second conductive layer, the third conductive layer, the fourth conductive layer, and the first conductive layer may be patterned to form a pixel drive circuit having a plurality of thin-film transistors 112 and capacitors 108. The array substrate 10 further includes the second insulating layer 106 covering the thin-film transistor and the base 101 to improve flatness of the array substrate 10.

Exemplarily, the first power cord 70 may be disposed in the first conductive layer. The fourth via hole 119 that is connected to the first power cord 70 is disposed on the second insulating layer 116.

Then, the auxiliary electrode 20 and the anode 310 are formed on the array substrate 10, and the auxiliary electrode 20 is electrically insulated from the anode 310. A recessed part 211 may also be formed at the side surface of the auxiliary electrode 20.

Figure 40:
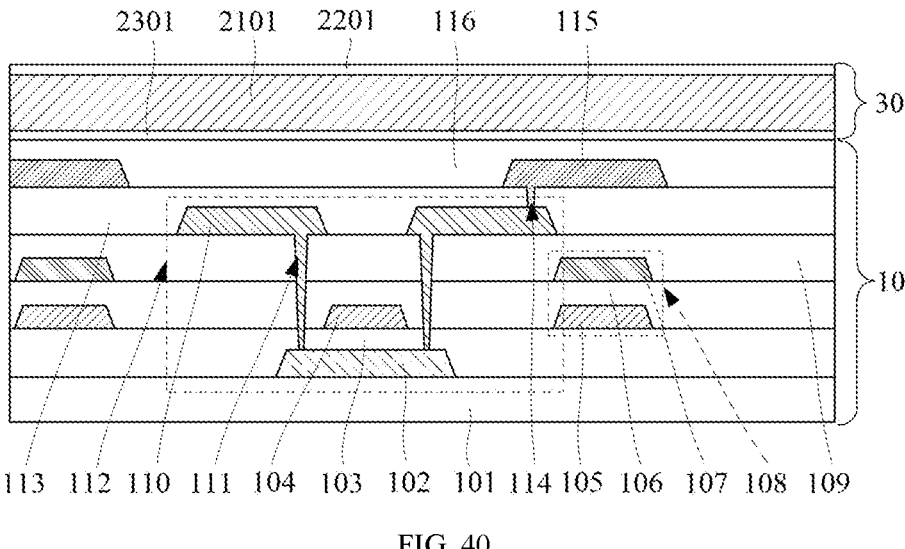
FIG. 40 is a schematic diagram of forming an anode layer on an array substrate according to some embodiments of this application.

Exemplarily, the auxiliary electrode 20 and the anode 310 may be formed by a same patterning processing step. Referring to FIG. 40, firstly, the anode layer 30 may be formed on the array substrate 10. An anode layer 30 is formed on the second insulating layer 116. Exemplarily, the anode layer 30 includes a third material film layer 2301, a first material film layer 2101, and a second material film layer 2201 stacked sequentially along the normal direction of the plane in which the array substrate 10 lies. The third material film layer 2301, the first material film layer 2101, and the second material film layer 2201 can be formed sequentially on the array substrate 10. The material of the first material film layer 2101 has an etching rate greater than the material of the second material film layer 2201. Exemplarily, the material of the first material layer 210 may be silver, and the materials of the second material layer 220 and the third material layer 230 may be indium tin oxide.

Figures 41, 42:
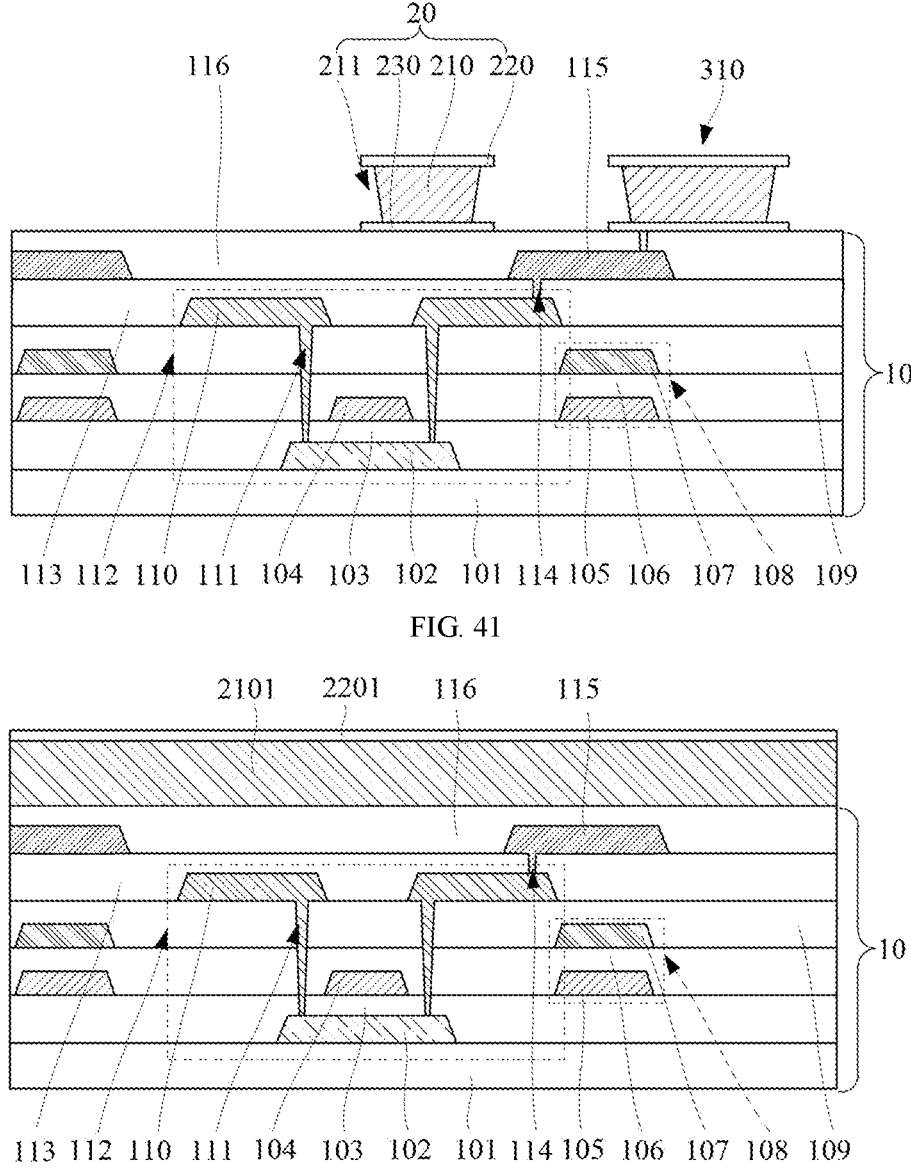
FIG. 41 is a schematic diagram of forming an auxiliary electrode and an anode by patterning an anode layer.
FIG. 42 is a schematic diagram of forming an auxiliary electrode layer on an array substrate according to some embodiments of this application.

Referring to FIG. 41, the anode layer 30 is patterned to form the auxiliary electrode 20 and a plurality of anodes 310 electrically insulated from each other. The recessed part 211 may also be formed at the side surface of the auxiliary electrode 20. Exemplarily, the anode layer 30 may be patterned by wet etching.

In a process of performing wet etching on the anode layer 30, the material of the first material layer 210 includes at least one of silver, aluminum, and neodymium, the material of the second material layer 220 includes at least one of indium tin oxide and indium zinc oxide, and the material of the third material layer 230 includes at least one of silver, aluminum, neodymium, indium tin oxide and indium zinc oxide. Galvanic cell corrosion is occurred between the first material layer 210 and the second material layer 220, and between the first material layer 210 and the third material layer 230 under the action of an etching solution. The side surface of the first material layer 210 is etched, thereby forming the recessed part 211 at the side surface of the first material layer 210.

Further, since in the process of wet etching, the top of the anode layer 30 will be covered with a photoresist, the update efficiency of the etching solution in an area of the first material layer 210 close to the second material layer 220 is slowed down due to the blocking of the photoresist, so that a portion of the first material layer 210 close the second material layer 220 has an etching amount less than a portion of the first material layer 210 away from the second material layer 220. Therefore, the angle between the bottom surface of the auxiliary electrode 20 and the side surface of the auxiliary electrode 20 is increased, so that in subsequent processing steps, the angle β of the auxiliary electrode 20 is between 60° and 160° to ensure that the organic functional layer 50 and the cathode layer 60 subsequently formed can form a lap-jointing part with the side surface of the auxiliary electrode 20 within the recessed part 211 by lap-jointing with the side surface of the auxiliary electrode 20. Specifically, the angle β can be controlled by controlling etching parameters such as a concentration of the etching solution and etching time, which will not be repeated in embodiments of this application.

Optionally, the auxiliary electrode 20 and the anode 310 may also be formed by different patterning processing steps. Firstly, an auxiliary electrode layer may be formed on the array substrate 10, and the auxiliary electrode layer may be patterned to form the auxiliary electrode 20.

Exemplarily, the auxiliary electrode layer may be a conductive metal layer, and the conductive metal layer may be formed on the array substrate 10. The conductive metal layer is then patterned and laterally etched to form the auxiliary electrode 20 having the recessed part 211 at the side surface of the auxiliary electrode 20.

Optionally, referring to FIG. 42, the auxiliary electrode layer may further include a first material film layer 2101 and a second material film layer 2201. The first material film layer 2101 and the second material film layer 2201 may be formed sequentially on the array substrate 10. The material of the first material film layer 2101 has an etching rate greater than that of the material of the second material film layer 2201. The first material film layer 2101 may be a first metal layer, and the second material film layer 2201 may be a second metal layer.

Figures 43, 44:
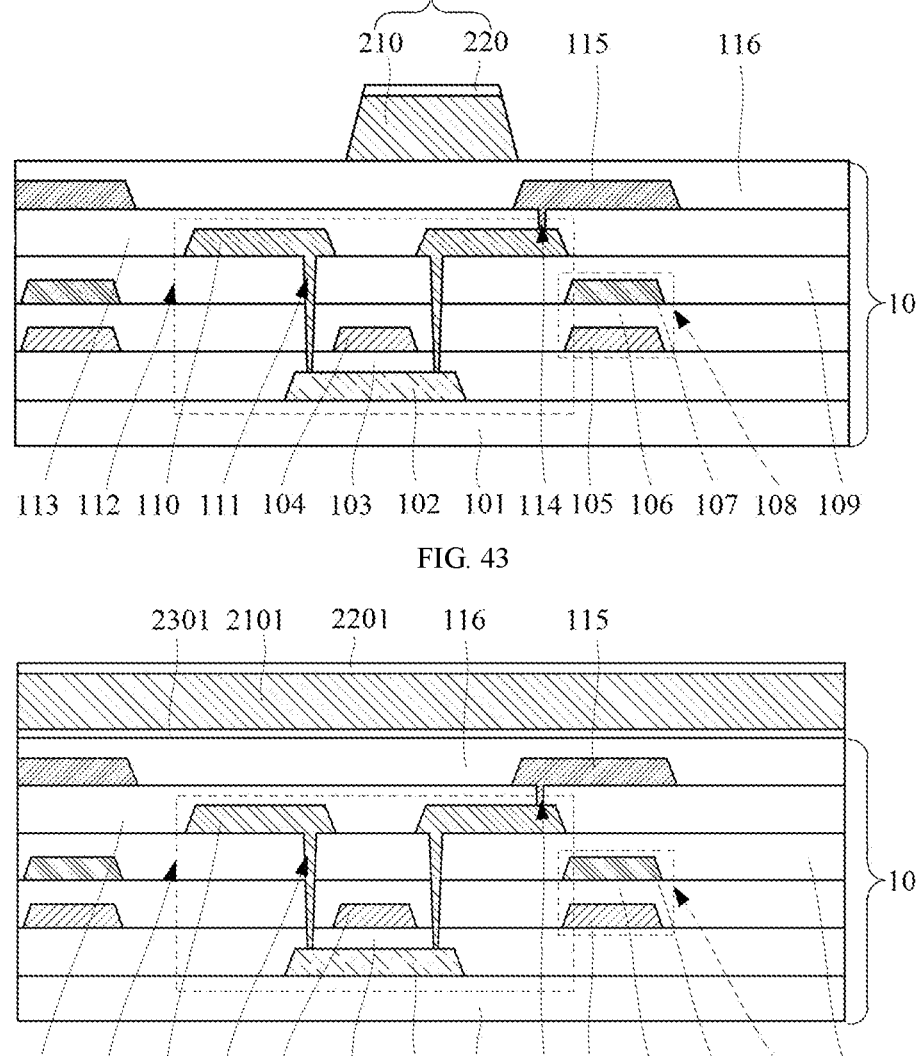
FIG. 43 is a schematic diagram of forming an auxiliary electrode by patterning an auxiliary electrode layer.
FIG. 44 is a schematic diagram of forming an auxiliary electrode layer on an array substrate according to some other embodiments of this application.

Then, referring to FIG. 43, the first material film layer 2101 and the second material film layer 2201, which are stacked, are patterned to form the auxiliary electrode 20. The auxiliary electrode 20 includes the first material layer 210 and the second material layer 220, which are stacked sequentially along the normal direction of a plane in which the array substrate 10 lies.

Optionally, referring to FIG. 44, the auxiliary electrode layer may further include a third material film layer 2301, a first material film layer 2101, and a second material film layer 2201. The third material film layer 2301, the first material coating 2101, and the second material coating 2201 may be formed sequentially on the array substrate 10. The material of the first material film layer 2101 may have an etching rate greater than that of the material of the second material film layer 2201. The first material film layer 2101 may be a first metal layer, the second material film layer 2201 may be a second metal layer, and the third material film layer 2301 may be a third metal layer. For example, the material of the third metal layer may be titanium (Ti), the material of the first metal layer may be aluminum (Al), and the material of the second metal layer may be titanium (Ti) or molybdenum (Mo).

Figure 45:
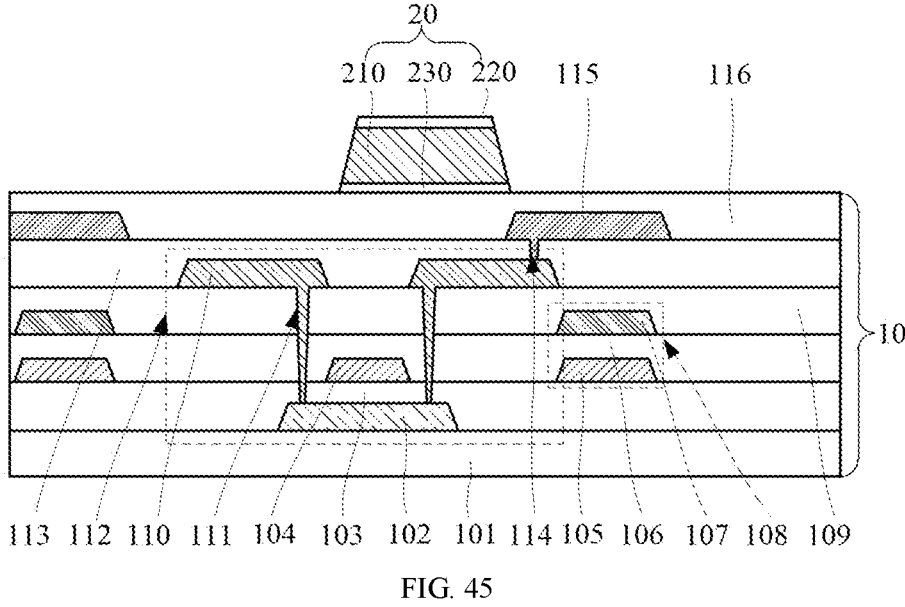
FIG. 45 is a schematic diagram of forming an auxiliary electrode by patterning an auxiliary electrode layer.

Referring to FIG. 45, the third material film layer 2301, the first material film layer 2101 and the second material film layer 2201, which are stacked, are patterned to form the auxiliary electrode 20. The auxiliary electrode 20 includes the third material layer 230, the first material layer 210, and the second material layer 220, which are stacked sequentially along the normal direction of the plane in which the array substrate 10 lies.

When the first power cord 70 is located in the first conductive layer of the array substrate 10, and the third material layer 230 is a third metal layer, the third metal layer may be filled in the fourth via hole 119 so that the third metal layer is connected with the first power cord 70.

Then, the first electrode layer 3 is formed on the array substrate 10, the first electrode layer 3 covers the auxiliary electrode 20 and the surface of the array substrate 10 which is not covered by the auxiliary electrode 20. The first electrode layer 3 is patterned to form at least one electrode block 31 which is electrically insulated from the auxiliary electrode 20, and to form a recessed part at the side surface of the auxiliary electrode 20. The following takes the first electrode layer 3 as an anode layer 30 for example to illustrate.

Figure 46:
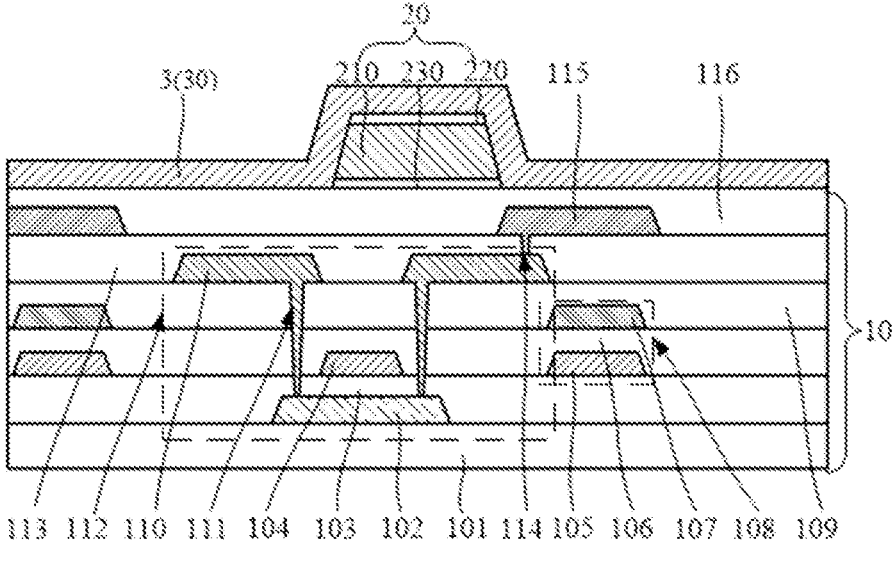
FIG. 46 is a schematic diagram of forming an anode layer.

Referring to FIG. 46, the anode layer 30 may be formed on the array substrate 10, and the anode layer 30 covers the array substrate 10 and the auxiliary electrode 20. For example, the material of the anode layer 30 may be indium tin oxide/silver/indium tin oxide (ITO/AG/ITO) and the like.

Figures 47, 48:
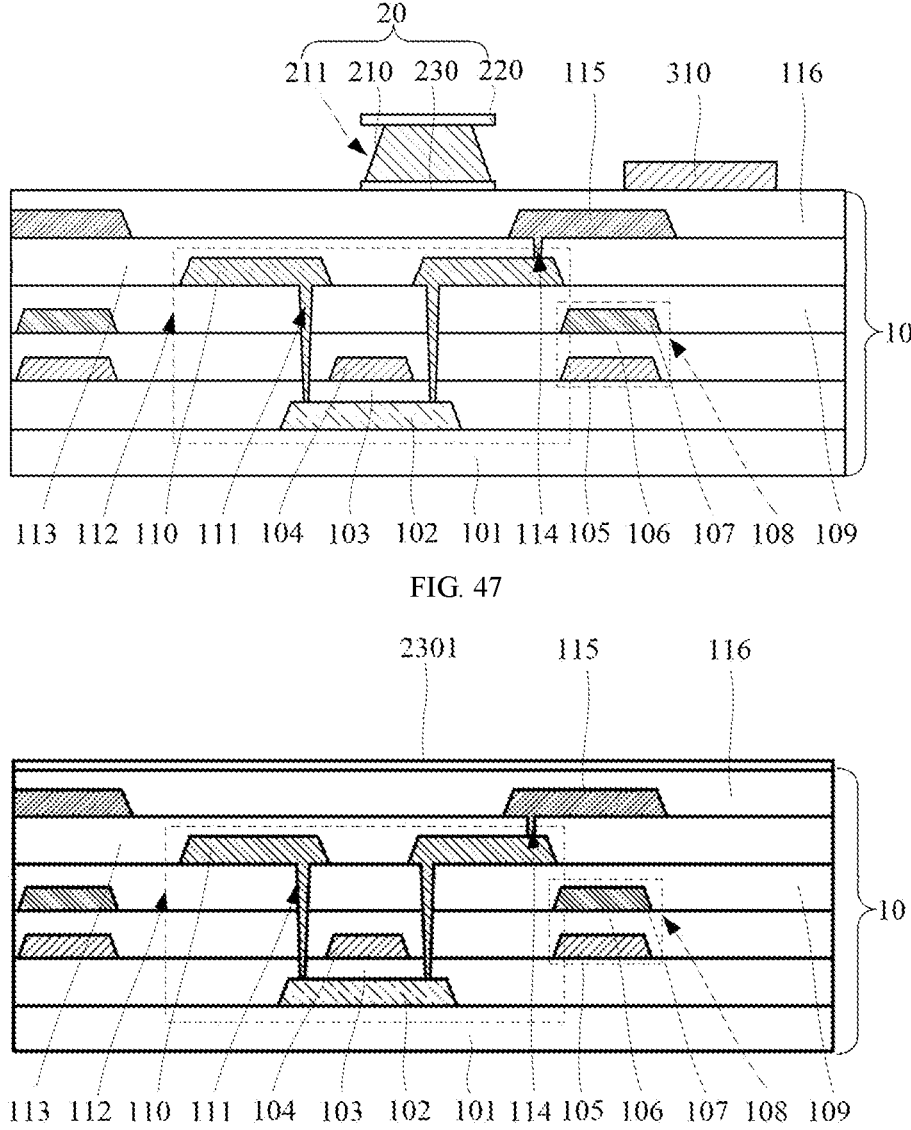
FIG. 47 is a schematic diagram of forming an anode by patterning an anode layer.
FIG. 48 is a schematic diagram of forming a third material film layer on an array substrate.

Referring to FIG. 47, after the anode layer 30 is formed, the anode layer 30 may be etched in a patterning manner to form at least one anode 310 which is electrically insulated from the auxiliary electrode 20. Exemplarily, the at least one anode 310 may be a plurality of anodes 310. When the anode layer 30 is etched, the side surface of the auxiliary electrode 20 may also be etched simultaneously to form the recessed part 211, thereby saving processing steps and improving the production efficiency of the display panel. Exemplarily, the anode layer 30 may be etched by wet etching. In the etching process, when the anode layer 30 covering the auxiliary electrode 20 is etched, the side surface of the auxiliary electrode 20 can be etched due to the isotropy of wet etching. In addition, because the material of the first material layer 210 has an etching rate greater than the material of the second material layer 220 in the auxiliary electrode layer, the side surface of the first material layer 210 has an etching amount greater than the side surface of the second material layer 220, so that the bottom surface of the second material layer 220 can be surrounded with the side surface of the first material layer 210 to form the recessed part 211, thereby forming the auxiliary electrode having the recessed part 211 at the side surface of the auxiliary electrode 20.

In some other implementations of embodiments of this application, the first power cord 70 may also be disposed in the anode layer 30. Exemplarily, when etching the anode layer 30, the first power cord 70 spaced away from the anode 311 may be formed simultaneously by a patterning process, and the first power cord 70 is connected with the auxiliary electrode 20. The material of the first power cord 70 may be the same as that of the anode 310, so as to reduce processing steps of the display panel and improve the production efficiency of the display panel.

In some other implementations of embodiments of this application, referring to FIG. 48, the third material film layer 2301 may also be firstly formed on the array substrate and the third material film layer 2301 may be an inorganic layer.

Figure 49:
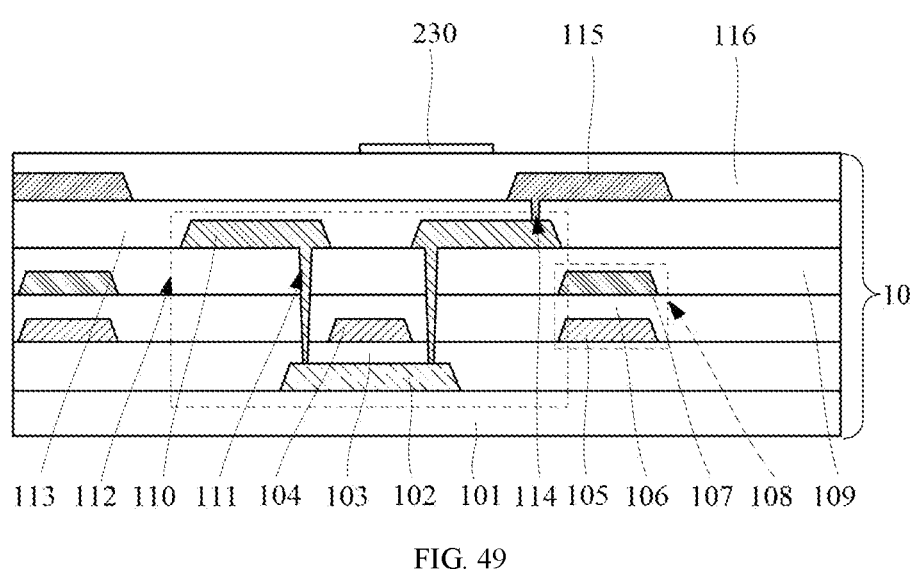
FIG. 49 is a schematic diagram of forming a third material layer by patterning a third material film layer.

Referring to FIG. 49, then, the inorganic layer is patterned to form the third material layer 230.

Figure 50:
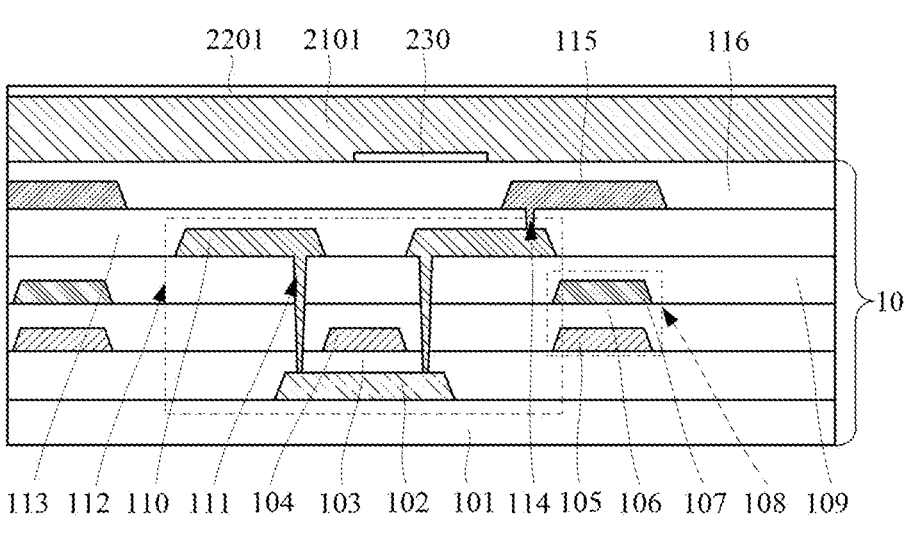
FIG. 50 is a schematic diagram of forming a first material film layer and a second material film layer.

Referring to FIG. 50, when the first material film layer 2101 is formed, the first material film layer 2101 covers the third material layer 230 and the surface of the array substrate 10 which is not covered by the third material layer 230. The second material film layer 2201 is formed on the first material film layer 2101.

Figure 51:
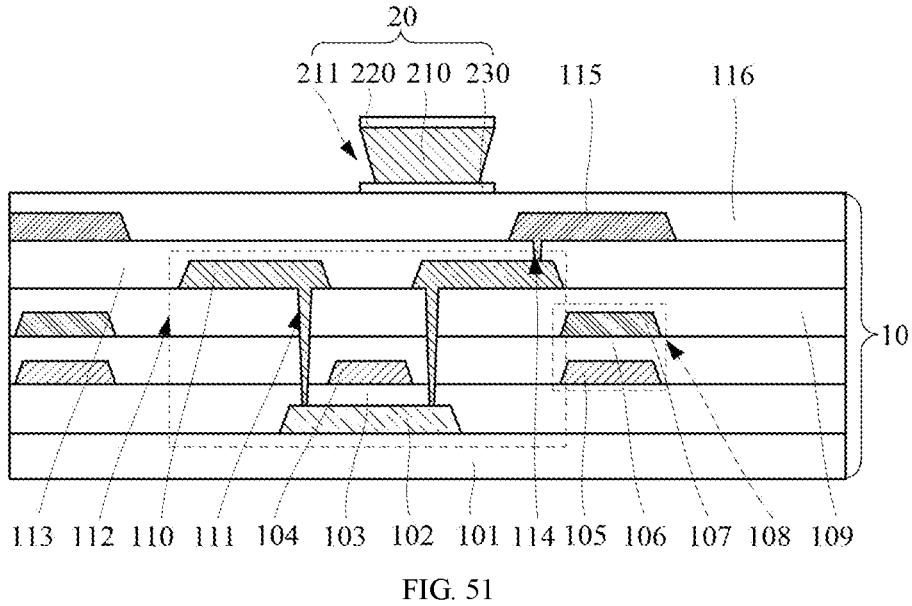
FIG. 51 is a schematic diagram of forming a first material layer and a second material layer by patterning a first material film layer and a second material film layer.

Referring to FIG. 51, the first material film layer 2101 and the second material film layer 2201 are patterned to form the first material layer 210 and the second material layer 220 on the third material layer 230. The auxiliary electrode 20 includes the third material layer 230, the first material layer 210, and the second material layer 220, which are stacked.

Exemplarily, the first material film layer 2101 and the second material film layer 2201 may be patterned by dry etching, that is, the first material film layer 2101 and the second material film layer 2201 are etched by plasma. In the process of dry etching the first material film layer 2101 and the second material film layer 2201, after the first material film layer 2101 and the second material film layer 2201 are etched by plasma to form the auxiliary electrode 20, the inorganic layer can reflect the plasma so that the plasma is in contact with the portion of the first material layer 210 close to the inorganic layer. Therefore, the portion of the first material layer 210 close to the inorganic layer can be etched to increase the angle between the bottom surface of the auxiliary electrode 20 and the side surface of the auxiliary electrode 20, so that the angle β of the auxiliary electrode 20 in subsequent processing steps can be between 60° and 160°. Specifically, different angles β can be obtained by controlling etching parameters such as the amount of plasma and etching time, which will not be repeated in embodiments of this application.

Figure 52:
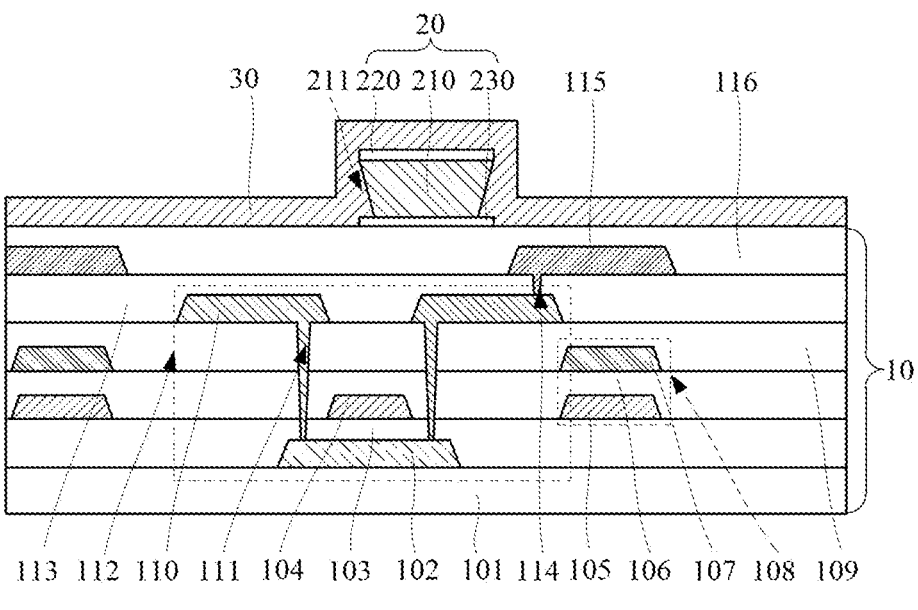
FIG. 52 is a schematic diagram of forming an anode layer.
Figure 53:
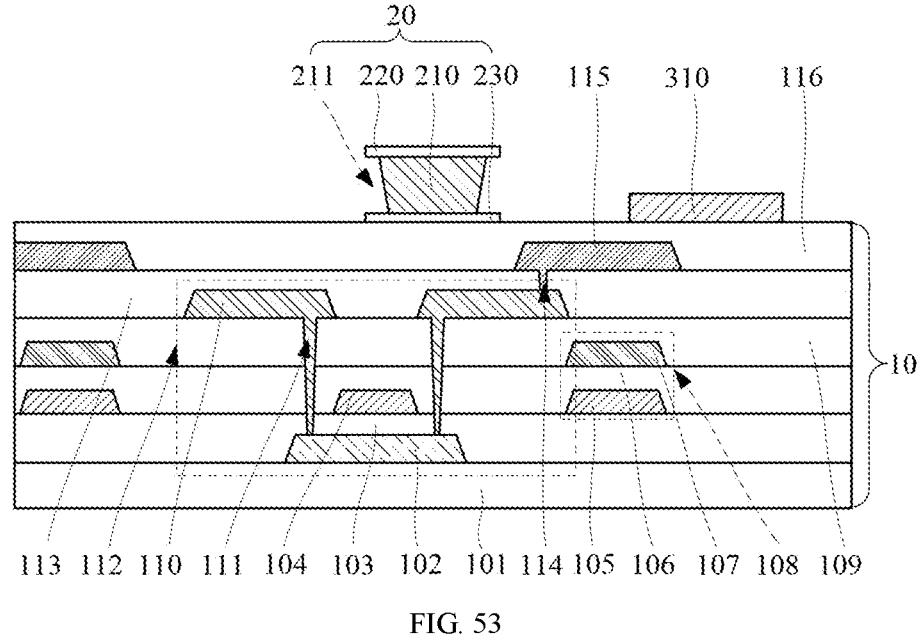
FIG. 53 is a schematic diagram of forming an anode by patterning an anode layer.

Then, referring to FIGS. 52 and 53, when the anode layer 30 is formed, the anode layer 30 covers the auxiliary electrode 20, and covers the surface of the array substrate 10 which is not covered by the auxiliary electrode 20. After the anode layer 30 is formed, the anode layer 30 may be patterned by wet etching to form at least one anode 310 which is electrically insulated from the auxiliary electrode 20. When etching the anode layer 30, the side surface of the first material layer 210 may also be etched simultaneously to form the recessed part 211.

Figure 54:
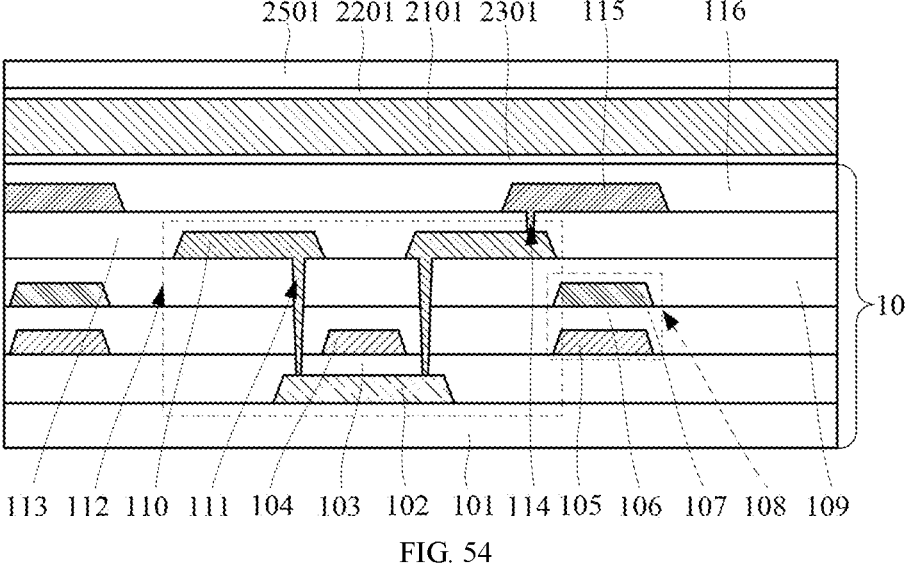
FIG. 54 is a schematic diagram of forming a second etching auxiliary layer on an auxiliary electrode layer.
Figure 55:
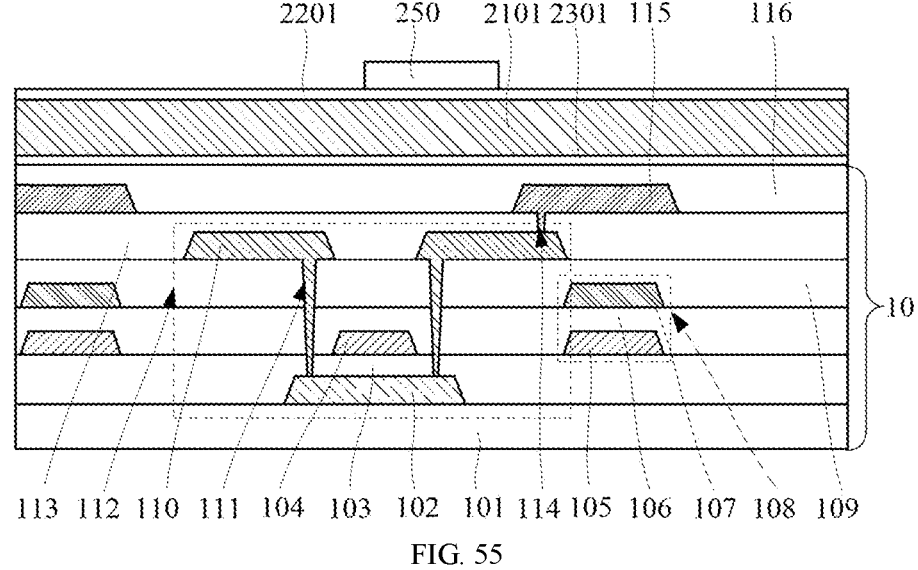
FIG. 55 is a schematic diagram of forming a second etching auxiliary block by patterning a second etching auxiliary layer.
Figure 56:
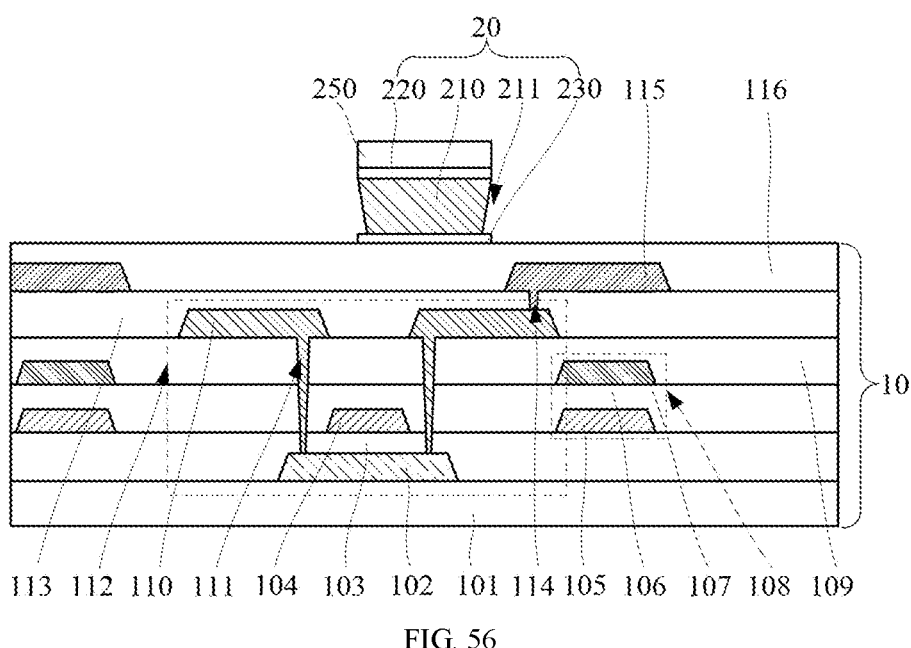
FIG. 56 is a schematic diagram of etching an exposed auxiliary electrode layer.

Exemplarily, when the auxiliary electrode layer is patterned, referring to FIG. 54, a second etching auxiliary layer 2501 may be formed on the auxiliary electrode layer firstly. The second etching auxiliary layer 2501 is formed on the second material film layer 2201. The material of the second etching auxiliary layer 2501 may include at least one of silicon oxide, silicon nitride, silicon oxynitride, and indium tin oxide. Then, referring to FIG. 55, the second etching auxiliary layer 2501 is patterned to form at least one second etching auxiliary block 250, and to expose the auxiliary electrode layer. Referring to FIG. 56, the exposed auxiliary electrode layer is etched to form the auxiliary electrode 20 below the second etching auxiliary block 250, and to increase the angle between the bottom surface of the auxiliary electrode 20 and the side surface of the auxiliary electrode 20.

When the exposed auxiliary electrode layer is etched, the second etching auxiliary block 250 has strong etching resistance, and the second etching auxiliary block 250 will not be etched, so as to reduce the etching amount of a portion of the auxiliary electrode 20 close to the second etching auxiliary block 250, so that the portion of the auxiliary electrode 20 close to the second etching auxiliary block 250 has an etching amount smaller than a portion of the auxiliary electrode 20 away from the second etching auxiliary block 250, thereby increasing the angle between the bottom surface of the auxiliary electrode 20 and the side surface of the auxiliary electrode 20. Therefore, in subsequent processing steps, the angle between the surface, facing away to the second material layer 220, of the first material layer 210 in the auxiliary electrode 20 and the side surface of the first material layer 210 may be greater than or equal to 60° and less than or equal to 160°.

Exemplarily, before the auxiliary electrode 20 is formed on the array substrate 10, the production method in embodiments of this application may further include the following steps.

Figure 57:
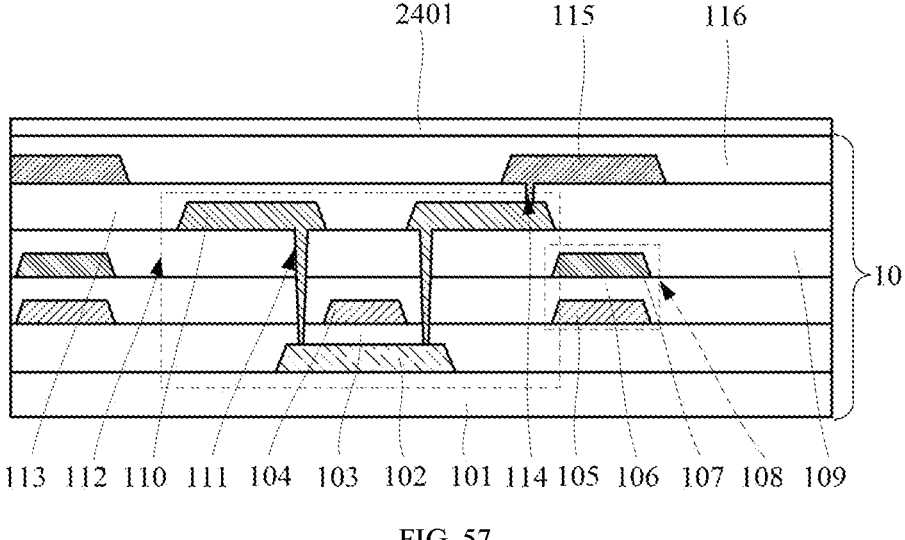
FIG. 57 is a schematic diagram of forming a first etching auxiliary layer on an array substrate.
Figure 58:
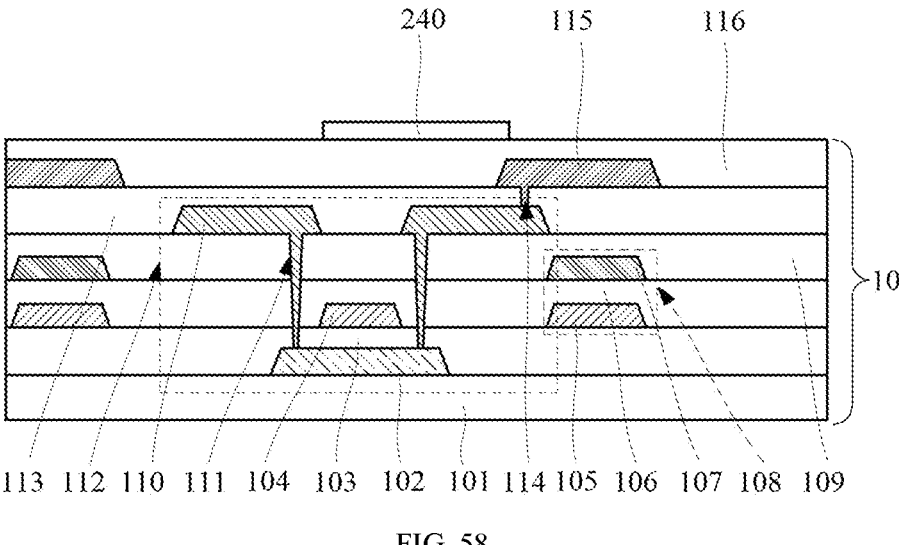
FIG. 58 is a schematic diagram of forming a first etching auxiliary block by patterning a first etching auxiliary layer.

Referring to FIGS. 57 and 58, a first etching auxiliary layer 2401 may be formed on the array substrate 10 firstly, the first etching auxiliary layer 2401 may be patterned to form at least one first etching auxiliary block 240.

Figure 59:
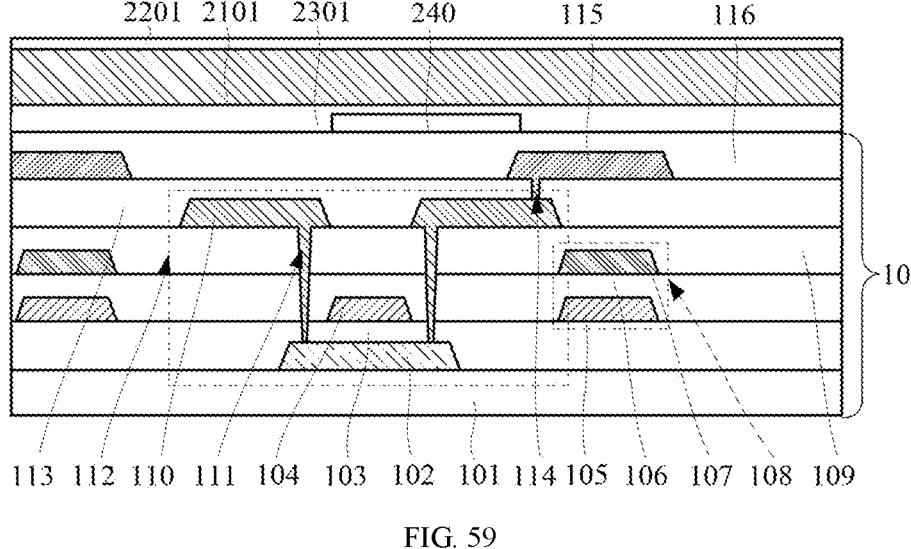
FIG. 59 is a schematic diagram of forming an auxiliary electrode layer.
Figure 60:
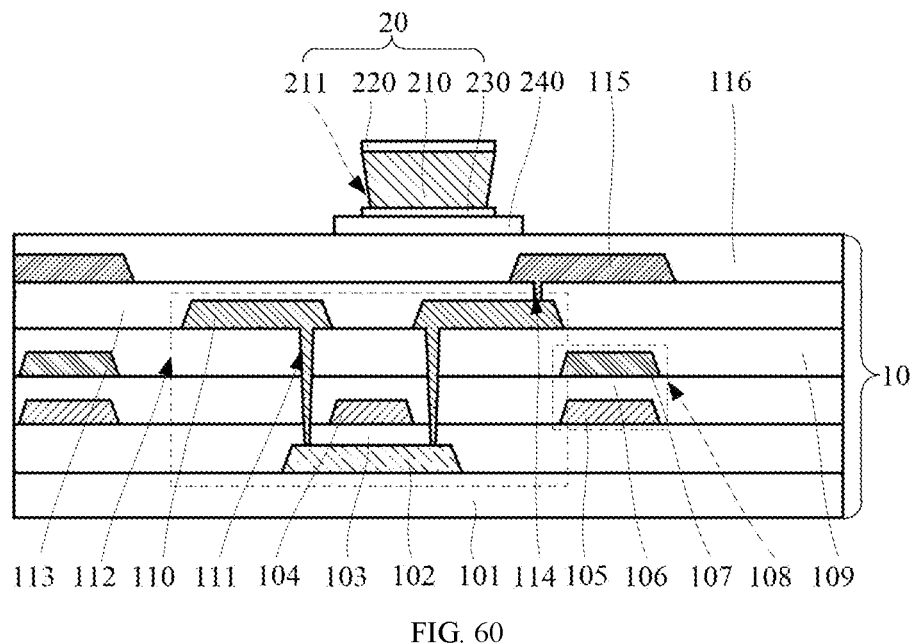
FIG. 60 is a schematic diagram of forming an auxiliary electrode by patterning an auxiliary electrode layer.

Then, an auxiliary electrode layer is formed, the auxiliary electrode layer covers the first etching auxiliary block 240 and the surface of the array substrate 10 which is not covered by the first etching auxiliary block 240. Exemplarily, the auxiliary electrode layer may include the first material film layer 2101 and the second material film layer 2201, which are stacked sequentially. Referring to FIG. 59, the auxiliary electrode layer may further include the third material film layer 2301, the first material film layer 2101, and the second material film layer 2201, which are stacked. Referring to FIG. 60, the auxiliary electrode layer is patterned to form the auxiliary electrode 20 on the first etching auxiliary block 240. The orthographic projection of the auxiliary electrode 20 onto the array substrate 10 is located within the orthographic projection of the first etching auxiliary block 240 onto the array substrate 10 to increase the angle between the bottom surface of the auxiliary electrode 20 and the side surface of the auxiliary electrode 20.

Exemplarily, the auxiliary electrode layer can be patterned by dry etching, that is, the auxiliary electrode layer is etched by plasma. In the process of dry etching the auxiliary electrode layer, since the orthographic projection of the auxiliary electrode 20 onto the array substrate 10 is located within the orthographic projection of the first etching auxiliary block 240 onto the array substrate 10, after the auxiliary electrode layer is etched by the plasma to form the auxiliary electrode 20, the first etching auxiliary block 240 can reflect the plasma, so that the plasma is in contact with a portion of the auxiliary electrode close to the first etching auxiliary block 240, thereby increasing the etching amount of the portion of the auxiliary electrode 20 close to the first etching auxiliary block 240. Therefore, the portion of the auxiliary electrode 20 close to the first etching auxiliary block 240 has an etching amount greater than a portion of the auxiliary electrode 20 away from the first etching auxiliary block 240, and the angle between the bottom surface of the auxiliary electrode 20 and the side surface of the auxiliary electrode 20 is increased, so that the angle β of the auxiliary electrode 20 in subsequent processing steps can be between 60° and 160°.

In other possible implementations in embodiments of this application, the auxiliary electrode 20 may be disposed in the array substrate 10.

Firstly, the array substrate 10 provided with the auxiliary electrode 20 may be provided.

Figure 61:
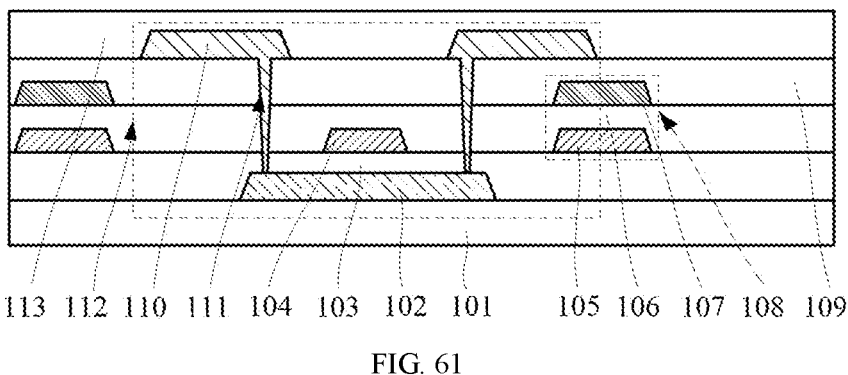
FIG. 61 is a schematic diagram of sequentially forming an active layer, a third insulating layer, a second conductive layer, a fourth insulating layer, a third conductive layer, a fifth insulating layer, a fourth conductive layer and a first insulating layer on a base.

Referring to FIG. 61, the base 101 is provided firstly. Then the active layer 102, the third insulating layer 103, the second conductive layer, the fourth insulating layer 106, the third conductive layer, the fifth insulating layer 109, and the fourth conductive layer are formed sequentially on the base 101, where all of the active layer 102, the second conductive layer, the third conductive layer, and the fourth conductive layer are provided in a patterning manner. The first insulating layer 113 is formed, and the first insulating layer 113 covers the fourth conductive layer and the surface of the fifth insulating layer 109 which is not covered by the fourth conductive layer.

Figure 62:
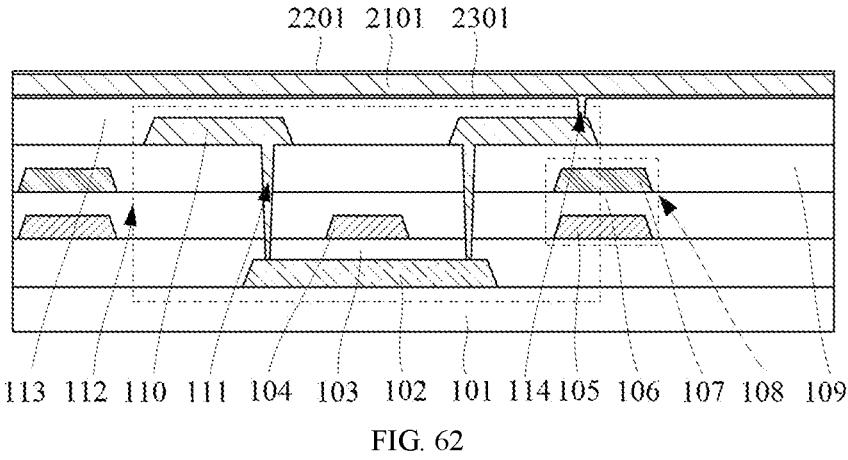
FIG. 62 is a schematic diagram of forming a first conductive layer on a first insulating layer.

Then, the first conductive layer is formed on the first insulating layer 113. Exemplarily, the first conductive layer may include at least the first material film layer 2101 and the second material film layer 2201, which are stacked, and the first material film layer 2101 and the second material film layer 2201 are formed sequentially on the first insulating layer 113. Exemplarily, referring to FIG. 62, the first conductive layer may also include the third material film layer 2301, the first material film layer 2101, and the second material film layer 2201, which are stacked, and the third material film layer 2301, the first material film layer 2101, and the second material film layer 2201 may be formed sequentially on the first insulating layer 113.

Figure 63:
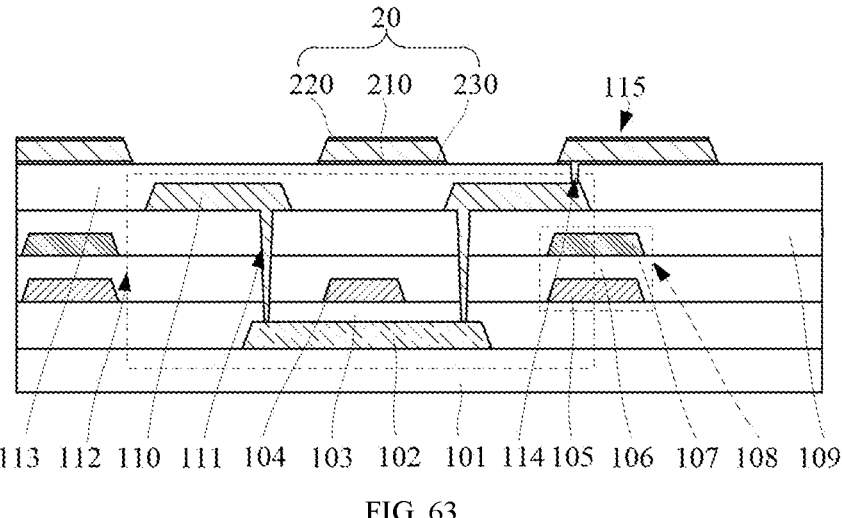
FIG. 63 is a schematic diagram of forming an auxiliary electrode and a connecting wire by patterning a first conductive layer.

Referring to FIG. 63, the first conductive layer is patterned to form the auxiliary electrode 20. Exemplarily, the first conductive layer may be patterned by dry etching to form structures such as the connecting wire 115, and meanwhile the auxiliary electrode 20 may also be formed. Exemplarily, the third material film layer 2301, the first material film layer 2101, and the second material film layer 2201 are patterned to form the third material layer 230, the first material layer 210, and the second material layer 220, respectively. The auxiliary electrode 20 includes the third material layer 230, the first material layer 210, and the second material layer 220. The auxiliary electrode 20 and the connecting wire 115 are formed by the same patterning processing step, reducing the number of processing steps and improving the production efficiency of the display panel.

Referring to FIG. 64, then, the second insulating layer 116 is formed, and the second insulating layer 116 covers the auxiliary electrode 20 and the surface of the first insulating layer 113 which is not covered by the auxiliary electrode 20. The second lap-jointing opening 118 may be formed on the second insulating layer 116, and the auxiliary electrode 20 and the first insulating layer 113 are exposed from the second lap-jointing opening 118, which is easy for the cathode layer 60 in subsequent processing steps to enter the second lap-jointing opening 118 to connect with the auxiliary electrode 20. Exemplarily, the second insulating layer 116 is further provided with the second via hole 114, the second via hole 114 runs through the second insulating layer 116, and is connected to the source drain 110.

Exemplarily, the first insulating layer 113 may be an inorganic insulating layer. The first conductive layer is patterned generally using dry etching, that is, using plasma to etch the first conductive layer. In the process of dry etching the first conductive layer, after the first conductive layer is etched using plasma to form the auxiliary electrode 20, the inorganic insulating layer can reflect the plasma so that the plasma is in contact with the portion of the auxiliary electrode 20 close to the inorganic insulating layer. Therefore, the etching amount of the portion of the auxiliary electrode 20 close to the inorganic insulating layer is increased, so that the portion of the auxiliary electrode 20 close to the inorganic insulating layer has an etching amount greater than the portion of the auxiliary electrode 20 away from the inorganic insulating layer. Therefore, the angle between the bottom surface of the auxiliary electrode 20 and the side surface of the auxiliary electrode 20 is increased, so that the angle β of the auxiliary electrode 20 in subsequent processing steps can be between 60° and 160°.

Exemplarily, when the auxiliary electrode layer is patterned, referring to FIG. 65, the second etching auxiliary layer 2501 may be formed on the first conductive layer firstly. The second etching auxiliary layer 2501 is formed on the second material film layer 2201. The material of the second etching auxiliary layer 2501 may include at least one of silicon oxide, silicon nitride, silicon oxynitride, and indium tin oxide. Then, referring to FIG. 66, the second etching auxiliary layer 2501 is patterned to form at least one second etching auxiliary block 250, and to expose the first conductive layer. Referring to FIG. 67, the exposed first conductive layer is etched to form the auxiliary electrode 20 below the second etching auxiliary block 250, thereby increasing the angle between the bottom surface of the auxiliary electrode 20 and the side surface of the auxiliary electrode 20.

When the exposed auxiliary electrode layer is etched, the second etching auxiliary block 250 has strong etching resistance, and the second etching auxiliary block 250 will not be etched, so as to reduce the etching amount of the portion of the auxiliary electrode 20 close to the second etching auxiliary block 250, so that the portion of the auxiliary electrode 20 close to the second etching auxiliary block 250 has an etching amount smaller than the portion of the auxiliary electrode 20 away from the second etching auxiliary block 250. Therefore, the angle between the bottom surface of the auxiliary electrode 20 and the side surface of the auxiliary electrode 20 is increased, such that in subsequent processing steps, the angle β between the surface, facing away to the second material layer 220, of the first material layer 210 in the auxiliary electrode 20 and the side surface of the first material layer 210 may be greater than or equal to 60° and less than or equal to 160°.

Exemplarily, after the formation of the first insulating layer 113, and before the formation of the first conductive layer on the first insulating layer 113, the production method in an embodiment of this application may further include that:

referring to FIGS. 68 and 69, firstly the first etching auxiliary layer 2401 is formed on the first insulating layer 113, and the first etching auxiliary layer 2401 is patterned to form at least one first etching auxiliary block 240.

Figure 70:
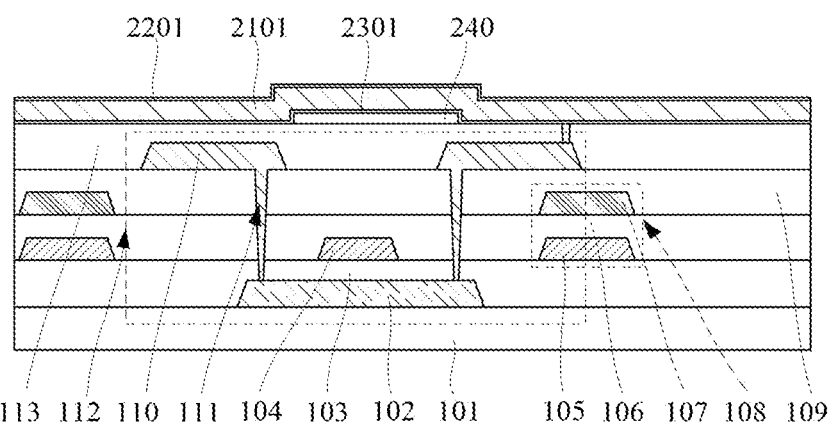
FIG. 70 is a schematic diagram of forming a first conductive layer on a first etching auxiliary block.
Figure 71:
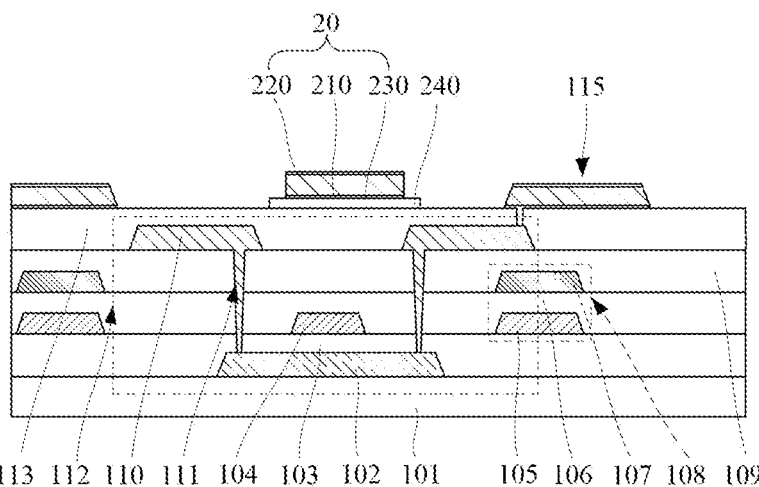
FIG. 71 is a schematic diagram of forming an auxiliary electrode and a connecting wire by patterning a first conductive layer.

Then, referring to FIG. 70, the first conductive layer is formed on the first insulating layer 113, where the first conductive layer covers the first etching auxiliary block 240 and the surface of the first insulating layer 113 which is not covered by the first etching auxiliary block 240. Exemplarily, the first conductive layer may include the third material film layer 2301, the first material film layer 2101, and the second material film layer 2201, which are stacked sequentially, and the third material film layer 2301, the first material film layer 2101, and the second material film layer 2201 may be formed sequentially on the first insulating layer 113. Referring to FIG. 71, the first conductive layer is patterned to form the auxiliary electrode 20. The auxiliary electrode 20 is located on the first etching auxiliary block 240, and the orthographic projection of the auxiliary electrode 20 onto the array substrate 10 is located within the orthographic projection of the first etching auxiliary block 240 onto the array substrate 10 to increase the angle between the bottom surface of the auxiliary electrode 20 and the side surface of the auxiliary electrode 20.

Exemplarily, the first conductive layer can be patterned by dry etching, that is, the first conductive layer is etched using plasma. In the process of dry etching the first conductive layer, since the orthographic projection of the auxiliary electrode 20 onto the array substrate is located within the orthographic projection of the first etching auxiliary block 240 onto the array substrate 10, after the first conductive layer is etched by the plasma to form the auxiliary electrode 20, the first etching auxiliary block 240 can reflect the plasma, so that the plasma is in contact with the portion of the auxiliary electrode 20 close to the first etching auxiliary block 240, thereby increasing the etching amount of the portion of the auxiliary electrode 20 close to the first etching auxiliary block 240. Therefore, the portion of the auxiliary electrode 20 close to the first etching auxiliary block 240 has an etching amount greater than the portion of the auxiliary electrode 20 away from the first etching auxiliary block 240, and the angle between the bottom surface of the auxiliary electrode 20 and the side surface of the auxiliary electrode 20 is increased, so that the angle β of the auxiliary electrode 20 in subsequent processing steps can be between 60° and 160°.

Then, at least one electrode block 31 is formed on the array substrate 10, and a recessed part is formed at the side surface of the auxiliary electrode 20.

After providing the array substrate 10 provided with the auxiliary electrode 20, the first electrode layer 3 is formed on the second insulating layer 116, where the first electrode layer 3 covers the second insulating layer 116, and covers the auxiliary electrode 20 located in the second lap jointing opening 118. The first electrode layer 3 is patterned to form at least one electrode block 31 and to form the recessed part at the side surface of the auxiliary electrode 20. An example in which the first electrode layer 3 is an anode layer 30 is taken to illustrate as follows.

Figure 72:
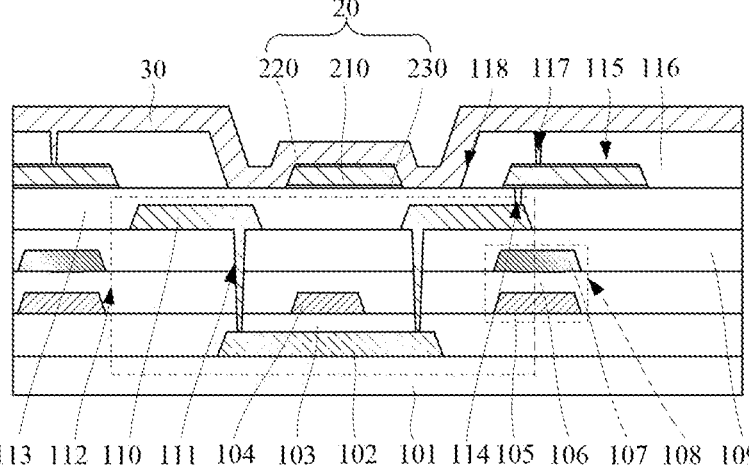
FIG. 72 is a schematic diagram of forming an anode layer on a second insulating layer.
Figure 73:
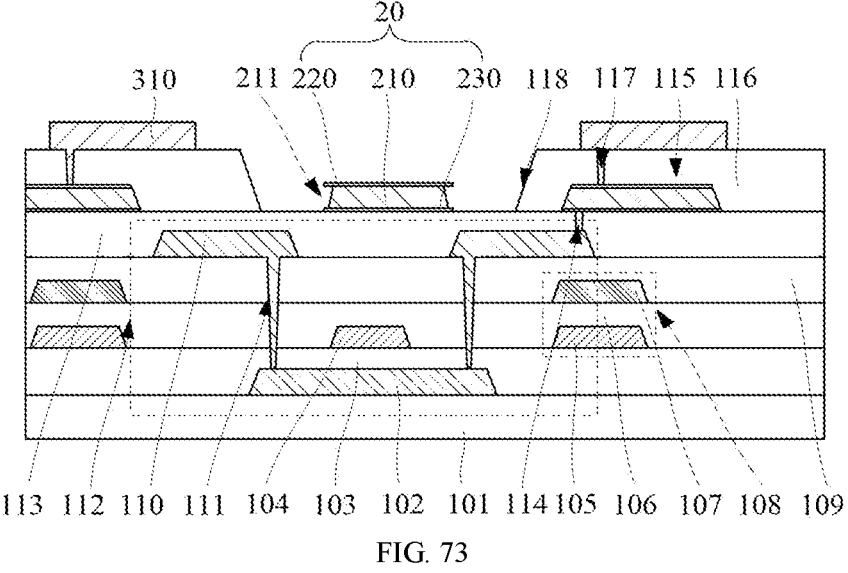
FIG. 73 is a schematic diagram of forming an anode by patterning an anode layer.

Exemplarily, referring to FIG. 72, the anode layer 30 is formed, where the anode layer 30 covers the second insulating layer 116, and covers the auxiliary electrode 20 located within the second lap-jointing opening 118. Then, referring to FIG. 73, the anode layer 30 is patterned to form at least one anode 310, and to form the recessed part 211 at the side surface of the auxiliary electrode 20. Exemplarily, the anode layer 30 may be etched by wet etching. In the etching process, when the anode layer 30 covering the auxiliary electrode 20 is etched, the side surface of the auxiliary electrode 20 can be etched due to the isotropy of wet etching. In addition, because the material of the first material layer 210 has an etching rate greater than the material of the second material layer 220 in the auxiliary electrode layer, the side surface of the first material layer 210 has an etching amount greater than the side surface of the second material layer 220, so that the bottom surface of the first material layer is surrounded with the side surface of the first material layer 210 to form the recessed part.

S200: forming an organic functional layer and a second electrode layer on the array substrate, where the second electrode layer is connected to the auxiliary electrode.

Figure 74:
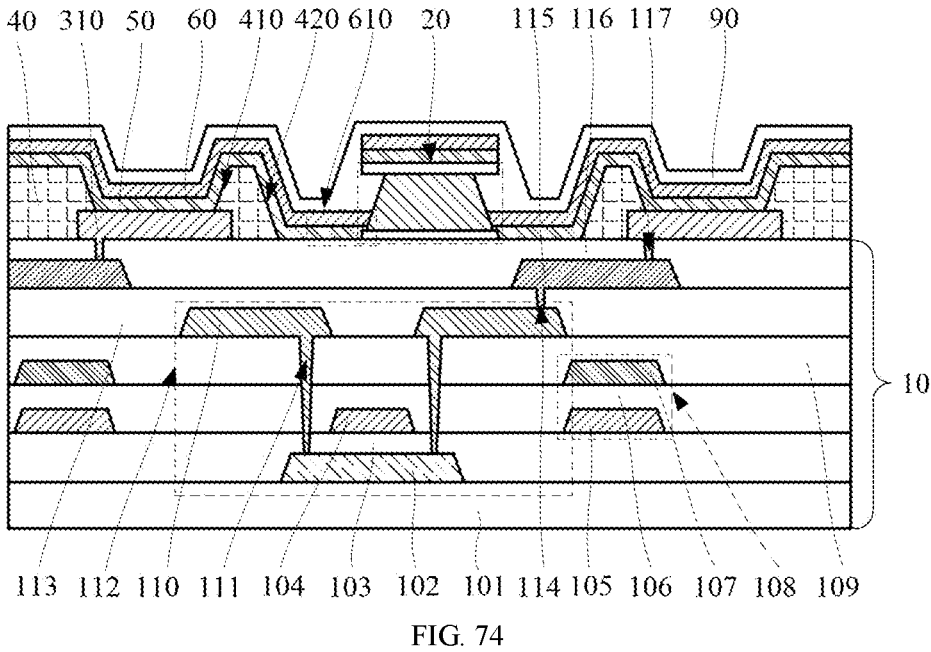
FIG. 74 is a schematic diagram of forming a pixel definition layer, an organic functional layer, a cathode layer, and a packing layer on an anode according to some embodiments of this application.

Exemplarily, referring to FIG. 74, before forming the organic functional layer 50, the pixel definition layer 40 may be formed on the array substrate 10 for separating pixel units. The pixel definition layer 40 is formed on the array substrate 10, and covers the anode 310 and the auxiliary electrode 20. The pixel definition layer 40 may be provided with a plurality of pixel openings 410 in a patterning manner, each pixel opening 410 corresponds to one anode 310, and the top surface of the anode 310 is exposed from the pixel opening 410.

When the auxiliary electrode 20 is disposed on the array substrate 10, the pixel definition layer 40 covers the anode 310, the auxiliary electrode 20, and the surface of the array substrate 10 which is not covered by the anode 310 and the auxiliary electrode 20 surface. Referring to FIG. 74, the first lap jointing opening 420 may be formed in the pixel definition layer 40, and the top surfaces of the auxiliary electrode 20 and the array substrate are exposed from the first lap-jointing opening 420.

After forming the pixel definition layer 40, the organic functional layer 50 may be formed on the array substrate 10. Exemplarily, referring to FIG. 12, the organic functional layer 50 is located above the pixel definition layer 40, and covers the pixel definition layer 40 and the top surface of the anode 310 exposed from the pixel opening 410, so as to connect with the anode 310, so that the anode 310 can provide holes for the organic functional layer 50.

Since the recessed part 211 is provided at the side surface of the auxiliary electrode 20, when forming the organic functional layer 50, the organic functional layer 50 is broken at the edge of the top surface of the auxiliary electrode 20, so that the organic functional layer 50 enters the first lap-jointing opening 420, and covers the top surface of the array substrate 10 and the top surface of the auxiliary electrode within the first lap-jointing opening 420. The organic functional layer 50 may be lap jointed with the side surface of the auxiliary electrode 20 within the recessed part 211.

Then, the second electrode layer 6 is formed on the array substrate 10, the second electrode layer 6 covers the organic functional layer, and the second electrode layer 6 is connected with the auxiliary electrode 20. The following takes the second electrode layer 6 as the cathode layer 60 for example. Referring to FIG. 74, the cathode layer 60 may be a whole layer structure. The cathode layer 60 covers the organic functional layer 50. Since the recessed part 211 is provided at the side surface of the auxiliary electrode 20, in the process of forming the cathode layer 60, the cathode layer 60 is broken at the edge of the top surface of the auxiliary electrode 20, and is deposited in the first lap-jointing opening 420. The cathode layer 60 and the organic functional layer 50 form the lap jointing part 610 with the auxiliary electrode 20 in the recessed part 211 of the auxiliary electrode 20 by lap-jointing with the auxiliary electrode 20, thereby achieving a connection with the auxiliary electrode 20.

Figure 75:
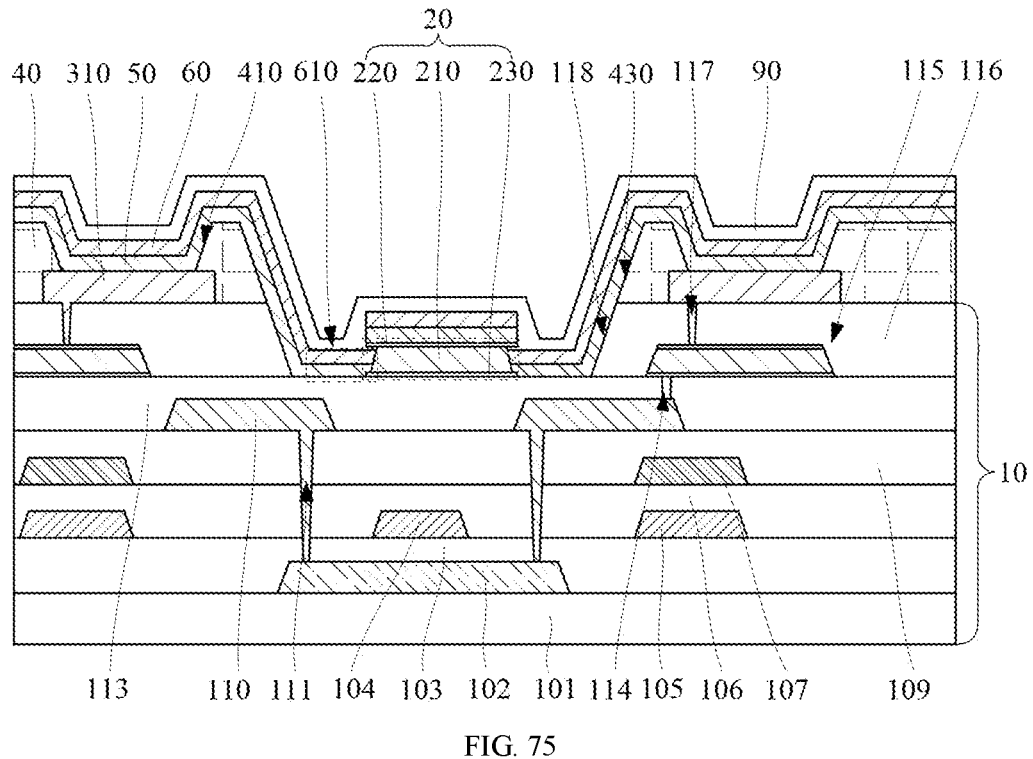
FIG. 75 is a schematic diagram of forming a pixel definition layer, an organic functional layer, a cathode layer, and a packing layer on an anode according to some other embodiments of this application.

When the auxiliary electrode 20 is disposed in the array substrate 10, referring to FIG. 75, the pixel definition layer 40 covers the anode 310 and the surface of the second insulating layer 116 which is not covered by the anode 310, covers the side wall of the second lap-jointing opening 118 and the bottom surface of the second lap-jointing opening 118, and covers the auxiliary electrode 20. The pixel definition layer 40 is provided with a third lap-jointing opening 430, and the third lap jointing opening 430 is interconnected to the second lap-jointing opening 118 to expose the auxiliary electrode 20, and the first insulating layer 113 within the second lap-jointing opening 118.

When forming the organic functional layer 50, the organic functional layer 50 covers the pixel definition layer 40, covers the top surface of the anode 310 in the pixel opening 410, and also covers the top surface of the first insulating layer 113 and the top surface of the auxiliary electrode 20 in the second lap-jointing opening 118. The organic functional layer 50 may be lap-jointed with the side surface of the auxiliary electrode 20 in the recessed part 211.

Then, the cathode layer 60 is formed on the array substrate 10, the cathode layer covers the organic functional layer, and is connected with the auxiliary electrode. Referring to FIG. 75, the cathode layer 60 may be formed on the array substrate 10. The cathode layer may be a whole layer structure. The cathode layer 60 covers the organic functional layer Since the recessed part 211 is provided at the side surface of the auxiliary electrode 20, in the process of forming the cathode layer 60, the cathode layer 60 is broken at the edge of the top surface of the auxiliary electrode 20, and is deposited in the third lap-jointing opening 430 and the second lap-jointing opening 118. The cathode layer 60 and the organic functional layer 50 form the lap-jointing part 610 with the auxiliary electrode 20 in the recessed part 211 of the auxiliary electrode 20 by lap-jointing with the auxiliary electrode 20, thereby achieving a connection with the auxiliary electrode 20.

Then, a packing layer 90 is formed on the cathode layer 60 to seal the display panel.

The above description is only specific embodiments of this application, but the protection scope of this application is not limited thereto. Any change or replacement that can be easily thought of within the technology scope disclosed in this application by those skilled in the art shall be covered within the protection scope of this application. Therefore, the protection scope of this application shall be subject to the protection scope of the appended claims.

What is claimed is:

1. A display panel, comprising:
an array substrate, a first electrode layer, an organic functional layer, and a second electrode layer, which are stacked, the organic functional layer is located between the first electrode layer and the second electrode layer; the first electrode layer comprises at least one electrode block;
wherein the second electrode layer is connected with at least one auxiliary electrode disposed on the array substrate or disposed in the array substrate;
wherein the at least one auxiliary electrode comprises a first material layer, and the first material layer comprises a bottom surface facing the array substrate, and a side surface intersecting with the bottom surface of the first material layer;
wherein an angle between the bottom surface of the first material layer and the side surface of the first material layer is greater than or equal to 60° and less than or equal to 160°;
wherein the display panel further comprises a pixel definition layer;
wherein the pixel definition layer has a plurality of pixel openings, and a top surface of one electrode block is correspondingly exposed from a pixel opening;
wherein the pixel definition layer further comprises a first lap-jointing opening, and the auxiliary electrode and the array substrate are exposed from the first lap-jointing opening;
wherein the first lap-jointing opening comprises a side surface facing the auxiliary electrode, and a bottom surface intersecting the side surface of the first lap-jointing opening;
wherein an angle between the side surface of the first lap-jointing opening and the bottom surface of the first lap-jointing opening is an obtuse angle greater than 140°; and
wherein a distance between an edge of the bottom surface of the first lap-jointing opening and an edge of a bottom surface of the auxiliary electrode is greater than or equal to 3 μm.

2. The display panel according to claim 1, wherein the auxiliary electrode further comprises a second material layer, and the second material layer covers a top surface of the first material layer.

3. The display panel according to claim 2, wherein the second material layer comprises a bottom surface facing the array substrate, and the bottom surface of the second material layer and the side surface of the first material layer enclose to form a recessed part; and
the second electrode layer is lap-jointed with the auxiliary electrode in the recessed part.

4. The display panel according to claim 3, wherein the organic functional layer covers a top surface of the second material layer, and the organic functional layer is lap-jointed with the auxiliary electrode in the recessed part.

5. The display panel according to claim 3, wherein an etching rate of a material of the first material layer is greater than an etching rate of a material of the second material layer.

6. The display panel according to claim 5, wherein the first material layer is a first metal layer, and the second material layer is a second metal layer; the material of the first metal layer is aluminum, and the material of the second metal layer is titanium or molybdenum.

7. The display panel according to claim 2, wherein along a normal direction of a plane in which the array substrate lies, the second material layer has a thickness less than that of the first material layer.

8. The display panel according to claim 2, wherein a distance between an edge of the top surface of the first material layer and a side surface of the second material layer is less than or equal to 2 µm.

9. The display panel according to claim 2, wherein each of orthographic projections of the first material layer and the second material layer onto the array substrate is a circle, or a regular polygon having more than four sides; and the orthographic projection of the second material layer onto the first material layer covers the top surface of the first material layer, and the orthographic projection of the second material layer onto the first material layer has an area greater than that of the top surface of the first material layer.

10. The display panel according to claim 2, wherein the angle between the bottom surface of the first material layer and the side surface of the first material layer is equal to 90°; or the angle between the bottom surface of the first material layer and the side surface of the first material layer is greater than 90°; or the angle β between the bottom surface of the first material layer and the side surface of the first material layer satisfies the following relationship:

$$\beta = \pi - \arcsin L_1 / [(L_1 \tan E_0 - L_3)^2 + L_1^2]^{1/2};$$

wherein L1 is a thickness of the first material layer along a normal direction of a plane in which the array substrate lies, L3 is a distance between an edge of the top surface of the first material layer and a side surface of the second material layer, and E0 is an evaporation angle at which the organic functional layer is evaporated.

11. The display panel according to claim 1, wherein the auxiliary electrode has a thickness of 2500 Å to 10000 Å along a normal direction of a plane in which the array substrate lies;

wherein the auxiliary electrode comprises a plurality of auxiliary electrode wires, the at least one electrode block is a plurality of electrode blocks, the plurality of auxiliary electrode wires are located between the plurality of electrode blocks, respectively, and are insulated from the plurality of electrode blocks, and the plurality of auxiliary electrode wires form a cross grid-like structure; and wherein the auxiliary electrode is disposed on the array substrate, and the auxiliary electrode is insulated from the at least one electrode block.

12. The display panel according to claim 11, wherein the auxiliary electrode further comprises a second material layer and a third material layer; the third material layer, the first material layer, and the second material layer are stacked sequentially along a normal direction of a plane in which the array substrate lies, and a bottom surface of the second material layer and the side surface of the first material layer enclose to form a recessed part; a side surface of the third material layer is flush with an edge of the bottom surface of the first material layer, or, the side surface of the third material layer extends beyond the edge of the bottom surface of the first material layer;

wherein the first material layer is a first metal layer, the second material layer is a second metal layer, and the third material layer is a third metal layer or an inorganic layer; and wherein a material of the third metal layer is titanium or molybdenum, a material of the first metal layer is aluminum, and a material of the second metal layer is titanium or molybdenum; a material of the inorganic layer comprises at least one of silicon oxide, silicon nitride, silicon oxynitride, and indium tin oxide.

13. The display panel according to claim 11, further comprising at least one first etching auxiliary block and at least one second etching auxiliary block, or further comprising at least one first etching auxiliary block or at least one second etching auxiliary block;

wherein the first etching auxiliary block is located between the auxiliary electrode and the array substrate, and an orthographic projection of the first etching auxiliary block onto the array substrate covers an orthographic projection of the auxiliary electrode onto the array substrate;

wherein the second etching auxiliary block is located between the auxiliary electrode and the organic functional layer, an orthographic projection of the second etching auxiliary block onto the array substrate covers the orthographic projection of the auxiliary electrode onto the array substrate; and wherein a material of the first etching auxiliary block is an inorganic material; the inorganic material comprises at least one of silicon oxide, silicon nitride, silicon oxynitride, and indium tin oxide; a material of the second etching auxiliary block comprises at least one of silicon oxide, silicon nitride, silicon oxynitride, and indium tin oxide.

14. The display panel according to claim 11, wherein the auxiliary electrode and the electrode block are disposed in a same layer, and the auxiliary electrode further comprises a second material layer and a third material layer, and the third material layer, the first material layer, and the second material layer are stacked sequentially along a normal direction of a plane in which the array substrate lies; and a material of the first material layer comprises at least one of silver, aluminum, and neodymium, a material of the second material layer comprises at least one of indium tin oxide and indium zinc oxide, and a material of the third material layer comprises at least one of silver, aluminum, neodymium, indium tin oxide, and indium zinc oxide.

15. The display panel according to claim 1, wherein the auxiliary electrode is disposed in the array substrate, and the auxiliary electrode is insulated from the electrode block.

16. The display panel according to claim 15, wherein the array substrate comprises a base;

A first insulating layer, a first conductive layer, and a second insulating layer are stacked on the base;

the auxiliary electrode and the first conductive layer are disposed on the first insulating layer; and the second insulating layer comprises a second lap-jointing opening, and the auxiliary electrode and the first insulating layer are exposed from the second lap-jointing opening; the electrode block is located on the second insulating layer;

wherein the display panel further comprises at least one first etching auxiliary block, the first etching auxiliary block is located between the auxiliary electrode and the first insulating layer, and an orthographic projection of the first etching auxiliary block onto the base covers an orthographic projection of the auxiliary electrode onto the base; and/or, the display panel further comprises at least one second etching auxiliary block, the second etching auxiliary block is located between the auxiliary electrode and the organic functional layer, and an orthographic projection of the second etching auxiliary block onto the base covers the orthographic projection of the auxiliary electrode onto the base.

17. The display panel according to claim 16, wherein the pixel definition layer is disposed on the second insulating layer; the pixel definition layer further comprises a third lap-jointing opening, and the third lap-jointing opening is interconnected to the second lap-jointing opening to expose the auxiliary electrode and the first insulating layer.

18. The display panel according to claim 1, wherein the display panel further comprises a first power cord; the first power cord is connected to the auxiliary electrode, and the first power cord is configured to provide a power signal to the auxiliary electrode.

19. The display panel according to claim 1, wherein the display panel further comprises at least one first etching auxiliary block;

wherein the first etching auxiliary block is located between the auxiliary electrode and the array substrate, and an orthographic projection of the first etching auxiliary block onto the array substrate covers an orthographic projection of the auxiliary electrode onto the array substrate.

20. A method for producing a display panel for forming the display panel according to claim 1, comprising:

providing an array substrate having an auxiliary electrode and a first electrode layer, wherein the auxiliary electrode is disposed on the array substrate, or disposed in the array substrate; the auxiliary electrode comprises a first material layer, and the first material layer comprises a bottom surface facing the array substrate, and a side surface intersecting the bottom surface of the first material layer; an angle is formed between the bottom surface of the first material layer and the side surface of the first material layer, and the angle is greater than or equal to 60° and less than or equal to 160°; and the first electrode layer comprises at least one electrode block;

forming a pixel definition layer on the array substrate; and subsequently forming an organic functional layer and a second electrode layer on the array substrate, wherein the second electrode layer is connected with the auxiliary electrode;

wherein the pixel definition layer is formed with a plurality of pixel openings, and a top surface of one electrode block is correspondingly exposed from a pixel opening;

wherein the pixel definition layer is further formed with a first lap-jointing opening, and the auxiliary electrode and the array substrate are exposed from the first lap-jointing opening;

wherein the first lap-jointing opening comprises a side surface facing the auxiliary electrode, and a bottom surface intersecting the side surface of the first lap-jointing opening;

wherein an angle between the side surface of the first lap-jointing opening and the bottom surface of the first lap-jointing opening is an obtuse angle greater than 140°; and wherein a distance between an edge of the bottom surface of the first lap-jointing opening and an edge of a bottom surface of the auxiliary electrode is greater than or equal to 3 μm.

* * * * *